United States Patent
Morishita

(10) Patent No.: US 12,052,922 B2
(45) Date of Patent: Jul. 30, 2024

(54) PIEZOELECTRIC THIN FILM, PIEZOELECTRIC THIN FILM ELEMENT AND PIEZOELECTRIC TRANSDUCER

(71) Applicant: TDK Corporation, Tokyo (JP)

(72) Inventor: Junpei Morishita, Tokyo (JP)

(73) Assignee: TDK Corporation, Tokyo (JP)

( * ) Notice: Subject to any disclaimer, the term of this patent is extended or adjusted under 35 U.S.C. 154(b) by 640 days.

(21) Appl. No.: 17/208,051

(22) Filed: Mar. 22, 2021

(65) Prior Publication Data

US 2021/0305485 A1    Sep. 30, 2021

(30) Foreign Application Priority Data

Mar. 26, 2020   (JP) ................... 2020-056476
Oct. 28, 2020   (JP) ................... 2020-180666

(51) Int. Cl.
*H10N 30/00*   (2023.01)
*H10N 30/076*   (2023.01)
(Continued)

(52) U.S. Cl.
CPC ..... *H10N 30/10516* (2023.02); *H10N 30/076* (2023.02); *H10N 30/8536* (2023.02); *H10N 30/878* (2023.02)

(58) Field of Classification Search
CPC ........... H10N 30/10516; H10N 30/878; H10N 30/8536; H10N 30/076; B04B 35/26
See application file for complete search history.

(56) References Cited

U.S. PATENT DOCUMENTS 10,003,007 B2 *   6/2018   Sakai ............. H10N 30/06
2011/0292133 A1  12/2011   Sasaki et al.
(Continued)

FOREIGN PATENT DOCUMENTS

JP   2010-053422 A   3/2010
JP   2011-181776 A   9/2011
(Continued)

OTHER PUBLICATIONS

Ujimoto, K. et al., "Direct piezoelectric properties of (100) and (111) BiFeO₃ epitaxial thin films," Applied Physics Letters 100, Mar. 6, 2012, p. 102901-1 through p. 102901-3.
(Continued)

*Primary Examiner* — J. San Martin
(74) *Attorney, Agent, or Firm* — Faegre Drinker Biddle & Reath LLP

(57) ABSTRACT

Provided is a piezoelectric thin film containing a tetragonal crystal 1 of a perovskite type oxide and a tetragonal crystal 2 of the oxide. A (001) plane of the tetragonal crystal 1 and a (001) plane of the tetragonal crystal 2 are oriented in a normal direction of a surface of the piezoelectric thin film. An interval of the (001) plane of the crystal 1 is c1. An interval of a (100) plane of the crystal 1 is a1. An interval of the (001) plane of the crystal 2 is c2. An interval of a (100) plane of the crystal 2 is a2. c2/a2 is more than c1/a1. A peak intensity of diffracted X-rays of the (001) plane of the crystal 1 is $I_1$. A peak intensity of diffracted X-rays of the (001) plane of the crystal 2 is $I_2$. $I_2/(I_1+I_2)$ is from 0.50 to 0.90.

15 Claims, 6 Drawing Sheets

(51) Int. Cl.
  *H10N 30/853* (2023.01)
  *H10N 30/87* (2023.01)

(56) References Cited

U.S. PATENT DOCUMENTS

| 2014/0206245 | A1 | 7/2014 | Sato |
| 2015/0141834 | A1 | 5/2015 | Minemoto et al. |
| 2020/0227621 | A1 | 7/2020 | Morishita |
| 2022/0059753 | A1* | 2/2022 | Sato .................... C04B 35/475 |

FOREIGN PATENT DOCUMENTS

| JP | 2011-249588 A | 12/2011 |
| JP | 2013-168530 A | 8/2013 |
| JP | 2020-113649 A | 7/2020 |
| WO | WO-2013/175740 A1 | 11/2013 |

OTHER PUBLICATIONS

K. Yazawa et al., "Composition dependence of crystal structure and electrical properties for epitaxial films of $Bi(Zn_{1/2}Ti_{1/2})O_3$-$BiFeO_3$ solid solution system," Journal of the Ceramic Society of Japan, 2010, vol. 118, No. 8, p. 659-p. 663.

* cited by examiner

PIEZOELECTRIC THIN FILM, PIEZOELECTRIC THIN FILM ELEMENT AND PIEZOELECTRIC TRANSDUCER

TECHNICAL FIELD

The present invention (first invention and second invention) relates to a piezoelectric thin film, a piezoelectric thin film element, and a piezoelectric transducer.

BACKGROUND

A piezoelectric substance is processed into various piezoelectric elements in correspondence with various objects. For example, a piezoelectric actuator converts a voltage into a force by an inverse piezoelectric effect that deforms a piezoelectric substance by applying a voltage to the piezoelectric substance. In addition, a piezoelectric sensor converts a force into a voltage by a piezoelectric effect that deforms the piezoelectric substance by applying a pressure to the piezoelectric substance. The piezoelectric elements are mounted on various electronic devices.

In recent market, since a reduction in size and an improvement of performance of electronic devices are required, piezoelectric elements (piezoelectric thin film elements) using a piezoelectric thin film are being actively studied. However, the thinner the piezoelectric substance is, the less the piezoelectric effect and the inverse piezoelectric effect are likely to be obtained, and thus development of a piezoelectric substance having excellent piezoelectric properties in a thin film state is expected.

In the related art, as the piezoelectric substance, lead zirconate titanate (so-called PZT) that is a perovskite type ferroelectric substance has been widely used. However, since PZT contains lead (Pb) that is harmful to the human body or an environment, development of a lead-free piezoelectric substance has been expected as a substitute for the PZT. For example, as an example of the lead-free piezoelectric substance, $BiFeO_3$ is described in a following Non Patent Literature 1.

Among lead-free piezoelectric substances, $BiFeO_3$ has relatively excellent piezoelectric properties, and is particularly expected to be applied to the piezoelectric thin film elements.

NON PATENT LITERATURE 1

K. Ujimoto et al, Direct piezoelectric properties of (100) and (111) $BiFeO_3$ epitaxial thin films, APPLIED PHYSICS LETTERS. 100, (2012)

SUMMARY $(-e_{31,f})^2/\varepsilon_0\varepsilon_r$ is a piezoelectric performance index indicating piezoelectric properties of the piezoelectric thin film. $-e_{31,f}$ is one kind of a piezoelectric constant, and a unit of $-e_{31,f}$ is $C/m^2$. $\varepsilon_0$ is a permittivity of vacuum, and a unit of $\varepsilon_0$ is F/m. $\varepsilon_r$ is a relative permittivity of the piezoelectric thin film, and there is no unit of $\varepsilon_r$. A unit of $(-e_{31,f})^2/\varepsilon_0\varepsilon_r$ is Pa. A piezoelectric thin film having a large piezoelectric performance index is suitable for piezoelectric thin film elements such as a piezoelectric transducer (sensor).

<<First Invention>>

An object of an aspect of the first invention is to provide a piezoelectric thin film having a large piezoelectric performance index, and a piezoelectric thin film element and a piezoelectric transducer including the piezoelectric thin film.

According to an aspect of the first invention, there is provided a piezoelectric thin film containing an oxide having a perovskite structure. The piezoelectric thin film according to the aspect of the first invention contains a tetragonal crystal 1 of the oxide and a tetragonal crystal 2 of the oxide. A (001) plane of the tetragonal crystal 1 is oriented in a normal direction of a surface of the piezoelectric thin film. A (001) plane of the tetragonal crystal 2 is oriented in the normal direction of the surface of the piezoelectric thin film. An interval of the (001) plane of the tetragonal crystal 1 is c1, an interval of a (100) plane of the tetragonal crystal 1 is a1, an interval of the (001) plane of the tetragonal crystal 2 is c2, and an interval of a (100) plane of the tetragonal crystal 2 is a2, and c2/a2 is more than c1/a1. A peak intensity of diffracted X-rays of the (001) plane of the tetragonal crystal 1 is $I_1$, a peak intensity of diffracted X-rays of the (001) plane of the tetragonal crystal 2 is $I_2$, and $I_2/(I_1+I_2)$ is from 0.50 to 0.90.

c2−c1 may be more than 0.100 Å and 0.490 Å or less.

c1/a1 may be from 1.030 to 1.145, and c2/a2 may be from 1.085 to 1.195.

The oxide may be expressed by the following Chemical Formula A1, $E^A$ in the following Chemical Formula A1 may be at least one kind of element selected from the group consisting of Na, K, and Ag, $E^B$ in the following Chemical Formula A1 may be at least one kind of element selected from the group consisting of Mg, Al, Ti, Ni, and Zn, x in the following Chemical Formula A1 may be from 0.30 to 0.80, and α in the following Chemical Formula A1 may be 0.00 or more and less than 1.00.

$$(1-x)Bi_{1-\alpha}E^A_\alpha E^B O_{3-x}BiFeO_3 \tag{A1}$$

The piezoelectric thin film according to the aspect of the first invention may be an epitaxial film.

According to another aspect of the first invention, there is provided a piezoelectric thin film element including the piezoelectric thin film.

The piezoelectric thin film element according to the aspect of the first invention may include a single crystal substrate, and the piezoelectric thin film stacked on the single crystal substrate.

The piezoelectric thin film element according to the aspect of the first invention may include a single crystal substrate, an electrode layer stacked on the single crystal substrate, and the piezoelectric thin film stacked on the electrode layer.

The piezoelectric thin film element according to the aspect of the first invention may include an electrode layer, and the piezoelectric thin film stacked on the electrode layer.

The piezoelectric thin film element according to the aspect of the first invention may further include a first intermediate layer. The first intermediate layer may be disposed between the single crystal substrate and the electrode layer.

The first intermediate layer may contain $ZrO_2$ and $Y_2O_3$.

The piezoelectric thin film element according to the aspect of the first invention may further include a second intermediate layer. The second intermediate layer may be disposed between the electrode layer and the piezoelectric thin film.

The second intermediate layer may contain at least any one between $SrRuO_3$ and $LaNiO_3$.

The electrode layer may contain a platinum crystal, a (002) plane of the platinum crystal may be oriented in a normal direction of a surface of the electrode layer, and a (200) plane of the platinum crystal may be oriented in an in-plane direction of the surface of the electrode layer.

According to still another aspect of the first invention, there is provided a piezoelectric transducer including the piezoelectric thin film element.

According to the aspects of the first invention, there are provided the piezoelectric thin film having a large piezoelectric performance index, and the piezoelectric thin film element and the piezoelectric transducer including the piezoelectric thin film.

<<Second Invention>>

An object of an aspect of the second invention is to provide a piezoelectric thin film having a large piezoelectric performance index, and a piezoelectric thin film element and a piezoelectric transducer including the piezoelectric thin film.

According to an aspect of the second invention, there is provided a piezoelectric thin film containing an oxide having a perovskite structure. The piezoelectric thin film according to the aspect of the second invention contains a tetragonal crystal of the oxide. A (001) plane of the tetragonal crystal is oriented in a normal direction of a surface of the piezoelectric thin film. An interval of the (001) plane of the tetragonal crystal is c, an interval of a (100) plane of the tetragonal crystal is a, and c/a is from 1.050 to 1.250. The oxide contains $Fe^{2+}$.

The oxide may further contain $Bi^{3+}$ and $Fe^{3+}$.

The oxide may be expressed by the following Chemical Formula B1, $E^A$ in the following Chemical Formula B1 may be at least one kind of element selected from the group consisting of Na, K, and Ag, $E^B$ in the following Chemical Formula B1 may be at least one kind of element selected from the group consisting of Mg, Al, Zr, Ti, Ni, and Zn, x in the following Chemical Formula B1 may be from 0.10 to 0.80, y in the following Chemical Formula B1 may be from 0.10 to 0.85, z in the following Chemical Formula B1 may be from 0.05 to 0.80, x+y+z may be 1.00, and α in the following Chemical Formula B1 may be 0.00 or more and less than 1.00.

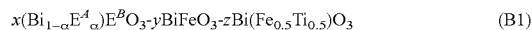

$$x(Bi_{1-\alpha}E^A_\alpha)E^BO_3\text{-}yBiFeO_3\text{-}zBi(Fe_{0.5}Ti_{0.5})O_3 \quad (B1)$$

The thickness of the piezoelectric thin film may be from 500 to 5000 nm.

The piezoelectric thin film may be an epitaxial film.

According to another aspect of the second invention, there is provided a piezoelectric thin film element including the piezoelectric thin film.

The piezoelectric thin film element may include a single crystal substrate, and the piezoelectric thin film stacked on the single crystal substrate.

The piezoelectric thin film element may include a single crystal substrate, an electrode layer stacked on the single crystal substrate, and the piezoelectric thin film stacked on the electrode layer.

The piezoelectric thin film element may include an electrode layer, and the piezoelectric thin film stacked on the electrode layer.

The piezoelectric thin film element may further include a first intermediate layer. The first intermediate layer may be disposed between the single crystal substrate and the electrode layer.

The first intermediate layer may contain $ZrO_2$ and $Y_2O_3$.

The piezoelectric thin film element may further include a second intermediate layer. The second intermediate layer may be disposed between the electrode layer and the piezoelectric thin film.

The second intermediate layer may contain at least any one between $SrRuO_3$ and $LaNiO_3$.

The electrode layer may contain a platinum crystal, a (002) plane of the platinum crystal may be oriented in a normal direction of a surface of the electrode layer, and a (200) plane of the platinum crystal may be oriented in an in-plane direction of the surface of the electrode layer.

According to still another aspect of the second invention, there is provided a piezoelectric transducer including the piezoelectric thin film element.

According to the aspects of the second invention, there are provided the piezoelectric thin film having a large piezoelectric performance index, and the piezoelectric thin film element and the piezoelectric transducer including the piezoelectric thin film.

DETAILED DESCRIPTION

Embodiment of First Invention

Figure 1A:
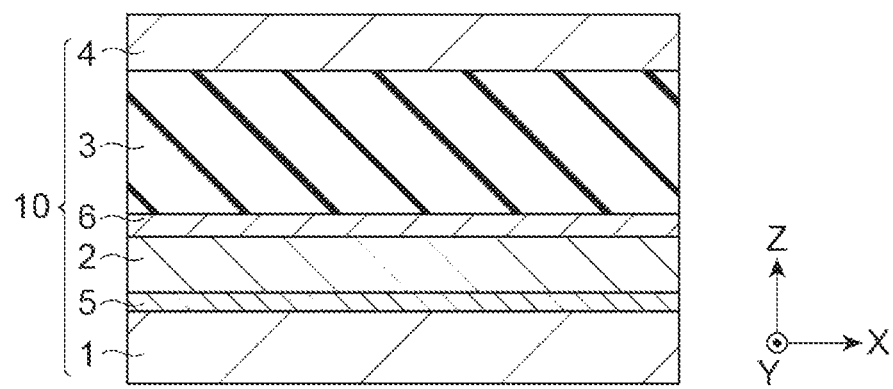
FIG. 1A is a schematic cross-sectional view of a piezoelectric thin film element according to an embodiment of a first invention or a second invention.
Figure 1B:
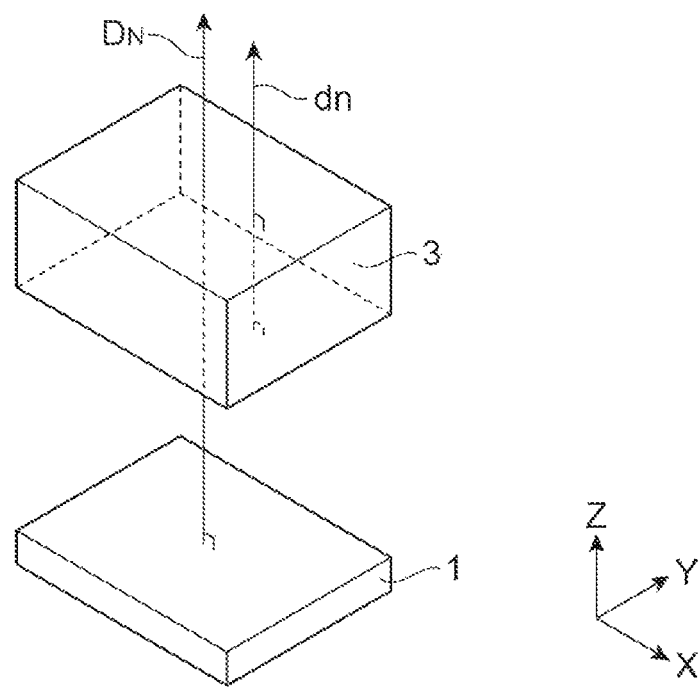
FIG. 1B is a perspective exploded view of the piezoelectric thin film element illustrated in FIG. 1A.
Figure 4:
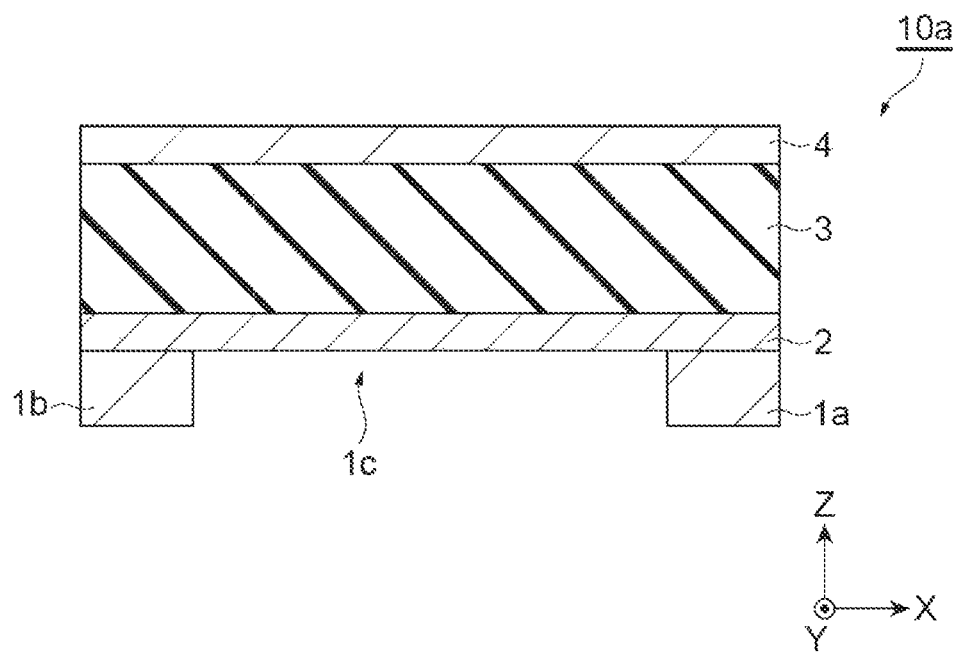
FIG. 4 is a schematic cross-sectional view of a piezoelectric thin film element (ultrasonic transducer) according to another embodiment of the first invention or the second invention.

Hereinafter, details of a preferred embodiment of a first invention will be described with reference to the accompanying drawings. The following "first embodiment" represents the preferred embodiment of the first invention. However, the first invention is not limited to the following first embodiment. In the drawings, the same reference numeral will be given to the same or equivalent element. An X-axis, a Y-axis, and a Z-axis illustrated in FIG. 1A, FIG. 1B, and FIG. 4 are three coordinate axes orthogonal to each other. A direction of each of the three coordinate axes is common to FIG. 1A, FIG. 1B, and FIG. 4.

(Piezoelectric Thin Film and Piezoelectric Thin Film Element)

A piezoelectric thin film element according to the first embodiment includes a piezoelectric thin film. FIG. 1A illustrates a cross-section of a piezoelectric thin film element 10 according to the first embodiment. The cross-section of the piezoelectric thin film element 10 is perpendicular to a surface of a piezoelectric thin film 3. The piezoelectric thin film element 10 includes a single crystal substrate 1, a first electrode layer 2 (lower electrode layer) stacked on the single crystal substrate 1, the piezoelectric thin film 3 stacked on the first electrode layer 2, and a second electrode layer 4 (upper electrode layer) stacked on the piezoelectric thin film 3. The piezoelectric thin film element 10 may further includes a first intermediate layer 5. The first intermediate layer 5 may be disposed between the single crystal substrate 1 and the first electrode layer 2, and the first electrode layer 2 may be directly stacked on a surface of the first intermediate layer 5. The piezoelectric thin film element 10 may include a second intermediate layer 6. The second intermediate layer 6 may be disposed between the first electrode layer 2 and the piezoelectric thin film 3, and the piezoelectric thin film 3 may be directly stacked on a surface of the second intermediate layer 6. The thickness of each of the single crystal substrate 1, the first intermediate layer 5, the first electrode layer 2, the second intermediate layer 6, the piezoelectric thin film 3, and the second electrode layer 4 may be uniform. As illustrated in FIG. 1B, a normal direction dn of a surface of the piezoelectric thin film 3 may be approximately parallel to a normal direction $D_N$ of a surface of the single crystal substrate 1. In FIG. 1B, the first electrode layer, the first intermediate layer, the second intermediate layer, and the second electrode layer are omitted.

A modification example of the piezoelectric thin film element 10 may not be provided with the single crystal substrate 1. For example, the single crystal substrate 1 may be removed after forming the first electrode layer 2 and the piezoelectric thin film 3. A modification example of the piezoelectric thin film element 10 may not be provided with the second electrode layer 4. For example, after a piezoelectric thin film element that does not include a second electrode layer is supplied to a manufacturer of an electronic device as a product, the second electrode layer may be applied to the piezoelectric thin film element in a process of manufacturing the electronic device. In a case where the single crystal substrate 1 functions as an electrode, a modification example of the piezoelectric thin film element 10 may not be provided with the first electrode layer 2. That is, the modification example of the piezoelectric thin film element 10 may be provided with the single crystal substrate 1, and the piezoelectric thin film 3 stacked on the single crystal substrate 1. In a case where the first electrode layer 2 does not exist, the piezoelectric thin film 3 may be directly stacked on the single crystal substrate 1. In a case where the first electrode layer 2 does not exist, the piezoelectric thin film 3 may be stacked on the single crystal substrate 1 through at least one intermediate layer between the first intermediate layer 5 and the second intermediate layer 6.

The piezoelectric thin film 3 contains an oxide having a perovskite structure. That is, at least a part of oxides contained in the piezoelectric thin film 3 is a crystal having the perovskite structure. All oxides contained in the piezoelectric thin film 3 may be crystals having the perovskite structure. In some cases, an oxide having the perovskite structure is noted as "perovskite type oxide". The perovskite type oxide is a main component of the piezoelectric thin film 3. A ratio of the perovskite type oxide to the entirety of the piezoelectric thin film 3 may be from 99 to 100 mol %. The piezoelectric thin film 3 may consist of the perovskite type oxide.

Figure 2:
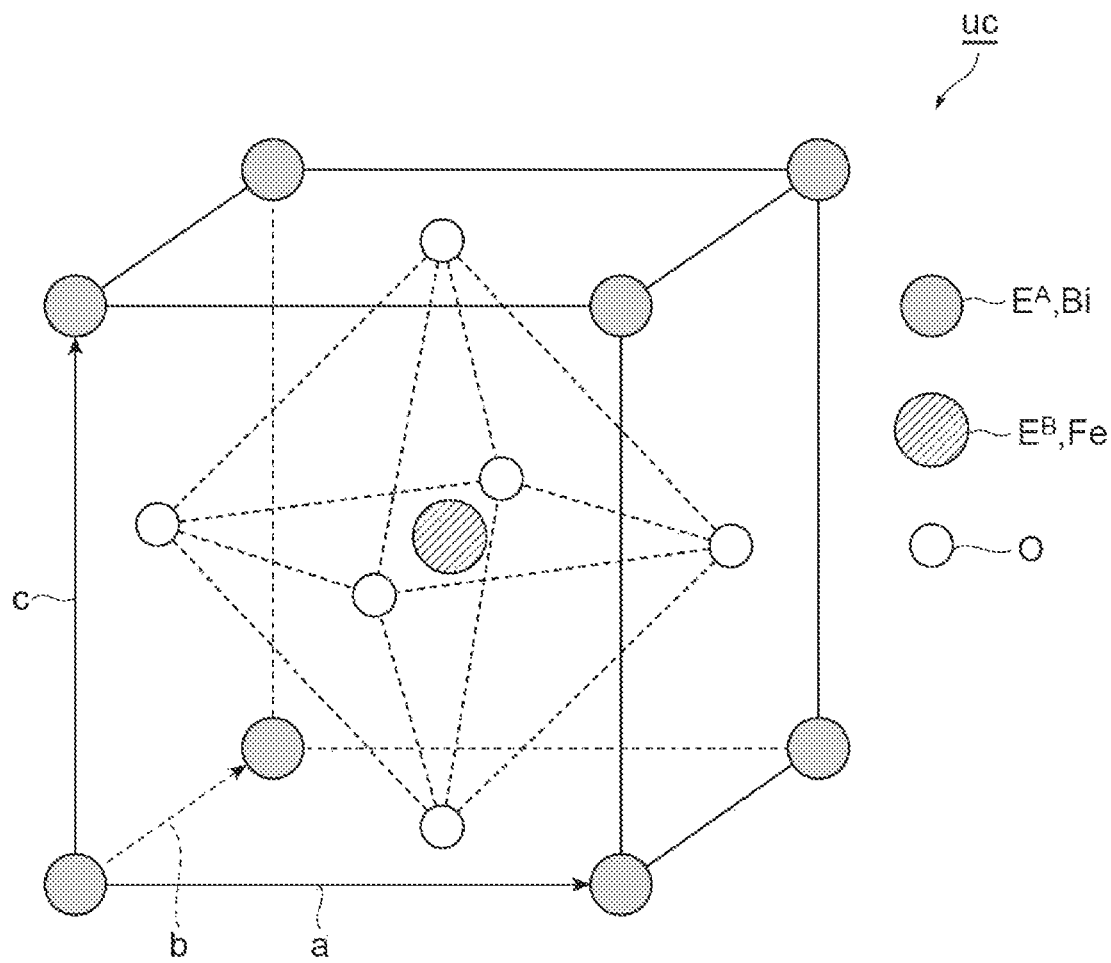
FIG. 2 is a view relating to the first invention, and is a perspective view of a unit cell of a perovskite structure.

FIG. 2 illustrates a unit cell uc of the perovskite type oxide. An element located at an A-site of the unit cell uc may be Bi or $E^A$. An element located at a B-site of the unit cell uc may be Fe or $E^B$. Specific examples of each of the element $E^A$ and the element $E^B$ will be described later. Each of a, b, and c in FIG. 2 represents a fundamental vector of the perovskite structure. a, b, and c are perpendicular to each other. An orientation of the vector a is [100]. An orientation of the vector b is [010]. An orientation of the vector c is [001]. A length a of the vector a is an interval of a (100) plane of the perovskite type oxide. In other words, the length a of the vector a is a lattice constant of the perovskite type oxide in the [100] direction. A length b of the vector b is an interval of a (010) plane of the perovskite type oxide. In other words, the length b of the vector b is a lattice constant of the perovskite type oxide in the [010] direction. A length c of the vector c is an interval of a (001) plane of the perovskite type oxide. In other words, the length c of the vector c is a lattice constant of the perovskite type oxide in the [001] direction.

Figure 3:
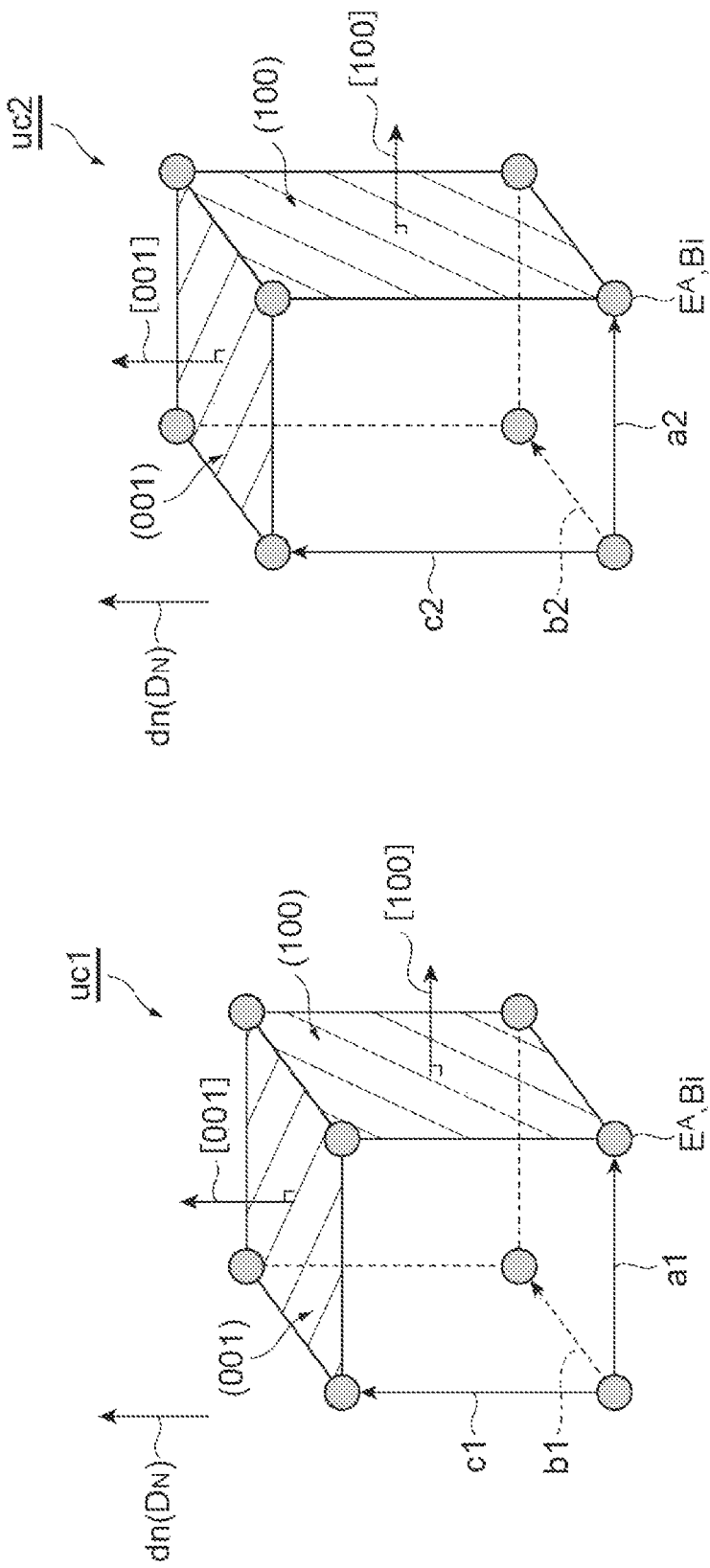
FIG. 3 is a view relating to the first invention, and is a schematic perspective view of a unit cell of each of a tetragonal crystal 1 and a tetragonal crystal 2.

The piezoelectric thin film 3 contains a tetragonal crystal 1 of the perovskite type oxide and a tetragonal crystal 2 of the perovskite type oxide. FIG. 3 illustrates a unit cell uc1 of the tetragonal crystal 1 and a unit cell uc2 of the tetragonal crystal 2. For convenience of illustration, $E^B$ and oxygen (O) in the unit cell uc1 and the unit cell uc2 are omitted, but each of the unit cell uc1 and the unit cell uc2 has the same perovskite structure as in the unit cell uc in FIG. 2.

Each of a1, b1, and c1 in FIG. 3 is a fundamental vector of the tetragonal crystal 1. The vector a1 in FIG. 3 corresponds to the vector a in FIG. 2. The vector b1 in FIG. 3 corresponds to the vector b in FIG. 2. The vector c1 in FIG. 3 corresponds to the vector c in FIG. 2. a1, b1, and c1 are perpendicular to each other. An orientation of the vector a1 is [100]. An orientation of the vector b1 is [010]. An orientation of the vector c1 is [001]. A length a1 of the vector a1 is an interval of a (100) plane of the tetragonal crystal 1. In other words, the length a1 of the vector a1 is a lattice constant of the tetragonal crystal 1 in the [100] direction. A length b1 of the vector b1 is an interval of a (010) plane of the tetragonal crystal 1. In other words, the length b1 of the vector b1 is a lattice constant of the tetragonal crystal 1 in the [010] direction. A length c1 of the vector c1 is an interval of a (001) plane of the tetragonal crystal 1. In other words, the length c1 of the vector c1 is a lattice constant of the tetragonal crystal 1 in the [001] direction. a1 equals to b1. c1 is more than a1.

Each of a2, b2, and c2 in FIG. 3 is a fundamental vector of the tetragonal crystal 2. The vector a2 in FIG. 3 corresponds to the vector a in FIG. 2. The vector b2 in FIG. 3 corresponds to the vector b in FIG. 2. The vector c2 in FIG. 3 corresponds to the vector c in FIG. 2. a2, b2, and c2 are perpendicular to each other. An orientation of the vector a2 is [100]. An orientation of the vector b2 is [010]. An orientation of the vector c2 is [001]. A length a2 of the vector a2 is an interval of a (100) plane of the tetragonal crystal 2. In other words, the length a2 of the vector a2 is a lattice constant of the tetragonal crystal 2 in the [100] direction. A length b2 of the vector b2 is an interval of a (010) plane of the tetragonal crystal 2. In other words, the length b2 of the vector b2 is a lattice constant of the tetragonal crystal 2 in the [010] direction. A length c2 of the vector c2 is an interval of a (001) plane of the tetragonal crystal 2. In other words, the length c2 of the vector c2 is a lattice constant of the tetragonal crystal 2 in the [001] direction. a2 equals to b2. c2 is more than a2.

As illustrated in FIG. 1B and FIG. 3, the (001) plane of the tetragonal crystal 1 (uc1) is oriented in the normal direction dn of the surface of the piezoelectric thin film 3. The (001) plane of the tetragonal crystal 2 (uc2) is also oriented in the normal direction dn of the surface of the piezoelectric thin film 3. For example, each of the (001) plane of the tetragonal crystal 1 and the (001) plane of the tetragonal crystal 2 may be approximately parallel to the surface of piezoelectric thin film 3, and the [001] direction of each of the tetragonal crystal 1 and the tetragonal crystal 2 may be approximately parallel to the normal direction dn of the surface of the piezoelectric thin film 3. The normal direction dn of the surface of the piezoelectric thin film 3 may be approximately parallel to the normal direction $D_N$ of the surface of the single crystal substrate 1. Accordingly, the (001) plane of the tetragonal crystal 1 may be oriented in the normal direction $D_N$ of the surface of the single crystal substrate 1. The (001) plane of the tetragonal crystal 2 may also be oriented in the normal direction $D_N$ of the surface of the single crystal substrate 1. In other words, each of the (001) plane of the tetragonal crystal 1 and the (001) plane of the tetragonal crystal 2 may be approximately parallel to the surface of the single crystal substrate 1, and the [001] direction of each of the tetragonal crystal 1 and the tetragonal crystal 2 may be approximately parallel to the normal direction $D_N$ of the surface of the single crystal substrate 1.

The perovskite type oxide is likely to be polarized in the [001] direction. That is, [001] is an orientation in which the perovskite type oxide is more likely to be polarized in comparison to another crystal orientation. Accordingly, when each of the (001) plane of the tetragonal crystal 1 and the (001) plane of the tetragonal crystal 2 is oriented in the normal direction dn of the surface of the piezoelectric thin film 3, the piezoelectric thin film 3 can have excellent piezoelectric properties. For the same reason, the piezoelectric thin film 3 may be a ferroelectric substance. A crystal orientation described below represents that each of the (001) plane of the tetragonal crystal 1 and the (001) plane of the tetragonal crystal 2 is oriented in the normal direction dn of the surface of the piezoelectric thin film 3.

When the piezoelectric thin film 3 has the crystal orientation, the piezoelectric thin film 3 can have large $(-e_{31,f})^2/\varepsilon_0\varepsilon_r$ (piezoelectric performance index). The crystal orientation is a characteristic unique to a thin film. The thin film is a crystalline film formed by a vapor phase growth method or a solution method. On the other hand, it is difficult for a piezoelectric bulk having the same composition as in the piezoelectric thin film 3 to have the crystal orientation. The reason for this is as follows. The piezoelectric bulk is a sintered body (ceramics) of a powder containing necessary elements of a piezoelectric substance, and it is difficult to control structures and orientations of a plurality of crystals constituting the sintered body. Since the piezoelectric bulk contains Fe, specific resistivity of the piezoelectric bulk is lower in comparison to the piezoelectric thin film 3. As a result, a leak current is likely to occur in the piezoelectric bulk. Accordingly, it is difficult to polarize the piezoelectric bulk through application of a high electric field, and thus it is difficult for the piezoelectric bulk to have a large piezoelectric performance index.

c2/a2 is more than c1/a1. That is, anisotropy of the tetragonal crystal 2 is higher than anisotropy of the tetragonal crystal 1.

Since c2/a2 is more than c1/a1, the tetragonal crystal 2 is more excellent in ferroelectricity in comparison to the tetragonal crystal 1. However, since c2/a2 is more than c1/a1, a crystal structure of the tetragonal crystal 2 is stronger than a crystal structure of the tetragonal crystal 1. That is, an atom in the tetragonal crystal 2 is less likely to move in comparison to an atom in the tetragonal crystal 1. Accordingly, polarization reversal of the tetragonal crystal 2 is less likely to occur in comparison polarization reversal of the tetragonal crystal 1. On the other hand, since c1/a1 is smaller than c2/a2, the ferroelectricity of the tetragonal crystal 1 is inferior to the ferroelectricity of the tetragonal crystal 2. However, since c1/a1 is smaller than c2/a2, the crystal structure of the tetragonal crystal 1 is softer than the crystal structure of the tetragonal crystal 2. That is, an atom in the tetragonal crystal 1 is more likely to move in comparison to an atom in the tetragonal crystal 2. Accordingly, the polarization reversal of the tetragonal crystal 1 is more likely to occur in comparison to the polarization reversal of the tetragonal crystal 2. As described above, since both the tetragonal crystal 2 excellent in the ferroelectricity and the tetragonal crystal 1 in which polarization is likely to be reversed exist in the piezoelectric thin film 3, $(-e_{31,f})$ of the piezoelectric thin film 3 increases, and $(-e_{31,f})^2/\varepsilon_0\varepsilon_r$ (piezoelectric performance index) of the piezoelectric thin film 3 increases.

In contrast to the piezoelectric thin film 3, in the piezoelectric bulk, deformation of the crystal structure which is caused by a stress is less likely to occur. Accordingly, the majority of perovskite type oxides constituting the piezoelectric bulk are cubic crystals, and it is difficult for the piezoelectric bulk to have piezoelectric properties caused by the tetragonal crystal of the perovskite type oxide.

c2−c1 may be more than 0.100 Å and 0.490 Å or less, and preferably from 0.101 to 0.419 Å. In a case where c2−c1 is within the above-described range, the piezoelectric performance index of the piezoelectric thin film 3 is likely to increase due to coexistence of the tetragonal crystal 1 and the tetragonal crystal 2. In a case where c2−c1 is 0.100 Å or less, it is not easy to identify the tetragonal crystal 1 and the tetragonal crystal 2 due to resolution of an X-ray diffraction measurement apparatus.

c1/a1 maybe from 1.010 to 1.145. c2/a2 maybe from 1.085 to 1.200. In a case where c1/a1 is within the above-described range, and c2/a2 is within the above-described range, the tetragonal crystal 2 is likely to have more excellent ferroelectricity in comparison to the tetragonal crystal 1, and the polarization reversal of the tetragonal crystal 1 is more likely to occur in comparison to the polarization reversal of the tetragonal crystal 2. In other words, in a case where c1/a1 is within the above-described range, and c2/a2 is within the above-described range, the piezoelectric performance index of the piezoelectric thin film 3 is likely to increase due to coexistence of the tetragonal crystal 1 and the tetragonal crystal 2. For the same reason, c1/a1 may be from 1.030 to 1.145, and c2/a2 may be from 1.085 to 1.195. For the same reason, c1/a1 may be from 1.034 to 1.143, and c2/a2 may be from 1.085 to 1.194.

As long as c2−c1 is more than 0.100 Å and c2/a2 is more than c1/a1, a value of each of a1, c1, a2, and c2 is not limited. For example, a1 may be from 3.800 to 3.950 Å. For example, c1 may be from 4.052 to 4.342 Å. For example, a2 may be from 3.760 to 3.930 Å. For example, c2 may be from 4.177 to 4.490 Å.

$I_2/(I_1+I_2)$ is from 0.50 to 0.90. $I_1$ is a peak intensity of diffracted X-rays of the (001) plane of the tetragonal crystal 1. That is, $I_1$ is the maximum intensity of the diffracted X-rays of the (001) plane of the tetragonal crystal 1. $I_2$ is a peak intensity of diffracted X-rays of the (001) plane of the tetragonal crystal 2. That is, $I_2$ is the maximum intensity of the diffracted X-rays of the (001) plane of the tetragonal crystal 2. For example, a unit of each of $I_1$ and $I_2$ may be counts per second (cps). Measurement conditions of each of $I_1$ and $I_2$ may be set so that each of $I_1$ and $I_2$ can be higher than a background intensity by at least three digits. That is, in measurement of each of $I_1$ and $I_2$, background correction may be performed.

$I_1$ may be proportional to a total area of the (001) plane of the tetragonal crystal 1 that is oriented in the normal direction dn of the surface of the piezoelectric thin film 3, and $I_2$ may be proportional to a total area of the (001) plane of the tetragonal crystal 2 that is oriented in the normal direction dn of the surface of the piezoelectric thin film 3. In other words, $I_1$ may be proportional to the amount of the tetragonal crystal 1 contained in the piezoelectric thin film 3, and $I_2$ may be proportional to the amount of the tetragonal crystal 2 contained in the piezoelectric thin film 3. Accordingly, $I_2/(I_1+I_2)$ may be an existence ratio of the tetragonal crystal 2 to the total amount of the tetragonal crystal 1 and the tetragonal crystal 2. That is, the existence ratio of the tetragonal crystal 2 to the total amount of the tetragonal crystal 1 and the tetragonal crystal 2 may be from 50% to 90%.

The above-described effect (large piezoelectric performance index) due to coexistence of the tetragonal crystal 1 and the tetragonal crystal 2 is obtained when $I_2/(I_1+I_2)$ is within a range of from 0.50 to 0.90. In a case where $I_2/(I_1+I_2)$ is less than 0.50, $(-e_{31,f})^2/\varepsilon_0\varepsilon_r$ of the piezoelectric thin film is significantly small. Even in a case where $I_2/(I_1+I_2)$ is more than 0.90, $(-e_{31,f})^2/\varepsilon_0\varepsilon_r$ of the piezoelectric thin film is significantly small. From the viewpoint that the piezoelectric thin film 3 is likely to have the large piezoelectric performance index, $I_2/(I_1+I_2)$ may be from 0.50 to 0.85.

The tetragonal crystal 1 and the tetragonal crystal 2 are specified by reciprocal space mapping. That is, the tetragonal crystal 1 and the tetragonal crystal 2 are detected in a reciprocal space map of diffracted X-rays of the perovskite type oxide (the piezoelectric thin film 3), and are identified from each other. The reciprocal space map of the diffracted X-rays of the perovskite type oxide may be referred to as an intensity distribution chart of the diffracted X-rays of the perovskite type oxide in the reciprocal space. For example, the reciprocal space map may be obtained by measuring the intensity of the diffracted X-rays of the perovskite type oxide along two or more scanning axes selected from the group consisting of a $\omega$-axis, a $\phi$-axis, a $\chi$-axis, $2\theta$-axis, and $2\theta\chi$-axis. For example, the reciprocal space map may be a two-dimensional map in a coordinate system composed of the horizontal axis and the vertical axis orthogonal to each other. The horizontal axis of the two-dimensional reciprocal space map may represent a reciprocal of a lattice constant of the perovskite type oxide in an in-plane direction of the surface of the piezoelectric thin film 3. In other words, the horizontal axis of the reciprocal space map may represent a reciprocal (that is, 1/a) of the interval a of the (100) plane of the perovskite type oxide. The vertical axis of the two-dimensional reciprocal space map may represent a reciprocal of the lattice constant of the perovskite type oxide in the normal direction dn (or out-of-plane direction) of the surface of the piezoelectric thin film 3. In other words, the vertical axis of the reciprocal space map may represent a reciprocal (that is, 1/c) of the interval c of the (001) plane of the perovskite type oxide. In a case where the piezoelectric thin film 3 contains the tetragonal crystal 1 and the tetragonal crystal 2, at least two spots exist in the reciprocal space map. One spot between the two spots may correspond to diffracted X-rays of a crystal plane of the tetragonal crystal 1, and the other spot between the two spots may correspond to diffracted X-rays of a crystal plane of the tetragonal crystal 2. For example, one spot between the two spots may correspond to diffracted X-rays of a (204) plane of the tetragonal crystal 1, and the other spot between the two spots may correspond to diffracted X-rays of a (204) plane of the tetragonal crystal 2. From coordinates of the one spot corresponding to the diffracted X-rays of the crystal plane of the tetragonal crystal 1, the interval a1 of the (100) plane of the tetragonal crystal 1 and the interval c1 of the (001) plane of the tetragonal crystal 1 can be specified. From coordinates of the one spot corresponding to the diffracted X-rays of the crystal plane of the tetragonal crystal 2, the interval a2 of the (100) plane of the tetragonal crystal 2 and the interval c2 of the (001) plane of the tetragonal crystal 1 can be specified. The reciprocal space map may include another spot in addition to the two spots derived from the tetragonal crystal 1 and the tetragonal crystal 2. For example, a spot derived from a metal crystal constituting the first electrode layer 2 (base electrode layer) may exist in the reciprocal space map.

An extent of orientation of each of the (001) plane of the tetragonal crystal 1 and the (001) plane of the tetragonal crystal 2 may be quantified by the orientation degree. The larger the orientation degree of each of the (001) plane of the tetragonal crystal 1 and the (001) plane of the tetragonal crystal 2 is, the more the piezoelectric thin film 3 is likely to have a large piezoelectric performance index. The orientation degree of each crystal plane may be calculated on the basis of a peak of the diffracted X-rays derived from each crystal plane. The peak of the diffracted X-rays derived from each crystal plane may be measured through out-of-plane measurement on the surface of the piezoelectric thin film 3. The orientation degree of the (001) plane of the tetragonal crystal 1 in the normal direction dn of the surface of the piezoelectric thin film 3 may be expressed as $100\times I_1/\Sigma I_{1(hkl)}$. $\Sigma I_{1(hkl)}$ is a sum of peak intensities of diffracted X-rays of each crystal plane of the tetragonal crystal 1 which are measured in the out-of-plane direction of the surface of the piezoelectric thin film 3. For example, $\Sigma I_{1(hkl)}$ may be $I_{1(001)}+I_{1(110)}+I_{1(111)}$. $I_{1(001)}$ is the above-described $I_1$. That is, $I_{1(001)}$ is a peak intensity (maximum intensity) of diffracted X-rays of the (001) plane of the tetragonal crystal 1 which is measured in the out-of-plane direction of the surface of the piezoelectric thin film 3. $I_{1(110)}$ is a peak intensity (maximum intensity) of diffracted X-rays of the (110) plane of the tetragonal crystal 1 which is measured in the out-of-plane direction of the surface of the piezoelectric thin film 3. $I_{1(111)}$ is a peak intensity (maximum intensity) of diffracted X-rays of the (111) plane of the tetragonal crystal 1 which is measured in the out-of-plane direction of the surface of the piezoelectric thin film 3. The orientation degree of the (001) plane of the tetragonal crystal 2 may be expressed as $100\times I_2/\Sigma I_{2(hkl)}$. $\Sigma I_{2(hkl)}$ is a sum of peak intensities of diffracted X-rays of each crystal plane of the tetragonal crystal 2 which are measured in the out-of-plane direction of the surface of the piezoelectric thin film 3. For example, $\Sigma I_{2(hkl)}$ may be $I_{2(001)}+I_{2(110)}+I_{2(111)}$. $I_{2(001)}$ is the above-described $I_2$. That is, $I_{2(001)}$ is a peak intensity (maximum intensity) of diffracted X-rays of the (001) plane of the tetragonal crystal 2 which is measured in the out-of-plane direction of the surface of the piezoelectric thin film 3. $I_{2(110)}$ is a peak intensity (maximum intensity) of diffracted X-rays of the (110) plane of the tetragonal crystal 2 which is measured in the out-of-plane direction of the surface of the piezoelectric thin film 3. $I_{2(111)}$ is a peak intensity (maximum intensity) of diffracted X-rays of the (111) plane of the tetragonal crystal 2 which is measured in the out-of-plane direction of the surface of the piezoelectric thin film 3. The extent of orientation of each of the (001) plane of the tetragonal crystal 1 and the (001) plane of the tetragonal crystal 2 may be quantified by an orientation degree F. based on the Lotgering method. Even in a case where the orientation degree is calculated by any of the above-described methods, the orientation degree of each of the (001) plane of the tetragonal crystal 1 and the (001) plane of the tetragonal crystal 2 may be from 70% to 100%, preferably from 80% to 100%, and still more preferably from 90% to 100%. In other words, the (001) plane of the tetragonal crystal 1 may be oriented in the normal direction dn of the surface of the piezoelectric thin film 3 in preference to the other crystal planes of the tetragonal crystal 1. The (001) plane of the tetragonal crystal 2 may also be oriented in the normal direction dn of the surface of the piezoelectric thin film 3 in preference to the other crystal planes of the tetragonal crystal 2.

The piezoelectric thin film 3 may consist of the tetragonal crystal 1 and the tetragonal crystal 2. As long as the piezoelectric thin film 3 has a large piezoelectric performance index, the piezoelectric thin film 3 may further contain at least one kind of a crystal of the perovskite type oxide selected from the group consisting of a cubic crystal and a rhombohedral crystal in addition to the tetragonal crystal 1 and the tetragonal crystal 2.

The perovskite type oxide contained in the piezoelectric thin film 3 may contain at least bismuth (Bi), an element $E^B$, iron (Fe), and oxygen (O). $E^B$ may be at least one kind of element selected from the group consisting of magnesium (Mg), aluminum (Al), titanium (Ti), nickel (Ni), and zinc (Zn). The perovskite type oxide contained in the piezoelectric thin film 3 may further contain an element $E^A$ in addition to the above-described elements. $E^A$ is at least one kind of element selected from the group consisting of sodium (Na), potassium (K), and silver (Ag). In a case where the perovskite type oxide is composed of the above-described elements, the tetragonal crystal 1 and the tetragonal crystal 2 are likely to coexist in the piezoelectric thin film 3, and the tetragonal crystal 1 and the tetragonal crystal 2 are likely to have the above-described crystal orientation, and each of c2−c1, c1/a1, and c2/a2 is likely to be within the above-described range. As long as the piezoelectric thin film 3 has a large piezoelectric performance index, the piezoelectric thin film 3 may further contain other elements in addition to Bi, $E^A$, $E^B$, Fe, and O. The piezoelectric thin film 3 may not contain Pb. The piezoelectric thin film 3 may contain Pb.

The perovskite type oxide contained in the piezoelectric thin film 3 may be expressed by the following Chemical Formula A1. The following Chemical Formula A1 is substantially the same as the following Chemical Formula A1a.

$$(1-x)Bi_{1-\alpha}E^A_\alpha E^B O_3 \text{-} xBiFeO_3 \qquad (A1)$$

$$(Bi_{(1-x)(1-\alpha)+x}E^A_{(1-x)\alpha}(E^B_{1-x}Fe_x)O_{3\pm\delta}) \qquad (A1a)$$

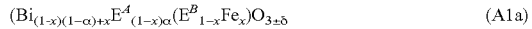

$E^A$ in the above-described Chemical Formulae A1 and A1a may be at least one kind of element selected from the group consisting of Na, K, and Ag. $E^B$ in the above-described Chemical Formulae A1 and A1a may be at least one kind of element selected from the group consisting of Mg, Al, Ti, Ni, and Zn.

x in the above-described Chemical Formulae A1 and A1a may be from 0.30 to 0.80. In a case where x is from 0.30 to 0.80, $I_2/(I_1+I_2)$ is likely to be within a range of from 0.50 to 0.90, and the piezoelectric thin film 3 is likely to have a large piezoelectric performance index. For the same reason, x may be from 0.40 to 0.80, or from 0.50 to 0.80. In a case where x is 0.30 or more, $I_2/(I_1+I_2)$ tends to be 0.50 or more. In a case where x is 0.80 or less, $I_2/(I_1+I_2)$ tends to be 0.90 or less. α in the above-described Chemical Formulae A1 and A1a may be 0.00 or more and less than 1.00. From the viewpoint that $I_2/(I_1+I_2)$ is likely to be within the range of from 0.50 to 0.90, and the piezoelectric thin film 3 is likely to have a large piezoelectric performance index, α may be 0.50.

δ in the above-described Chemical Formula A1a may be 0 or more. As long as the crystal structure (perovskite structure) of the perovskite type oxide is maintained, δ may be a value other than 0. For example, δ may be more than 0 and 1.0 or less. For example, δ may be calculated from a valence of each of ions located at the A-site and the B-site in the perovskite structure. The valence of each ion may be measured by X-ray photoelectron spectroscopy (XPS).

A total value of the number of moles of Bi and $E^A$ contained in the perovskite type oxide may be expressed as [A], a total value of the number of moles of Fe and $E^B$ contained in the perovskite type oxide may be expressed as [B], and [A]/[B] may be 1.0. As long as the crystal structure (perovskite structure) of the perovskite type oxide is maintained, [A]/[B] may be a value other than 1.0. That is, [A]/[B] may be less than 1.0, and [A]/[B] may be more than 1.0.

A composition of each of the tetragonal crystal 1 and the tetragonal crystal 2 may be within the range of the composition expressed by the above-described Chemical Formula A1 or A1a. As long as the composition of each of the tetragonal crystal 1 and the tetragonal crystal 2 is within the range of the composition expressed by the above-described Chemical Formula A1 or A1a, the composition of the tetragonal crystal 1 may be different from the composition of the tetragonal crystal 2. The composition of the tetragonal crystal 1 may be the same as the composition of the tetragonal crystal 2. As long as the entire composition of the perovskite type oxide constituting the piezoelectric thin film 3 is within the range of the composition expressed by the above-described Chemical Formula A1 or A1a, the composition of the tetragonal crystal 1 may be different from the composition of the tetragonal crystal 2. As long as the entire composition of the perovskite type oxide constituting the piezoelectric thin film 3 is within the range of the composition expressed by the above-described Chemical Formula A1 or A1a, the composition of at least one of the tetragonal crystal 1 and the tetragonal crystal 2 may deviate from the range of the composition expressed by the above-described Chemical Formula A1 or A1a.

For example, the thickness of the piezoelectric thin film 3 may be from 10 nm to 10 μm. For example, an area of the piezoelectric thin film 3 may be from 1 μm² to 500 mm². An area of each of the single crystal substrate 1, the first intermediate layer 5, the first electrode layer 2, the second intermediate layer 6, and the second electrode layer 4 may be the same as the area of the piezoelectric thin film 3.

For example, the composition of the piezoelectric thin film may be analyzed by X-ray fluorescent analysis (XRF method) or inductively coupled plasma (ICP) emission spectrometry. The crystal structure and the crystal orientation of the piezoelectric thin film may be specified by an X-ray diffraction (XRD) method. The crystal structure and the crystal orientation of the piezoelectric thin film may be a crystal structure and a crystal orientation of the piezoelectric thin film at ordinary temperature.

For example, the piezoelectric thin film 3 may be formed by the following method.

As a raw material of the piezoelectric thin film 3, a target having the same composition as in the piezoelectric thin film 3 may be used. A method of manufacturing the target is as follows.

As raw materials, for example, an oxide of each of Bi, $E^A$, $E^B$, and Fe may be used. As the raw materials, a substance such as carbonate or oxalate that becomes an oxide through sintering may be used instead of the oxides. After sufficiently drying the raw materials at 100° C. or higher, the raw materials are weighed so that a mole number of each of Bi, $E^A$, $E^B$, and Fe can be within the range defined in the above-described Chemical Formula A1. In vapor phase growth method to be described later, Bi in the target is more likely to volatilize in comparison to other elements. Accordingly, the molar ratio of Bi in the target may be adjusted to a value higher than the molar ratio of Bi in the piezoelectric thin film 3. In a case where a raw material containing K is used as $E^A$, K in the target is more likely to volatilize in comparison to other elements. Accordingly, a molar ratio of K in the target may be adjusted to a value higher than a molar ratio of K in the piezoelectric thin film 3.

The weighed raw materials are sufficiently mixed in an organic solvent or water. A mixing time may be from 5 to 20 hours. For example, a mixing mean may be a ball mill. The raw materials after mixing are sufficiently dried, and the raw materials are molded by a pressing equipment. The molded raw materials are calcined to obtain a calcined material. A calcination temperature may be from 750 to 900° C. A calcination time may be from 1 to 3 hours. The calcined material is pulverized in an organic solvent or water. A pulverization time may be from 5 to 30 hours. A pulverization mean may be a ball mill. After drying the pulverized calcined material, the calcined material to which a binder solution is added is granulated to obtain a powder of the calcined material. A block-shaped green compact is obtained by press molding the powder of the calcined material.

The block-shaped green compact is heated to volatilize the binder in the green compact. A heating temperature may be from 400 to 800° C. A heating time may be from 2 to 4 hours.

After volatilization of the binder, the green compact is sintered. A sintering temperature may be from 800 to 1100° C. A sintering time may be from 2 to 4 hours. A temperature raising rate and a temperature lowering rate of the green compact in the sintering process may be, for example, from 50 to 300° C./hour.

Through the above-described process, the target is obtained. For example, an average grain size of crystal grains of the oxide (perovskite type oxide) contained in the target may be from 1 to 20 μm.

The piezoelectric thin film 3 may be formed by the vapor phase growth method using the target. In the vapor phase growth method, elements constituting the target are vaporized under a vacuum atmosphere. When the vaporized elements adhere to and are deposited on a surface of any one of the second intermediate layer 6, the first electrode layer 2, and the single crystal substrate 1, thereby growing the piezoelectric thin film 3. For example, the vapor phase growth method may be a sputtering method, an electron beam vapor deposition method, a chemical vapor deposition method, or a pulsed-laser deposition method. Hereinafter, the pulsed-laser deposition method is noted as "PLD method". An excitation source is different depending on the kind of the vapor phase growth method. An excitation source in the sputtering method is Ar plasma. An excitation source in the electron beam vapor deposition method is an electron beam. An excitation source in the PLD method is laser light (for example, an excimer laser). When the target is irradiated with the excitation source, elements constituting the target are vaporized. By using the above-described vapor phase growth methods, the piezoelectric thin film 3 is likely to epitaxially grow. By using the above-described vapor phase growth method, it is possible to form the piezoelectric thin film 3 that is dense in an atomic level, and thus segregation of elements in the piezoelectric thin film 3 is suppressed.

Among the above-described vapor phase growth methods, the PLD method is relatively excellent from the following viewpoints. In the PLD method, elements constituting the target can be instantly and uniformly turned into plasma by using the pulse laser. Accordingly, the piezoelectric thin film 3 having approximately the same composition as in the target is likely to be formed. In addition, in the PLD method, the thickness of the piezoelectric thin film 3 is easily controlled by changing the number of laser pulses (repetition frequency).

The piezoelectric thin film 3 may be an epitaxial film. That is, the piezoelectric thin film 3 may be formed by epitaxial growth. Due to the epitaxial growth, c1/a1 of the tetragonal crystal 1 and c2/a2 of the tetragonal crystal 2 are likely to be within the above-described ranges, and the piezoelectric thin film 3 excellent in anisotropy and crystal orientation is likely to be formed. When the piezoelectric thin film 3 is formed by the PLD method, the piezoelectric thin film 3 is likely to be formed by the epitaxial growth.

In the PLD method, the piezoelectric thin film 3 may be formed while heating the single crystal substrate 1 and the first electrode layer 2 in a vacuum chamber. For example, a temperature (film formation temperature) of the single crystal substrate 1 and the first electrode layer 2 may be from 300 to 800° C., from 500 to 700° C., or from 500 to 600° C. As the film formation temperature is high, cleanness of the surface of the single crystal substrate 1 or the first electrode layer 2 is further improved, crystallinity of the piezoelectric thin film 3 becomes higher, and orientation degrees of the crystal planes of the tetragonal crystal 1 and the tetragonal crystal 2 are likely to be higher. In a case where the film formation temperature is excessively high, Bi or K is likely to desorb from the piezoelectric thin film 3, and the composition of the piezoelectric thin film 3 is less likely to be controlled.

In the PLD method, for example, an oxygen partial pressure in the vacuum chamber may be more than 10 mTorr and less than 400 mTorr, from 15 to 300 mTorr, or from 20 to 200 mTorr. In other words, the oxygen partial pressure in the vacuum chamber may be, for example, more than 1 Pa and less than 53 Pa, from 2 to 40 Pa, or from 3 to 30 Pa. When the oxygen partial pressure is maintained in the above-described range, Bi, $E^A$, $E^B$, and Fe deposited on the single crystal substrate 1 are likely to be sufficiently oxidized. In a case where the oxygen partial pressure is excessively low, the orientation degree of the crystal planes of the piezoelectric thin film 3 is likely to decrease, and the tetragonal crystal 1 and the tetragonal crystal 2 are less likely to coexist in the piezoelectric thin film 3. In a case where the oxygen partial pressure is excessively high, a growth rate of the piezoelectric thin film 3 is likely to decrease, and the orientation degree of the crystal planes of the piezoelectric thin film 3 is likely to decrease.

Examples of parameters other than the above-described parameters controlled by the PLD method include a laser oscillation frequency, a distance between the substrate and the target, and the like. The crystal structure and the crystal orientation of the piezoelectric thin film 3 are likely to be controlled through control of the parameters. For example, in a case where a laser oscillation frequency is 10 Hz or less, the orientation degree of the crystal planes of the piezoelectric thin film 3 is likely to be heightened.

In the process of growing the piezoelectric thin film 3, a heat cycle including rising and lowering of a temperature of the single crystal substrate 1 (temperature in the vacuum chamber) may be carried out. The heat cycle may be repeated. A temperature range of the heat cycle may be within a range of the above film formation temperature. In the piezoelectric thin film 3 in growth, a tensile stress parallel to the surface of the single crystal substrate 1 is likely to occur. Alternatively, in the piezoelectric thin film 3 in growth, a compressive stress parallel to the surface of the single crystal substrate 1 is likely to occur. For example, the tensile stress or the compressive stress are caused by lattice mismatching between the single crystal substrate 1 and the piezoelectric thin film 3, or a difference in a coefficient of thermal expansion between the single crystal substrate 1 and the piezoelectric thin film 3. In a case where the tensile stress or the compressive stress is excessively large, the tetragonal crystal 1 and the tetragonal crystal 2 are less likely to be formed, and a single tetragonal crystal (tetragonal crystal that is uniform in anisotropy) is likely to be formed. When the tensile stress or the compressive stress that occurs in the piezoelectric thin film 3 is appropriately moderated by the heat cycle, the piezoelectric thin film 3 in which the tetragonal crystal 1 and the tetragonal crystal 2 coexist is likely to grow.

After the piezoelectric thin film 3 grows, an annealing treatment (heating treatment) for the piezoelectric thin film 3 may be performed. For example, a temperature (annealing temperature) of the piezoelectric thin film 3 in the annealing treatment may be from 300 to 1000° C., from 600 to 1000° C., or from 850 to 1000° C. The piezoelectric properties of the piezoelectric thin film 3 tend to be further improved through the annealing treatment for the piezoelectric thin film 3. Particularly, the piezoelectric properties of the piezoelectric thin film 3 are likely to be improved through an annealing treatment at from 850 to 1000° C. However, the annealing treatment is not essential.

For example, the single crystal substrate 1 may be a substrate consisting of a single crystal of Si, or a substrate consisting of a single crystal of a compound semiconductor such as GaAs. The single crystal substrate 1 may be a substrate consisting of a signal crystal of an oxide. For example, the single crystal of the oxide may be MgO or a perovskite type oxide (for example, $SrTiO_3$). For example, the thickness of the single crystal substrate 1 may be from 10 to 1000 μm. In a case where the single crystal substrate 1 has electrical conductivity, the single crystal substrate 1 functions as an electrode, and thus the first electrode layer 2 may not be provided. For example, the single crystal substrate 1 having the electrical conductivity may be a single crystal of $SrTiO_3$ doped with niobium (Nb).

The crystal orientation of the single crystal substrate 1 may be equal to the normal direction $D_N$ of the surface of the single crystal substrate 1. That is, the surface of the single crystal substrate 1 may be parallel to a crystal plane of the single crystal substrate 1. The single crystal substrate 1 may be a uniaxially oriented substrate. For example, a (100) plane of the single crystal substrate 1 (for example, Si) may be parallel to the surface of the single crystal substrate 1. That is, a [100] direction of the single crystal substrate 1 (for example, Si) may be parallel to the normal direction $D_N$ of the surface of the single crystal substrate 1.

In a case where the (100) plane of the single crystal substrate 1 (for example, Si) is parallel to the surface of the single crystal substrate 1, a (001) plane of a perovskite type crystal in the piezoelectric thin film 3 is likely to be oriented in the normal direction dn of the surface of the piezoelectric thin film 3.

As described above, the first intermediate layer 5 may be disposed between the single crystal substrate 1 and the first electrode layer 2. For example, the first intermediate layer 5 may contain at least one kind selected from the group consisting of titanium (Ti), chromium (Cr), titanium oxide ($TiO_2$), silicon oxide ($SiO_2$), and zirconium oxide ($ZrO_2$). By interposing the first intermediate layer 5, the first electrode layer 2 is likely to adhere to the single crystal substrate 1. The first intermediate layer 5 may be crystalline. A crystal plane of the first intermediate layer 5 may be oriented in the normal direction $D_N$ of the surface of the single crystal substrate 1. Both the crystal plane of the single crystal substrate 1 and the crystal plane of the first intermediate layer 5 may be oriented in the normal direction $D_N$ of the surface of the single crystal substrate 1. A method of forming the first intermediate layer 5 may be a sputtering method, a vacuum vapor deposition method, a printing method, a spin coating method, or a sol-gel method.

The first intermediate layer 5 may contain $ZrO_2$ and an oxide of a rare-earth element. When the first intermediate layer 5 contains $ZrO_2$ and the oxide of the rare-earth element, the first electrode layer 2 consisting of a platinum crystal is likely to be formed on the surface of the first intermediate layer 5, a (002) plane of the platinum crystal is likely to be oriented in the normal direction of the surface of the first electrode layer 2, and a (200) plane of the platinum crystal is likely to be oriented in an in-plane direction of the surface of the first electrode layer 2. The rare-earth element may be at least one kind selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first intermediate layer 5 may contain $ZrO_2$ and $Y_2O_3$. For example, the first intermediate layer 5 may consist of yttria-stabilized zirconia ($Y_2O_3$ added $ZrO_2$). The first intermediate layer 5 may include a first layer consisting of $ZrO_2$, and a second layer consisting of $Y_2O_3$. The first layer consisting of $ZrO_2$ may be directly stacked on the surface of the single crystal substrate 1. The second layer consisting of $Y_2O_3$ may be directly stacked on a surface of the first layer. The first electrode layer 2 may be directly stacked on a surface of the second layer consisting of $Y_2O_3$. In a case where the first intermediate layer 5 contains $ZrO_2$ and $Y_2O_3$, the piezoelectric thin film 3 is likely to epitaxially grow, the tetragonal crystal 1 and the tetragonal crystal 2 are likely to coexist in the piezoelectric thin film 3, and the (001) plane of each of the tetragonal crystal 1 and the tetragonal crystal 2 is likely to be preferentially oriented in the normal direction dn of the surface of the piezoelectric thin film 3. In addition, in a case where the first intermediate layer 5 contains $ZrO_2$ and $Y_2O_3$, the first electrode layer 2 consisting of a platinum crystal is likely to be formed on the surface of the first intermediate layer 5, a (002) plane of the platinum crystal is likely to be oriented in a normal direction of the surface of the first electrode layer 2, and a (200) plane of the platinum crystal is likely to be oriented in an in-plane direction of the surface of the first electrode layer 2.

For example, the first electrode layer 2 may consist of at least one kind of metal selected from the group consisting of platinum (Pt), palladium (Pd), rhodium (Rh), gold (Au), ruthenium (Ru), iridium (Ir), molybdenum (Mo), titanium (Ti), tantalum (Ta), and nickel (Ni). For example, the first electrode layer 2 may consist of a conductive metal oxide such as strontium ruthenate ($SrRuO_3$), lanthanum nickelate ($LaNiO_3$), and lanthanum strontium cobaltate ((La,Sr)$CoO_3$). The first electrode layer 2 may be crystalline. A crystal plane of the first electrode layer 2 may be oriented in the normal direction $D_N$ of the single crystal substrate 1. The crystal plane of the first electrode layer 2 may be approximately parallel to the surface of the single crystal substrate 1. Both the crystal plane of the single crystal substrate 1 and the crystal plane of the first electrode layer 2 may be oriented in the normal direction $D_N$ of the single crystal substrate 1. The crystal plane of the first electrode layer 2 which is oriented in the normal direction $D_N$ of the single crystal substrate 1 may be approximately parallel to the (001) plane of each of the tetragonal crystal 1 and the tetragonal crystal 2 in the piezoelectric thin film 3. For example, the thickness of the first electrode layer 2 may be from 1 nm to 1.0 μm. A method of forming the first electrode layer 2 may be a sputtering method, a vacuum vapor deposition method, a printing method, a spin coating method, or a sol-gel method. In the case of the printing method, the spin coating method, or the sol-gel method, a heating treatment (annealing) of the first electrode layer 2 may be performed to raise crystallinity of the first electrode layer 2.

The first electrode layer 2 may contain a platinum crystal. The first electrode layer 2 may consist of the platinum crystal. The platinum crystal is a cubic crystal having a face-centered cubic structure (fcc structure). A (002) plane of the platinum crystal may be oriented in the normal direction of the surface of the first electrode layer 2, and a (200) plane of the platinum crystal may be oriented in an in-plane direction of the surface of the first electrode layer 2. In other words, the (002) plane of the platinum crystal may be approximately parallel to the surface of the first electrode layer 2, and the (200) plane of the platinum crystal may be approximately perpendicular to the surface of the first electrode layer 2. In a case where the (002) plane and the (200) plane of the platinum crystal constituting the first electrode layer 2 have the above-described orientations, the piezoelectric thin film 3 is likely to epitaxially grow on the surface of the first electrode layer 2, the tetragonal crystal 1 and the tetragonal crystal 2 are likely to coexist in the piezoelectric thin film 3, and the (001) plane of each of the tetragonal crystal 1 and the tetragonal crystal 2 is likely to be preferentially oriented in the normal direction dn of the surface of the piezoelectric thin film 3. The surface of the first electrode layer 2 may be approximately parallel to the surface of the piezoelectric thin film 3. That is, the normal direction of the surface of the first electrode layer 2 may be approximately parallel to the normal direction dn of the surface of the piezoelectric thin film 3.

As described above, the second intermediate layer 6 may be disposed between the first electrode layer 2 and the piezoelectric thin film 3. For example, the second intermediate layer 6 may contain at least one kind selected from the group consisting of $SrRuO_3$, $LaNiO_3$, and $(La,Sr)CoO_3$. For example, $(La,Sr)CoO_3$ may be $La_{0.5}Sr_{0.5}CoO_3$. The second intermediate layer 6 may be crystalline. For example, the second intermediate layer 6 may be a stacked body composed of at least two kinds of buffer layers selected from the group consisting of a layer containing $SrRuO_3$ crystals, a layer containing $LaNiO_3$ crystals, and a layer containing $(La,Sr)CoO_3$ crystals. Any of $SrRuO_3$, $LaNiO_3$, and $(La,Sr)CoO_3$ has a perovskite structure. Accordingly, in a case where the second intermediate layer 6 contains at least one kind selected from the group consisting of $SrRuO_3$, $LaNiO_3$, and $(La,Sr)CoO_3$, the piezoelectric thin film 3 is likely to epitaxially grow, the tetragonal crystal 1 and the tetragonal crystal 2 are likely to coexist in the piezoelectric thin film 3, and the (001) plane of each of the tetragonal crystal 1 and the tetragonal crystal 2 is likely to be preferentially oriented in the normal direction dn of the surface of the piezoelectric thin film 3. In addition, by interposing the second intermediate layer 6, the piezoelectric thin film 3 is likely to adhere to the first electrode layer 2. The crystal plane of the second intermediate layer 6 may be oriented in the normal direction $D_N$ of the surface of the single crystal substrate 1. Both the crystal plane of the single crystal substrate 1 and the crystal plane of the second intermediate layer 6 may be oriented in the normal direction $D_N$ of the surface of the single crystal substrate 1. A method of forming the second intermediate layer 6 may be a sputtering method, a vacuum vapor deposition method, a printing method, a spin coating method, or a sol-gel method.

For example, the second electrode layer 4 may consist of at least one kind of metal selected from the group consisting of Pt, Pd, Rh, Au, Ru, Ir, Mo, Ti, Ta, and Ni. For example, the second electrode layer 4 may consist of at least one kind of conductive metal oxide selected from the group consisting of $LaNiO_3$, $SrRuO_3$, $(La,Sr)CoO_3$. The second electrode layer 4 may be crystalline. A crystal plane of the second electrode layer 4 may be oriented in the normal direction $D_N$ of the single crystal substrate 1. The crystal plane of the second electrode layer 4 may be approximately parallel to the surface of the single crystal substrate 1. The crystal plane of the second electrode layer 4 may be approximately parallel to the crystal plane of each of the tetragonal crystal 1 and the tetragonal crystal 2 in the piezoelectric thin film 3. For example, the thickness of the second electrode layer 4 may be from 1 nm to 1.0 μm. A method of forming the second electrode layer 4 may be a sputtering method, a vacuum vapor deposition method, a printing method, a spin coating method, or a sol-gel method. In the case of the printing method, the spin coating method, or the sol-gel method, a heating treatment (annealing) of the second electrode layer 4 may be performed to raise crystallinity of the second electrode layer 4.

A third intermediate layer may be disposed between the piezoelectric thin film 3 and the second electrode layer 4. By interposing the third intermediate layer, the second electrode layer 4 is likely to adhere to the piezoelectric thin film 3. A composition, a crystal structure, and a formation method of the third intermediate layer may be the same as in the second intermediate layer.

At least a part or the entirety of the surface of the piezoelectric thin film element 10 may be covered by a protective film. For example, when being covered with the protective film, moisture resistance of the piezoelectric thin film element 10 is improved.

Uses of the piezoelectric thin film element according to the first embodiment are various. For example, the piezoelectric thin film element may be used as a piezoelectric transducer. That is, the piezoelectric transducer according to the first embodiment may include the piezoelectric thin film element. For example, the piezoelectric transducer may be an ultrasonic transducer such as an ultrasonic sensor. For example, the piezoelectric thin film element may be a harvester (vibration power generation element). Since the piezoelectric thin film element according to the first embodiment includes the piezoelectric thin film having large $(-e_{31,f})^2/\varepsilon_0\varepsilon_r$, the piezoelectric thin film element is suitable for the ultrasonic transducer or the harvester. The piezoelectric thin film element may be a piezoelectric actuator. The piezoelectric actuator may be used in a head assembly, a head stack assembly, or a hard disk drive. The piezoelectric actuator may be used in a printer head, or an inkjet printer device. The piezoelectric actuator may be a piezoelectric switch. The piezoelectric actuator may be used in haptics. That is, the piezoelectric actuator may be used in various devices for which feedback by skin sensation (tactile sense) is required. For example, the devices for which feedback by skin sensation is required may be a wearable device, a touch pad, a display, or a game controller. The piezoelectric thin film element may be a piezoelectric sensor. For example, the piezoelectric sensor may be a piezoelectric microphone, a gyro sensor, a pressure sensor, a pulse wave sensor, or a shock sensor. The piezoelectric thin film element may be an oscillator or an acoustic multilayer film. The piezoelectric thin film element may be a part or the entirety of micro electro mechanical systems (MEMS), and may be, for example, piezoelectric micromachined ultrasonic transducers (PMUT). Specific examples of products to which the piezoelectric micromachined ultrasonic transducers are applied include a biometric sensor or medical/health care sensor (fingerprint sensor, a blood vessel authentication sensor, or the like), and a time of flight (ToF) sensor.

FIG. 4 illustrates a schematic cross-section of an ultrasonic transducer 10a including the above-described piezoelectric thin film 3. The cross-section of the ultrasonic transducer 10a is perpendicular to the surface of the piezoelectric thin film 3. The ultrasonic transducer 10a may include substrates 1a and 1b, the first electrode layer 2 provided on the substrates 1a and 1b, the piezoelectric thin film 3 stacked on the first electrode layer 2, and the second electrode layer 4 stacked on the piezoelectric thin film 3. An acoustic cavity 1c may be provided on a downward side of the piezoelectric thin film 3. An ultrasonic wave signal is transmitted or received by bending or vibration of the piezoelectric thin film 3. The first intermediate layer may be interposed between the substrates 1a and 1b and the first electrode layer 2. The second intermediate layer may be interposed between the first electrode layer 2 and the piezoelectric thin film 3.

EXAMPLES OF FIRST INVENTION

The first invention will be described in detail with reference to the following examples and comparative examples. The first invention is not limited to the following examples.

Example A1

A single crystal substrate consisting of Si was used for manufacturing a piezoelectric thin film element of Example A1. A (100) plane of Si was parallel to a surface of the single crystal substrate. The single crystal substrate had a square shape of 20 mm×20 mm. The thickness of the single crystal substrate was 500 μm.

The crystalline first intermediate layer consisting of $ZrO_2$ and $Y_2O_3$ was formed on the entirety of the surface of the single crystal substrate in a vacuum chamber. The first intermediate layer was formed by a sputtering method. The thickness of the first intermediate layer was 30 nm.

The first electrode layer consisting of a Pt crystal was formed on the entirety of the surface of the first intermediate layer in the vacuum chamber. The first electrode layer was formed by the sputtering method. The thickness of the first electrode layer was 200 nm. A temperature of the single crystal substrate in a process of forming the first electrode layer was maintained at 500° C.

An XRD pattern of the first electrode layer was measured through out-of-plane measurement on the surface of the first electrode layer. An XRD pattern of the first electrode layer was measured by in-plane measurement on the surface of the first electrode layer. In the measurement of the XRD patterns, an X-ray diffraction apparatus (SmartLab) manufactured by Rigaku Corporation was used. Measurement conditions were set so that each peak intensity in the XRD patterns can become higher than the background intensity by at least three digits. A peak of diffracted X-rays of a (002) plane of the Pt crystal was detected through the out-of-plane measurement. That is, the (002) plane of the Pt crystal was oriented in a normal direction of the surface of the first electrode layer. A peak of diffracted X-rays of a (200) plane of the Pt crystal was detected through the in-plane measurement. That is, the (200) plane of the Pt crystal was oriented in an in-plane direction of the surface of the first electrode layer.

A piezoelectric thin film was formed on the entirety of the surface of the first electrode layer in a vacuum chamber. The piezoelectric thin film was formed by a PLD method. The thickness of the piezoelectric thin film was 2000 nm. A temperature (film formation temperature) of the single crystal substrate in a process of forming the piezoelectric thin film was maintained at 500° C. An oxygen partial pressure inside the vacuum chamber in the process of forming the piezoelectric thin film was maintained at 10 Pa. As a raw material of the piezoelectric thin film, a target (a sintered body of a raw material powder) was used. As raw material powders of the target, bismuth oxide, potassium carbonate, titanium oxide, and iron oxide were used. A mixing ratio of the raw material powders was adjusted in correspondence with a composition of the target piezoelectric thin film. The composition of the target piezoelectric thin film was expressed by the following Chemical Formula A1A. That is, in the case of Example A1, $E^A$ in the following Chemical Formula A1 was K, $E^B$ in the following Chemical Formula A1 was Ti, and α in the following Chemical Formula A1 was 0.5. In the case of Example A1, values of x in the following Chemical Formulae A1 and A1 Å were values shown in the following Table 1A.

$$(1-x)Bi_{0.5}K_{0.5}TiO_3\text{-}xBiFeO_3 \quad (A1A)$$

$$(1-x)Bi_{1-60}\,E^A{}_\alpha E^B O_3\text{-}xBiFeO_3 \quad (A1)$$

The composition of the piezoelectric thin film was analyzed by an XRF method. In the analysis, a device PW2404 manufactured by Koninklijke Philips N.V. was used. From results of the analysis, the composition of the piezoelectric thin film in Example A1 approximately matched the composition of the target expressed by the above-described Chemical Formula A1A.

Reciprocal space mapping of the piezoelectric thin film was performed by using the X-ray diffraction apparatus. In addition, an XRD pattern of the piezoelectric thin film was measured through out-of-plane measurement on a surface of the piezoelectric thin film. In addition, an XRD pattern of the piezoelectric thin film was measured by in-plane measurement on the surface of the piezoelectric thin film. Measurement conditions were set so that each peak intensity in the XRD patterns can become higher than the background intensity by at least three digits. The measurement apparatus and the measurement conditions of the XRD patterns were the same as described above.

Results of analysis of the piezoelectric thin film based on the above XRD method showed that the piezoelectric thin film had following characteristics.

The piezoelectric thin film consisted of a perovskite type oxide.

The piezoelectric thin film contained a tetragonal crystal 1 of the perovskite type oxide and a tetragonal crystal 2 of the perovskite type oxide.

A (001) plane of the tetragonal crystal 1 was preferentially oriented in the normal direction of the surface of the piezoelectric thin film. That is, an orientation degree of the (001) plane of the tetragonal crystal 1 in the normal direction of the surface of the piezoelectric thin film was 90% or more. The orientation degree of the (001) plane of the tetragonal crystal 1 is expressed as $100 \times I_{1(001)}/(I_{1(001)}+I_{1(110)}+I_{1(111)})$.

A (001) plane of the tetragonal crystal 2 was preferentially oriented in the normal direction of the surface of the piezoelectric thin film. That is, an orientation degree of the (001) plane of the tetragonal crystal 2 in the normal direction of the surface of the piezoelectric thin film was 90% or more. The orientation degree of the (001) plane of the tetragonal crystal 2 is expressed as $100 \times I_{2(001)}/(I_{2(001)}+I_{2(110)}+I_{2(111)})$.

An interval c1 of the (001) plane of the tetragonal crystal 1 was a value shown in the following Table 1A.

An interval c2 of the (001) plane of the tetragonal crystal 2 was a value shown in the following Table 1A.

c1/a1 was a value shown in the following Table 1A.
c2/a2 was a value shown in the following Table 1A.
$I_2/(I_1+I_2)$ was a value shown in the following Table 1A.
c2−c1 was a value shown in the following Table 1A.

A stacked body including the single crystal substrate, the first intermediate layer stacked on the single crystal substrate, the first electrode layer stacked on the first intermediate layer, and the piezoelectric thin film stacked on the first electrode layer was manufactured by the above-described method. The following process was further performed by using the stacked body.

A second electrode layer consisting of Pt was formed on the entirety of the surface of the piezoelectric thin film in a vacuum chamber. The second electrode layer was formed by the sputtering method. A temperature of the single crystal substrate in a process of forming the second electrode layer was maintained at 500° C. The thickness of the second electrode layer was 200 nm.

Through the above-described processes, a stacked body including the single crystal substrate, the first intermediate layer stacked on the single crystal substrate, the first electrode layer stacked on the first intermediate layer, the piezoelectric thin film stacked on the first electrode layer, and the second electrode layer stacked on the piezoelectric thin film was manufactured. Patterning of a stacked structure on the single crystal substrate was performed by a subsequent photolithography. After the patterning, the stacked body was cut through dicing.

A piezoelectric thin film element having a rectangular shape in Example A1 was obtained by the above-described processes. The piezoelectric thin film element included the single crystal substrate, the first intermediate layer stacked on the single crystal substrate, the first electrode layer t stacked on the first intermediate layer, the piezoelectric thin film stacked on the first electrode layer, and the second electrode layer stacked on the piezoelectric thin film. An area of a movable part of the piezoelectric thin film was 20 mm×1.0 mm.

<Evaluation of Piezoelectric Properties>

Piezoelectric properties of the piezoelectric thin film were evaluated by the following method.

[Measurement of Residual Polarization]

A polarization hysteresis of the piezoelectric thin film was measured. In the measurement, a device in which an atomic force microscope (AFM) and a ferroelectric evaluation system are combined was used. The atomic force microscope was SPA-400 manufactured by Seiko Instruments Inc. The ferroelectric evaluation system was FCE manufactured by TOYO Corporation. A frequency of an AC voltage in the hysteresis measurement was 5 Hz. In the measurement, a maximum value of a voltage applied to the piezoelectric thin film was 20 V. Residual polarization Pr of the piezoelectric thin film is shown in the following Table 1A. A unit of the residual polarization Pr is $\mu C/cm^2$.

[Calculation of Relative Permittivity]

Capacitance C of the piezoelectric thin film element was measured. Details of measurement of the capacitance C were as follows.

Measurement apparatus: Impedance Gain-Phase Analyzer 4194 Å manufactured by Hewlett Packard Enterprise Development LP.

Frequency: 10 kHz

Electric field: 0.1 V/μm

Relative permittivity $\varepsilon_r$ was calculated from a measurement value of the capacitance C on the basis of the following Mathematical Formula A. $\varepsilon_r$ of Example A1 is shown in the following Table 1A.

$$C = \varepsilon_0 \times \varepsilon_r \times (S/d) \quad (A)$$

$\varepsilon_0$ in Mathematical Formula A is a permittivity (8.854× $10^{-12}$ Fm$^{-1}$) of vacuum. S in Mathematical Formula A is an area of the surface of the piezoelectric thin film. S can be referred to as an area of the first electrode layer stacked on the piezoelectric thin film. d in Mathematical Formula A is the thickness of the piezoelectric thin film.

[Measurement of Piezoelectric Constant $-e_{31,f}$]

In order to measure the piezoelectric constant $-e_{31,f}$ of the piezoelectric thin film, as the piezoelectric thin film element, a sample (cantilever) having a rectangular shape was manufactured. Dimensions of the sample were 3 mm (width)×15 mm (length). The sample was the same as the piezoelectric thin film element of the above-described Example A1 except for the dimensions. In measurement, a self-made evaluation system was used. One end of the sample was fixed, and the other end of the sample was a free end. A displacement amount of the free end of the sample was measured with a laser while applying a voltage to the piezoelectric thin film in the sample. In addition, the piezoelectric constant $-e_{31,f}$ was calculated from the following Mathematical Formula B. Note that, E, in Mathematical Formula B is a Young's modulus of the single crystal substrate. $h_s$ is a thickness of the single crystal substrate. L is a length of the sample (cantilever). $v_s$ is a Poisson's ratio of the single crystal substrate. $\delta_{out}$ is an output displacement based on the measured displacement amount. $V_{in}$ is a voltage applied to the piezoelectric thin film. A frequency of an AC electric field (AC voltage) in the measurement of the piezoelectric constant $-e_{31,f}$ was 100 Hz. A maximum value of the voltage applied to the piezoelectric thin film was 50 V. A unit of $-e_{31,f}$ is C/m$^2$. $-e_{31,f}$ in Example A1 is shown in the following Table 1A. $(-e_{31,f})^2/\varepsilon_0\varepsilon_r$ (piezoelectric performance index) in Example A1 is shown in the following Table 1A.

$$-e_{31,f} = \frac{E_s h_s^2}{3L^2(1-v_s)} \cdot \frac{\delta_{out}}{V_{in}} \quad (B)$$

Examples A2 to A6, and Comparative Examples A1 to A3

A composition of a target used in formation of a piezoelectric thin film of each of Examples A2 to A6 and Comparative Examples A1 to A3 was different from the composition of the target in Example A1. The composition of the target of Example A2 was expressed by the following Chemical Formula A1B. That is, in the case of Example A2, $E^A$ in the following Chemical Formula A1 was K, $E^B$ in the following Chemical Formula A1 was Zn and Ti, and α in the following Chemical Formula A1 was 0.5. In the case of Example A2, values of x in the following Chemical Formulae A1 and A1B were values shown in the following Table 1A.

$$(1-x)Bi_{0.5}K_{0.5}Zn_{0.5}Ti_{0.5}O_3\text{-}xBiFeO_3 \quad (A1B)$$

$$(1-x)Bi_{1-\alpha}E^A{}_\alpha E^B O_3\text{-}xBiFeO_3 \quad (A1)$$

The composition of the target of Example A3 was expressed by the following Chemical Formula A1C. That is, in the case of Example A3, $E^A$ in the following Chemical Formula A1 was K, $E^B$ in the following Chemical Formula A1 was Mg and Ti, and $\alpha$ in the following Chemical Formula A1 was 0.5. In the case of Example A3, values of x in the following Chemical Formulae A1 and A1C were values shown in the following Table 1A.

$$(1-x)Bi_{0.5}K_{0.5}Mg_{0.5}Ti_{0.5}O_3\text{-}xBiFeO_3 \quad (A1C)$$

$$(1-x)Bi_{1-\alpha}E^A{}_\alpha E^B O_3\text{-}xBiFeO_3 \quad (A1)$$

The composition of the target of Example A4 was expressed by the following Chemical Formula A1D. That is, in the case of Example A4, $E^A$ in the following Chemical Formula A1 was Na, $E^B$ in the following Chemical Formula A1 was Zn and Ti, and $\alpha$ in the following Chemical Formula A1 was 0.5. In the case of Example A4, values of x in the following Chemical Formulae A1 and A1D were values shown in the following Table 1A.

$$(1-x)Bi_{0.5}Na_{0.5}Zn_{0.5}Ti_{0.5}O_3\text{-}xBiFeO_3 \quad (A1D)$$

$$(1-x)Bi_{1-\alpha}E^A{}_\alpha E^B O_3\text{-}xBiFeO_3 \quad (A1)$$

The composition of the target of Example A5 was expressed by the following Chemical Formula A1E. That is, in the case of Example A5, $E^A$ in the following Chemical Formula A1 was Ag, $E^B$ in the following Chemical Formula A1 was Ti, and $\alpha$ in the following Chemical Formula A1 was 0.5. In the case of Example A5, values of x in the following Chemical Formulae A1 and A1E were values shown in the following Table 1A.

$$(1-x)Bi_{0.5}Ag_{0.5}TiO_3\text{-}xBiFeO_3 \quad (A1E)$$

$$(1-x)Bi_{1-\alpha}E^A{}_\alpha E^B O_3\text{-}xBiFeO_3 \quad (A1)$$

The composition of the target of Example A6 was expressed by the following Chemical Formula A1F. That is, in the case of Example A6, $E^A$ in the following Chemical Formula A1 was Ag, $E^B$ in the following Chemical Formula A1 was Zn and Ti, and $\alpha$ in the following Chemical Formula A1 was 0.5. In the case of Example A6, values of x in the following Chemical Formulae A1 and A1F were values shown in the following Table 1A.

$$(1-x)Bi_{0.5}Ag_{0.5}Zn_{0.5}Ti_{0.5}O_3\text{-}xBiFeO_3 \quad (A1F)$$

$$(1-x)Bi_{1-\alpha}E^A{}_\alpha E^B O_3\text{-}xBiFeO_3 \quad (A1)$$

The composition of the target of Comparative Example A1 was expressed by the following Chemical Formula A1G. That is, in the case of Comparative Example A1, $E^A$ in the following Chemical Formula A1 was K, $E^B$ in the following Chemical Formula A1 was Zn and Ti, and $\alpha$ in the following Chemical Formula A1 was 0.5. In the case of Comparative Example A1, values of x in the following Chemical Formulae A1 and A1G were values shown in the following Table 1A.

$$(1-x)Bi_{0.5}K_{0.5}Zn_{0.5}Ti_{0.5}O_3\text{-}xBiFeO_3 \quad (A1G)$$

$$(1-x)Bi_{1-\alpha}E^A{}_\alpha E^B O_3\text{-}xBiFeO_3 \quad (A1)$$

The composition of the target of Comparative Example A2 was expressed by the following Chemical Formula A1H. That is, in the case of Comparative Example A2, $E^A$ in the following Chemical Formula A1 was Na, $E^B$ in the following Chemical Formula A1 was Ti, and $\alpha$ in the following Chemical Formula A1 was 0.5. In the case of Comparative Example A2, values of x in the following Chemical Formulae A1 and A1H were values shown in the following Table 1A.

$$(1-x)Bi_{0.5}Na_{0.5}TiO_3\text{-}xBiFeO_3 \quad (A1H)$$

$$(1-x)Bi_{1-\alpha}E^A{}_\alpha E^B O_3\text{-}xBiFeO_3 \quad (A1)$$

The composition of the target of Comparative Example A3 was BiFeO$_3$. That is, in the case of Comparative Example A3, x in the following Chemical Formula A1 was 1.0.

$$(1-x)Bi_{1-\alpha}E^A{}_\alpha E^B O_3\text{-}xBiFeO_3 \quad (A1)$$

A piezoelectric thin film element of each of Examples A2 to A6 and Comparative Examples A1 to A3 was manufactured by the same method as in Example A1 except that the composition of the target used in formation of the piezoelectric thin film is different.

An XRD pattern of the first electrode layer of each of Examples A2 to A6 and Comparative Examples A1 to A3 was measured by the same method as in Example A1. Even in any case of Examples A2 to A6 and Comparative Examples A1 to A3, a (002) plane of the Pt crystal constituting the first electrode layer was oriented in the normal direction of the surface of the first electrode layer, and a (200) plane of the Pt crystal was oriented in the in-plane direction of the surface of the first electrode layer.

The composition of the piezoelectric thin film of each of Examples A2 to A6 and Comparative Examples A1 to A3 was analyzed by the same method as in Example A1. Even in any case of Examples A2 to A6 and Comparative Examples A1 to A3, the composition of the piezoelectric thin film approximately matched the composition of the target.

Analysis of the piezoelectric thin film of each of Examples A2 to A6 and Comparative Examples A1 and A2 was performed on the basis of the XRD method by the same method as in Example A1. Even in any case of Examples A2 to A6 and Comparative Examples A1 and A2, the piezoelectric thin film had following characteristics.

The piezoelectric thin film consisted of a perovskite type oxide.

The piezoelectric thin film contained a tetragonal crystal 1 of the perovskite type oxide and a tetragonal crystal 2 of the perovskite type oxide.

A (001) plane of the tetragonal crystal 1 was preferentially oriented in the normal direction of the surface of the piezoelectric thin film. The orientation degree of the (001) plane of the tetragonal crystal 1 in the normal direction of the surface of the piezoelectric thin film was 90% or more.

A (001) plane of the tetragonal crystal 2 was preferentially oriented in the normal direction of the surface of the piezoelectric thin film. The orientation degree of the (001) plane of the tetragonal crystal 2 in the normal direction of the surface of the piezoelectric thin film was 90% or more.

c1 of each of Examples A2 to A6 and Comparative Examples A1 and A2 was a value shown in the following Table 1A.

c2 of each of Examples A2 to A6 and Comparative Examples A1 and A2 was a value shown in the following Table 1A.

c1/a1 of each of Examples A2 to A6 and Comparative Examples A1 and A2 was a value shown in the following Table 1A.

c2/a2 of each of Examples A2 to A6 and Comparative Examples A1 and A2 was a value shown in the following Table 1A.

$I_2/(I_1+I_2)$ of each of Examples A2 to A6 and Comparative Examples A1 and A2 was a value shown in the following Table 1A.

c2−c1 of each of Examples A2 to A6 and Comparative Examples A1 and A2 was a value shown in the following Table 1A.

The piezoelectric thin film of Comparative Example A3 did not contain two kinds of tetragonal crystals different in anisotropy (c/a). Piezoelectric properties of the piezoelectric thin film of each of Examples A2 to A6 and Comparative Examples A1 to A3 were evaluated by the same method as in Example A1.

Pr of each of Examples A2 to A6 and Comparative Examples A1 to A3 is shown in the following Table 1A.

$\varepsilon_r$ of each of Examples A2 to A6 and Comparative Examples A1 to A3 is shown in the following Table 1A.

$-e_{31,f}$ of each of Examples A2 to A6 and Comparative Examples A1 to A3 is shown in the following Table 1A.

$(-e_{31,f})^2/\varepsilon_0\varepsilon_r$ of each of Examples A2 to A6 and Comparative Examples A1 to A3 is shown in the following Table 1A.

A composition of the piezoelectric thin film of Comparative Example A4 was analyzed by the same method as in Example A1. In the case of Comparative Example A4, the composition of the piezoelectric thin film approximately matched the composition of the target.

Analysis of the piezoelectric thin film of Comparative Example A4 was performed on the basis of the XRD method by the same method as in Example A1. The piezoelectric thin film of Comparative Example A4 had the following characteristics.

The piezoelectric thin film consisted of a perovskite type oxide.

In the case of Comparative Example A4, a single tetragonal crystal was detected as a tetragonal crystal of the perovskite type oxide. That is, the piezoelectric thin film of Comparative Example A4 did not contain two kinds of tetragonal crystals different in anisotropy (c/a). The single tetragonal crystal contained in the piezoelectric thin film of Comparative Example A4 is regarded as the tetragonal crystal 1.

In the case of Comparative Example A4, the orientation degree of a (001) plane of the piezoelectric thin film in the normal direction of the surface of the piezoelectric thin film was less than 50%. In the case of Comparative Example A4, any crystal planes of the tetragonal crystal 1 were not preferentially oriented in the normal direction of the surface of the piezoelectric thin film.

TABLE 1 A

| | $E^A$ | $E^B$ | x | Oriented plane | Pr µC/cm² | $\varepsilon_r$ | $-e_{31,f}$ C/m² | $(-e_{31,f})^2/\varepsilon_0\varepsilon_r$ GPa | $I_2/(I_1+I_2)$ | c2 Å | c2/a2 | c1 Å | c1/a1 | c2−c1 Å |
|---|---|---|---|---|---|---|---|---|---|---|---|---|---|---|
| Example A1 | K | Ti | 0.4 | (001) | 80 | 115 | 7.3 | 52.3 | 0.81 | 4.471 | 1.170 | 4.052 | 1.034 | 0.419 |
| Example A2 | K | Zn, Ti | 0.8 | (001) | 100 | 93 | 7.5 | 68.3 | 0.85 | 4.273 | 1.087 | 4.143 | 1.057 | 0.130 |
| Example A3 | K | Mg, Ti | 0.6 | (001) | 95 | 98 | 6.9 | 54.9 | 0.73 | 4.354 | 1.140 | 4.212 | 1.103 | 0.142 |
| Example A4 | Na | Zn, Ti | 0.3 | (001) | 83 | 110 | 6.7 | 46.1 | 0.67 | 4.464 | 1.166 | 4.342 | 1.143 | 0.122 |
| Example A5 | Ag | Ti | 0.5 | (001) | 96 | 102 | 7.1 | 55.8 | 0.62 | 4.490 | 1.194 | 4.237 | 1.086 | 0.253 |
| Example A6 | Ag | Zn, Ti | 0.8 | (001) | 98 | 94 | 6.9 | 57.2 | 0.50 | 4.299 | 1.111 | 4.198 | 1.071 | 0.101 |
| Comparative Example A1 | K | Zn, Ti | 0.9 | (001) | 120 | 95 | 1.8 | 3.9 | 0.95 | 4.645 | 1.191 | 4.155 | 1.052 | 0.490 |
| Comparative Example A2 | Na | Ti | 0.2 | (001) | 40 | 150 | 2.2 | 3.6 | 0.45 | 4.378 | 1.152 | 4.128 | 1.045 | 0.250 |
| Comparative Example A3 | — | — | 1.0 | — | 60 | 125 | 3.5 | 11.1 | — | — | — | — | — | — |

Comparative Example A4

An oxygen partial pressure in the vacuum chamber in a process of forming a piezoelectric thin film of Comparative Example A4 was maintained at 0.1 Pa.

A piezoelectric thin film element of Comparative Example A4 was manufactured by the same method as in Example A2 except for the oxygen partial pressure in the process of forming the piezoelectric thin film.

An XRD pattern of the first electrode layer of Comparative Example A4 was measured by the same method as in Example A1. In the case of Comparative Example A4, a (002) plane of the Pt crystal constituting the first electrode layer was oriented in the normal direction of the surface of the first electrode layer, and a (200) plane of the Pt crystal was oriented in the in-plane direction of the surface of the first electrode layer.

c1 of Comparative Example A4 was a value shown in the following Table 2A.

c1/a1 of Comparative Example A4 was a value shown in the following Table 2A.

$I_2/(I_1+I_2)$ of Comparative Example A4 was a value shown in the following Table 2A.

Piezoelectric properties of the piezoelectric thin film of Comparative Example A4 were evaluated by the same method as in Example A1.

Pr of Comparative Example A4 is shown in the following Table 2A.

$\varepsilon_r$ of Comparative Example A4 is shown in the following Table 2A.

$-e_{31,f}$ of Comparative Example A4 is shown in the following Table 2A.

$(-e_{31,f})^2/\varepsilon_0\varepsilon_r$ of Comparative Example A4 is shown in the following Table 2A.

TABLE 2A

| | $E^A$ | $E^B$ | x | Oriented plane | Pr µC/cm² | $\varepsilon_r$ | $-e_{31,f}$ C/m² | $(-e_{31,f})^2/\varepsilon_0\varepsilon_r$ GPa | $l_2/(l_1+l_2)$ | c2 Å | c2/a2 | c1 Å | c1/a1 | c2 − c1 Å |
|---|---|---|---|---|---|---|---|---|---|---|---|---|---|---|
| Example A2 | K | Zn, Ti | 0.8 | (001) | 100 | 93 | 7.5 | 68.3 | 0.85 | 4.273 | 1.087 | 4.143 | 1.057 | 0.130 |
| Comparative Example A4 | K | Zn, Ti | 0.8 | None | 36 | 358 | 1.0 | 0.3 | 0.00 | — | — | 4.104 | 1.055 | — |

Examples A7 and A8

In the case of Examples A7 and A8, the second intermediate layer was formed on the entirety of the surface of the first electrode layer, and the piezoelectric thin film was formed on the entirety of the surface of the second intermediate layer. The second intermediate layer of Example A7 consisted of crystalline SrRuO₃. The thickness of the second intermediate layer of Example A7 was 50 nm. The second intermediate layer of Example A8 consisted of crystalline LaNiO₃. The thickness of the second intermediate layer of Example A8 was 50 nm. "SRO" in the following Table 3A represents SrRuO₃. "LNO" in the following Table 3A represents LaNiO₃.

A piezoelectric thin film element of each of Examples A7 and A8 was manufactured by the same method as in Example A2 except that the second intermediate layer was formed.

An XRD pattern of the first electrode layer of each of Examples A7 and A8 was measured by the same method as in Example A1. Even in any case of Examples A7 and A8, a (002) plane of the Pt crystal constituting the first electrode layer was oriented in the normal direction of the surface of the first electrode layer, and a (200) plane of the Pt crystal was oriented in the in-plane direction of the surface of the first electrode layer.

The composition of the piezoelectric thin film of each of Examples A7 and A8 was analyzed by the same method as in Example A1. Even in any case of Examples A7 and A8, the composition of the piezoelectric thin film approximately matched the composition of the target.

Analysis of the piezoelectric thin film of each of Examples A7 and A8 was performed on the basis of the XRD method by the same method as in Example A1. Even in any case of Examples A7 and A8, the piezoelectric thin film had following characteristics.

The piezoelectric thin film consisted of a perovskite type oxide.

The piezoelectric thin film contained a tetragonal crystal 1 of the perovskite type oxide and a tetragonal crystal 2 of the perovskite type oxide.

A (001) plane of the tetragonal crystal 1 was preferentially oriented in the normal direction of the surface of the piezoelectric thin film. The orientation degree of the (001) plane of the tetragonal crystal 1 in the normal direction of the surface of the piezoelectric thin film was 90% or more.

A (001) plane of the tetragonal crystal 2 was preferentially oriented in the normal direction of the surface of the piezoelectric thin film. The orientation degree of the (001) plane of the tetragonal crystal 2 in the normal direction of the surface of the piezoelectric thin film was 90% or more.

c1 of each of Examples A7 and A8 was a value shown in the following Table 3A.

c2 of each of Examples A7 and A8 was a value shown in the following Table 3A.

c1/a1 of each of Examples A7 and A8 was a value shown in the following Table 3A.

c2/a2 of each of Examples A7 and A8 was a value shown in the following Table 3A.

$I_2/(I_1+I_2)$ of each of Examples A7 and A8 was a value shown in the following Table 3A.

c2−c1 of each of Examples A7 and A8 was a value shown in the following Table 3A.

Piezoelectric properties of the piezoelectric thin film of each of Examples A7 and A8 were evaluated by the same method as in Example A1.

Pr of each of Examples A7 and A8 is shown in the following Table 3A.

$\varepsilon_r$ of each of Examples A7 and A8 is shown in the following Table 3A.

$-e_{31,f}$ of each of Examples A7 and A8 is shown in the following Table 3A.

$(-e_{31,f})^2/\varepsilon_0\varepsilon_r$ of each of Examples A7 and A8 is shown in the following Table 3A.

TABLE 3A

| | $E^A$ | $E^B$ | x | Oriented plane | Intermediate layer | Pr µC/cm² | $\varepsilon_r$ | $-e_{31,f}$ C/m² | $(-e_{31,f})^2/\varepsilon_0\varepsilon_r$ GPa | $l_2/(l_1+l_2)$ | c2 Å | c2/a2 | c1 Å | c1/a1 | c2 − c1 Å |
|---|---|---|---|---|---|---|---|---|---|---|---|---|---|---|---|
| Example A2 | K | Zn, Ti | 0.8 | (001) | None | 100 | 93 | 7.5 | 68.3 | 0.85 | 4.273 | 1.087 | 4.143 | 1.057 | 0.130 |
| Example A7 | K | Zn, Ti | 0.8 | (001) | SRO | 89 | 102 | 7.1 | 55.8 | 0.81 | 4.369 | 1.129 | 4.131 | 1.062 | 0.238 |
| Example A8 | K | Zn, Ti | 0.8 | (001) | LNO | 107 | 90 | 7.9 | 78.3 | 0.90 | 4.451 | 1.150 | 4.162 | 1.070 | 0.288 |

Example A9

In a process of manufacturing a piezoelectric thin film element of Example A9, the first intermediate layer was not formed. In the process of manufacturing the piezoelectric thin film element of Example A9, a first electrode layer consisting of crystalline SrRuO₃ was directly formed on the entirety of the surface of the single crystal substrate. The thickness of the first electrode layer of Example A9 was 200 nm. The piezoelectric thin film element of Example A9 was manufactured by the same method as in Example A2 except for the above-described configurations.

An XRD pattern of the first electrode layer of Example A9 was measured by the same method as in Example A1. In the case of Example A9, crystal planes of the first electrode layer were not oriented in the in-plane direction of the surface of the first electrode layer. That is, in the case of Example A9, the in-plane orientation of the crystal of the first electrode layer did not exist.

The composition of the piezoelectric thin film of Example A9 was analyzed by the same method as in Example A1. In the case of Example A9, the composition of the piezoelectric thin film approximately matched the composition of the target.

Analysis of the piezoelectric thin film of Example A9 was performed on the basis of the XRD method by the same method as in Example A1. The piezoelectric thin film of Example A9 had following characteristics.

The piezoelectric thin film consisted of a perovskite type oxide.

The piezoelectric thin film contained a tetragonal crystal 1 of the perovskite type oxide and a tetragonal crystal 2 of the perovskite type oxide.

A (001) plane of the tetragonal crystal 1 was preferentially oriented in the normal direction of the surface of the piezoelectric thin film. The orientation degree of the (001) plane of the tetragonal crystal 1 in the normal direction of the surface of the piezoelectric thin film was 90% or more.

A (001) plane of the tetragonal crystal 2 was preferentially oriented in the normal direction of the surface of the piezoelectric thin film. The orientation degree of the (001) plane of the tetragonal crystal 2 in the normal direction of the surface of the piezoelectric thin film was 90% or more.

c1 of Examples A9 was a value shown in the following Table 4A.

c2 of Examples A9 was a value shown in the following Table 4A.

c1/a1 of Examples A9 was a value shown in the following Table 4A.

c2/a2 of Examples A9 was a value shown in the following Table 4A.

$I_2/(I_1+I_2)$ of Examples A9 was a value shown in the following Table 4A.

c2−c1 of Examples A9 was a value shown in the following Table 4A.

Piezoelectric properties of the piezoelectric thin film of Example A9 were evaluated by the same method as in Example A1.

Pr of Examples A9 is shown in the following Table 4A.
$\varepsilon_r$ of Examples A9 is shown in the following Table 4A.
$-e_{31,f}$ of Examples A9 is shown in the following Table 4A.
$(-e_{31,f})^2/\varepsilon_0\varepsilon_r$ of Examples A9 is shown in the following Table 4A.

TABLE 4A

| | $E^A$ | $E^B$ | x | Oriented plane | In-plane orientation | Pr μC/cm$^2$ | $\varepsilon_r$ | $-e_{31,f}$ C/m$^2$ | $(-e_{31,f})^2/\varepsilon_0\varepsilon_r$ GPa | $I_2/(I_1+I_2)$ | c2 Å | c2/a2 | c1 Å | c1/a1 | c2 − c1 Å |
|---|---|---|---|---|---|---|---|---|---|---|---|---|---|---|---|
| Example A2 | K | Zn, Ti | 0.8 | (001) | Present | 100 | 93 | 7.5 | 68.3 | 0.85 | 4.273 | 1.087 | 4.143 | 1.057 | 0.130 |
| Example A9 | K | Zn, Ti | 0.8 | (001) | None | 85 | 112 | 6.9 | 48.0 | 0.74 | 4.177 | 1.085 | 4.071 | 1.052 | 0.106 |

<<Industrial Applicability of First Invention>>

The piezoelectric thin film according to the first invention is applied to, for example, a piezoelectric transducer, a piezoelectric actuator, and a piezoelectric sensor.

<<Reference Signs List in FIG. 1A, FIG. 1B, FIG. 2, FIG. 3 and FIG. 4>>

10: piezoelectric thin film element, 10a: ultrasonic transducer, 1: single crystal substrate, 2: first electrode layer, 3: piezoelectric thin film, 4: second electrode layer, 5: first intermediate layer, 6: second intermediate layer, $D_N$: normal direction of surface of single crystal substrate, dn: normal direction of surface of piezoelectric thin film, uc: unit cell of perovskite structure, uc1: unit cell of tetragonal crystal 1, and uc2: unit cell of tetragonal crystal 2.

Embodiment of Second Invention

Hereinafter, details of a preferred embodiment of a second invention will be described with reference to the accompanying drawings. The following "second embodiment" represents the preferred embodiment of the second invention. However, the second invention is not limited to the following second embodiment. In the drawings, the same reference numeral will be given to the same or equivalent element. However, a piezoelectric thin film 3 according to the second embodiment described below is different from the piezoelectric thin film 3 according to the first embodiment. The X-axis, the Y-axis, and the Z-axis illustrated in FIG. 1A, FIG. 1B, and FIG. 4 are three coordinate axes orthogonal to each other. A direction of each of the three coordinate axes is common to FIG. 1A, FIG. 1B, and FIG. 4.

(Piezoelectric Thin Film and Piezoelectric Thin Film Element)

A piezoelectric thin film element according to the second embodiment includes a piezoelectric thin film. FIG. 1A illustrates a cross-section of a piezoelectric thin film element 10 according to the second embodiment. The cross-section of the piezoelectric thin film element 10 is perpendicular to a surface of a piezoelectric thin film 3. The piezoelectric thin film element 10 includes a single crystal substrate 1, a first electrode layer 2 (lower electrode layer) stacked on the single crystal substrate 1, the piezoelectric thin film 3 stacked on the first electrode layer 2, and a second electrode layer 4 (upper electrode layer) stacked on the piezoelectric thin film 3. The piezoelectric thin film element 10 may further includes a first intermediate layer 5. The first intermediate layer 5 may be disposed between the single crystal substrate 1 and the first electrode layer 2, and the first electrode layer 2 may be directly stacked on a surface of the first intermediate layer 5. The piezoelectric thin film element 10 may include a second intermediate layer 6. The second intermediate layer 6 may be disposed between the first electrode layer 2 and the piezoelectric thin film 3, and the piezoelectric thin film 3 may be directly stacked on a surface of the second intermediate layer 6. The thickness of each of the single crystal substrate 1, the first intermediate layer 5, the first electrode layer 2, the second intermediate layer 6, the piezoelectric thin film 3, and the second electrode layer 4 may be uniform. As illustrated in FIG. 1B, a normal direction dn of a surface of the piezoelectric thin film 3 may be approximately parallel to a normal direction $D_N$ of a surface of the single crystal substrate 1. In FIG. 1B, the first electrode layer, the first intermediate layer, the second intermediate layer, and the second electrode layer are omitted.

A modification example of the piezoelectric thin film element 10 may not be provided with the single crystal substrate 1. For example, the single crystal substrate 1 may be removed after forming the first electrode layer 2 and the piezoelectric thin film 3. A modification example of the piezoelectric thin film element 10 may not be provided with the second electrode layer 4. For example, after a piezoelectric thin film element that does not include a second electrode layer is supplied to a manufacturer of an electronic device as a product, the second electrode layer may be applied to the piezoelectric thin film element in a process of manufacturing the electronic device. In a case where the single crystal substrate 1 functions as an electrode, a modification example of the piezoelectric thin film element 10 may not be provided with the first electrode layer 2. That is, the modification example of the piezoelectric thin film element 10 may be provided with the single crystal substrate 1, and the piezoelectric thin film 3 stacked on the single crystal substrate 1. In a case where the first electrode layer 2 does not exist, the piezoelectric thin film 3 may be directly stacked on the single crystal substrate 1. In a case where the first electrode layer 2 does not exist, the piezoelectric thin film 3 may be stacked on the single crystal substrate 1 through at least one intermediate layer between the first intermediate layer 5 and the second intermediate layer 6.

The piezoelectric thin film 3 contains an oxide having a perovskite structure. That is, at least a part of oxides contained in the piezoelectric thin film 3 is a crystal having the perovskite structure. All oxides contained in the piezoelectric thin film 3 may be crystals having the perovskite structure. In some cases, an oxide having the perovskite structure is noted as "perovskite type oxide". The perovskite type oxide is a main component of the piezoelectric thin film 3. A ratio of the perovskite type oxide to the entirety of the piezoelectric thin film 3 may be from 99 to 100 mol %. The piezoelectric thin film 3 may consist of the perovskite type oxide.

The perovskite type oxide contains at least divalent iron ($Fe^{2+}$) and oxygen (O). The perovskite type oxide may contain bismuth (Bi), divalent iron ($Fe^{2+}$), trivalent iron ($Fe^{3+}$), and oxygen (O). The perovskite type oxide may contain bismuth (Bi), divalent iron ($Fe^{2+}$), trivalent iron ($Fe^{3+}$), titanium (Ti), and oxygen (O). The perovskite type oxide may contain bismuth (Bi), divalent iron ($Fe^{2+}$), trivalent iron ($Fe^{3+}$), titanium (Ti), an element $E^B$, and oxygen (O), and $E^B$ may be at least one kind of element selected from the group consisting of magnesium (Mg), aluminum (Al), zirconium (Zr), titanium (Ti), nickel (Ni), and zinc (Zn). The perovskite type oxide may contain a plurality of kinds of elements as $E^B$. The perovskite type oxide may contain bismuth (Bi), an element $E^A$, divalent iron ($Fe^{2+}$), trivalent iron ($Fe^{3+}$), titanium (Ti), an element $E^B$, and oxygen (O), and $E^A$ may be at least one kind of element selected from the group consisting of sodium (Na), potassium (K), and silver (Ag). The perovskite type oxide may contain a plurality of kinds of elements as $E^A$.

Figure 5:
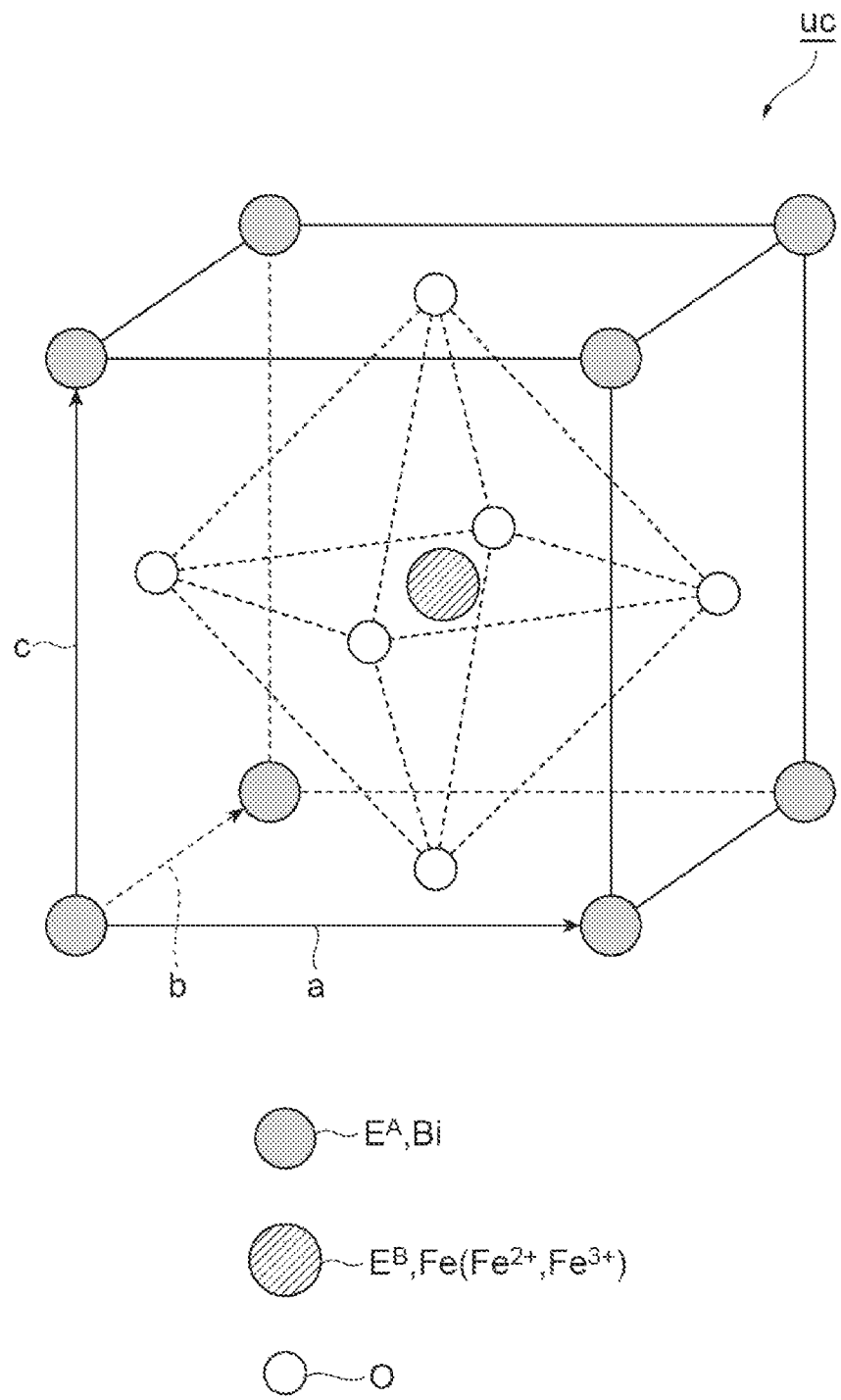
FIG. 5 is a view relating to the second invention, is a perspective view of a unit cell of an oxide (tetragonal crystal) having a perovskite structure, and illustrates arrangement of respective elements in the perovskite structure.

FIG. 5 illustrates a unit cell uc of the perovskite type oxide. At least a part of elements located at an A-site of the unit cell uc of the perovskite type oxide may be Bi. The elements located at the A-site may be only Bi. A part of elements located at the A-site may be $E^A$.

At least a part of elements located at a B-site of the unit cell uc of the perovskite type oxide is Fe. At least a part of Fe located at the B-site is $Fe^{2+}$. A part of Fe located at the B-site may be $Fe^{3+}$. A part of the elements located at the B-site may be $E^B$ such as Ti.

Figure 6:
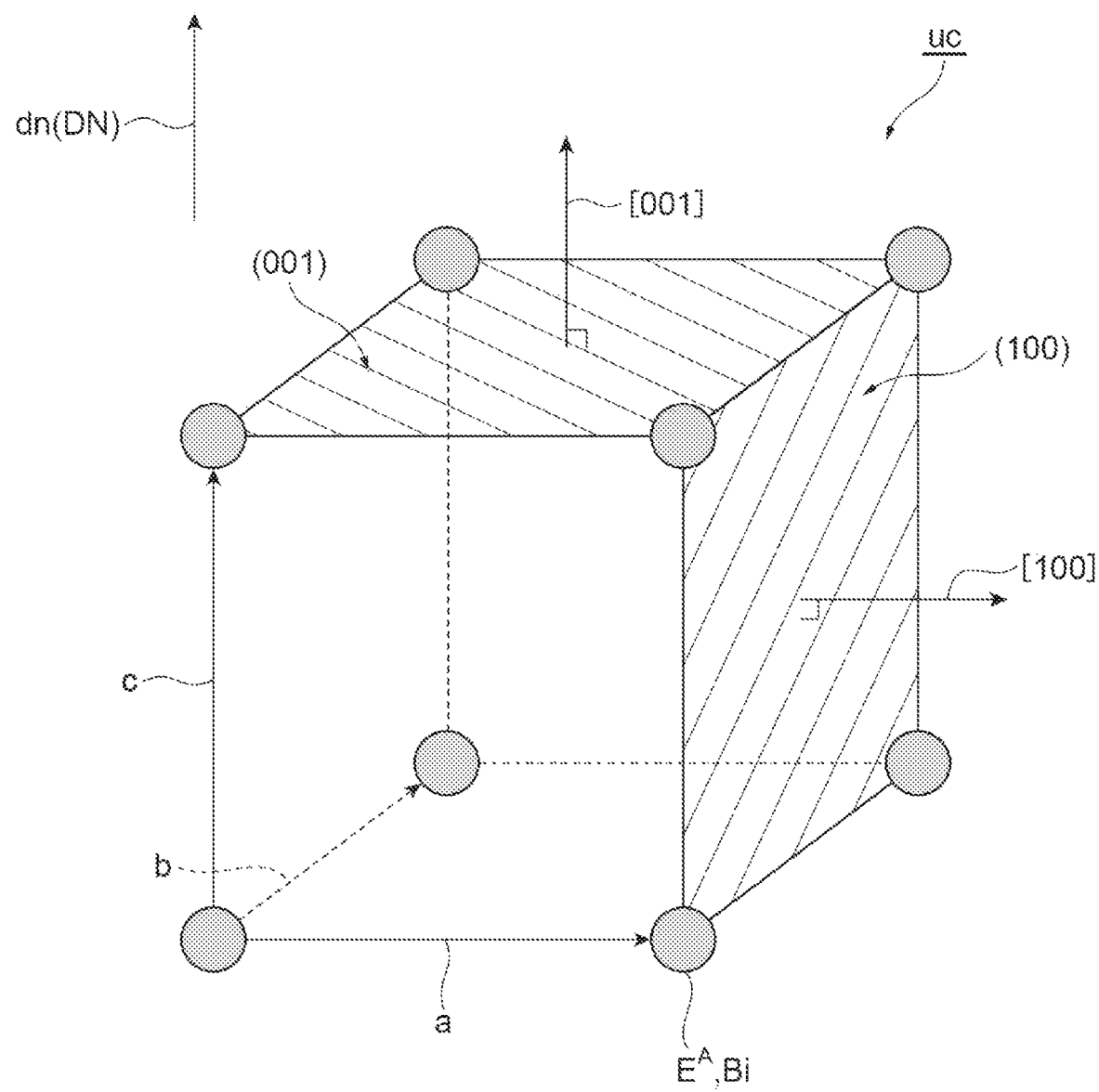
FIG. 6 is a view relating to the second invention, is a perspective view of a unit cell of an oxide (tetragonal crystal) having the perovskite structure, and illustrates a crystal plane and a crystal orientation of the tetragonal crystal.

The piezoelectric thin film 3 contains a tetragonal crystal of the perovskite type oxide. FIG. 6 illustrates a unit cell uc of the tetragonal crystal. The unit cell uc of the tetragonal crystal in FIG. 6 is the same as the unit cell uc in FIG. 5, but for convenience of illustration, $E^B$ and O constituting the unit cell in FIG. 6 are omitted.

Each of a, b, and c in FIG. 5 and FIG. 6 represents a fundamental vector of the tetragonal crystal (perovskite type oxide). a, b, and c are perpendicular to each other. An orientation of the vector a (a-axis) is [100]. An orientation of the vector b (b-axis) is [010]. An orientation of the vector c (c-axis) is [001]. A length a of the vector a is an interval of a (100) plane of the tetragonal crystal. In other words, the length a of the vector a is a lattice constant of the tetragonal crystal in the [100] direction. A length b of the vector b is an interval of a (010) plane of the tetragonal crystal. In other words, the length b of the vector b is a lattice constant of the tetragonal crystal in the [010] direction. A length c of the vector c is an interval of a (001) plane of the tetragonal crystal. In other words, the length c of the vector c is a lattice constant of the tetragonal crystal in the [001] direction. a equals to b. c is more than a.

As illustrated in FIG. 1B and FIG. 6, the (001) plane of the tetragonal crystal (uc) is oriented in a normal direction dn of the surface of the piezoelectric thin film 3. For example, the (001) plane of the tetragonal crystal may be approximately parallel to the surface of the piezoelectric thin film 3, and the [001] direction of the tetragonal crystal may be approximately parallel to the normal direction dn of the surface of the piezoelectric thin film 3. The normal direction dn of the surface of the piezoelectric thin film 3 may be approximately parallel to a normal direction $D_N$ of the surface of the single crystal substrate 1. Accordingly, the (001) plane of the tetragonal crystal may be oriented in the normal direction $D_N$ of the surface of the single crystal substrate 1. In other words, the (001) plane of the tetragonal crystal may be approximately parallel to the surface of the single crystal substrate 1, and the [001] direction of the tetragonal crystal may be approximately parallel to the normal direction $D_N$ of the surface of the single crystal substrate 1

The perovskite type oxide is likely to be polarized in the [001] direction. That is, [001] is an orientation in which the perovskite type oxide is more likely to be polarized in comparison to another crystal orientation. Accordingly, when the (001) plane of the tetragonal crystal is oriented in the normal direction dn of the surface of the piezoelectric thin film 3, the piezoelectric thin film 3 can have excellent piezoelectric properties. For the same reason, the piezoelectric thin film 3 may be a ferroelectric substance. A crystal orientation described below represents that the (001) plane of the tetragonal crystal is oriented in the normal direction dn of the surface of the piezoelectric thin film 3.

When the piezoelectric thin film 3 has the crystal orientation, the piezoelectric thin film 3 can have large $(-e_{31,f})^2/\varepsilon_0\varepsilon_r$ (piezoelectric performance index). The crystal orientation is a characteristic unique to a thin film. The thin film is a crystalline film formed by a vapor phase growth method or a solution method. On the other hand, it is difficult for a piezoelectric bulk having the same composition as in the piezoelectric thin film 3 to have the crystal orientation. The reason for this is as follows. The piezoelectric bulk is a sintered body (ceramics) of a powder containing necessary elements of a piezoelectric substance, and it is difficult to control structures and orientations of a plurality of crystals constituting the sintered body. Since it is difficult for the piezoelectric bulk to have the crystal orientation, in a case where the piezoelectric bulk contains Fe, specific resistivity of the piezoelectric bulk is likely to be lower in comparison to the piezoelectric thin film 3. As a result, a leak current is likely to occur in the piezoelectric bulk. Accordingly, it is difficult to polarize the piezoelectric bulk through application of a high electric field, and thus it is difficult for the piezoelectric bulk to have a large piezoelectric performance index.

c/a is from 1.050 to 1.250. When c/a is from 1.050 to 1.250, the piezoelectric thin film 3 can have a large piezoelectric performance index. In a case where c/a is less than 1.050, it is difficult for the piezoelectric thin film 3 to have a large piezoelectric performance index. Even in a case where c/a is more than 1.250, it is difficult for the piezoelectric thin film 3 to have a large piezoelectric performance index. From the viewpoint that the piezoelectric thin film 3 is likely to have a large piezoelectric performance index, c/a may be from 1.050 to 1.248. For example, a may be from 3.762 to 3.950 Å. For example, c may be from 4.148 to 4.692 Å.

According to the present inventor's consideration, the reason why the piezoelectric thin film 3 containing $Fe^{2+}$ has a large piezoelectric performance index is as follows. However, the reason why the piezoelectric thin film 3 containing $Fe^{2+}$ has a large piezoelectric performance index is not limited to the following reason.

In a case where a $BiFeO_3$—$(Bi,K)TiO_3$ based piezoelectric thin film has a composition near a morphotropic phase boundary (MPB) between a tetragonal crystal and a rhombohedral crystal, a piezoelectric characteristic $(-e_{31,f})$ derived from the tetragonal crystal is improved, but a permittivity $(\varepsilon_0\varepsilon_r)$ is also increased. Therefore, the piezoelectric performance index is less likely to be improved. In order to suppress an increase in the permittivity, it is preferable to improve piezoelectric properties (ferroelectricity) of the piezoelectric thin film by constituting the piezoelectric thin film only by the tetragonal crystal. Tetragonality of the piezoelectric thin film is realized by an epitaxial stress (a compressive stress due to lattice mismatching). The reason for this is because the piezoelectric thin film is compressed in a direction (that is, the a-axis direction and the b-axis direction) parallel to the surface of the piezoelectric thin film due to the epitaxial stress parallel to the surface of the piezoelectric thin film, and the piezoelectric thin film is distorted. However, the thicker the piezoelectric thin film is, the more it is difficult to improve the tetragonality of the piezoelectric thin film by only the epitaxial stress. The thicker the piezoelectric thin film is, the more it is difficult to distort the entirety of the piezoelectric thin film 3 by the epitaxial stress. Accordingly, it is preferable to stabilize a tetragonal structure of the piezoelectric thin film even in a case where the piezoelectric thin film is thick to a certain extent in which the epitaxial stress occurred in the piezoelectric thin film becomes weak. Here, in the piezoelectric thin film 3 according to the second embodiment, an ion at the B-site is substituted with $Fe^{2+}$ so that electron arrangement of an element (ion) located at the B-site of the perovskite type oxide becomes similar to d6 electron arrangement of $Co^{3+}$ constituting $BiCoO_3$. As a result, even in a case where the piezoelectric thin film 3 is thick to a certain extent in which the epitaxial stress occurred in the piezoelectric thin film 3 becomes weak, the tetragonality of the piezoelectric thin film 3 is improved. In other words, even in a case where the piezoelectric thin film 3 is thick to a certain extent in which the epitaxial stress occurred in the piezoelectric thin film 3 becomes weak, a tetragonal crystal of which c/a is 1.050 or more is contained in the piezoelectric thin film 3.

Even in a composition system near an MPB where a rhombohedral crystal is expected to be formed in a piezoelectric bulk, in the piezoelectric thin film 3 in which a part of ions located at the B-site is substituted with $Fe^{2+}$, rotation (rotation around the c-axis) of a $BO_6$ octahedron (or $BO_5$ pyramid) in a tetragonal crystal may occur, but polarization rotation caused by formation of a pseudo cubic crystal is suppressed. In other words, in the piezoelectric thin film 3 in which a part of B-sites is substituted with $Fe^{2+}$ is less likely to have the MPB, and the polarization rotation in which the c-axis direction of the tetragonal crystal varies is less likely to occur.

Due to the above-described mechanism, in the piezoelectric thin film 3 according to the second embodiment, an improvement of the piezoelectric characteristics $(-e_{31,f})$ and a reduction in the permittivity $(\varepsilon_0\varepsilon_r)$ are compatible with each other, and the piezoelectric performance index increases.

In contrast to the piezoelectric thin film 3, in the piezoelectric bulk, crystal structure deformation caused by a stress is less likely to occur. Accordingly, the majority of perovskite type oxide constituting the piezoelectric bulk is a cubic crystal, and it is difficult for the piezoelectric bulk to have piezoelectric properties caused by the tetragonal crystal of the perovskite type oxide.

The thickness Tp of the piezoelectric thin film 3 may be from 500 to 5000 nm. Even in a case where the thickness Tp of the piezoelectric thin film 3 is 500 nm or more and the piezoelectric thin film 3 is thick, an ion located at the B-site of the perovskite type oxide is substituted with $Fe^{2+}$, and thus the piezoelectric thin film 3 can have a large piezoelectric performance index. When the thickness Tp of the piezoelectric thin film 3 is adjusted to 5000 nm or less, the entirety of the piezoelectric thin film 3 is likely to contain a tetragonal crystal without depending on the epitaxial stress, and the piezoelectric thin film 3 is likely to have a large piezoelectric performance index. However, the thickness Tp of the piezoelectric thin film 3 is not limited to the above-described range. A method of measuring the thickness Tp of the piezoelectric thin film 3 is not limited. For example, the thickness Tp of the piezoelectric thin film 3 may be measured by a scanning electron microscope (SEM) on a cross-section of the piezoelectric thin film 3 which is perpendicular to the surface of the piezoelectric thin film 3.

The extent of orientation of the (001) plane of the tetragonal crystal may be quantified by an orientation degree. The greater the orientation degree of the (001) plane of the tetragonal crystal is, the more the piezoelectric thin film 3 is likely to have a large piezoelectric performance index. The orientation degree of the (001) plane of the tetragonal crystal may be calculated on the basis of a peak of diffracted X-rays which is derived from each crystal plane. The peak of the diffracted X-rays which is derived from each crystal plane may be measured through out-of-plane measurement on the surface of the piezoelectric thin film 3. The orientation degree of the (001) plane of the tetragonal crystal in the normal direction dn of the surface of the piezoelectric thin film 3 may be expressed as $100 \times I_{(001)}/\Sigma I_{2(hkl)}$. $\Sigma I_{2(hkl)}$ is a sum of peak intensities of diffracted X-rays of respective crystal planes of the tetragonal crystal which are measured in the out-of-plane direction of the surface of the piezoelectric thin film 3. For example, $\Sigma I_{2(hkl)}$ may be $I_{(001)} + I_{(110)} + I_{(111)}$. $I_{(001)}$ is a peak intensity (maximum intensity) of diffracted X-rays of the (001) plane of the tetragonal crystal which is measured in the out-of-plane direction of the surface of the piezoelectric thin film 3. $I_{(110)}$ is a peak intensity (maximum intensity) of diffracted X-rays of the (110) plane of the tetragonal crystal which is measured in the out-of-plane direction of the surface of the piezoelectric thin film 3. $I_{(111)}$ is a peak intensity (maximum intensity) of diffracted X-rays of the (111) plane of the tetragonal crystal which is measured in the out-of-plane direction of the surface of the piezoelectric thin film 3. The extent of orientation of the (001) plane of the tetragonal crystal may be quantified by an orientation degree F. based on the Lotgering method. Even in a case where the orientation degree is calculated by any of the above-described methods, the orientation degree of the (001) plane of the tetragonal crystal may be from 70% to 100%, preferably from 80% to 100%, and more preferably from 90% to 100%. In other words, the (001) plane of the tetragonal crystal may be oriented in the normal direction dn of the surface of the piezoelectric thin film 3 in preference to other crystal planes of the tetragonal crystal.

The piezoelectric thin film 3 may consist of the tetragonal crystal. As long as the piezoelectric thin film 3 has a large piezoelectric performance index, the piezoelectric thin film 3 may further contain at least one kind of a crystal of the perovskite type oxide selected from the group consisting of a cubic crystal and a rhombohedral crystal in addition to the tetragonal crystal.

As described above, the perovskite type oxide contained in the piezoelectric thin film 3 contains at least $Fe^{2+}$ and $O(O^{2-})$. The perovskite type oxide may contain $Bi(Bi^{3+}, \text{ or } Bi^{3+} \text{ and } Bi^{5+})$, $Fe^{2+}$, $Fe^{3+}$, and $O(O^{2-})$. The perovskite type oxide may contain $Bi(Bi^{3+}, \text{ or } Bi^{3+} \text{ and } Bi^{5+})$, $Fe^{2+}$, $Fe^{3+}$, $Ti(Ti^{4+})$, and $O(O^{2-})$. The perovskite type oxide may contain $Bi(Bi^{3+}, \text{ or } Bi^{3+} \text{ and } Bi^{5+})$, $E^B$, $Fe^{2+}$, $Fe^{3+}$, $Ti(Ti^{4+})$, and $O(O^{2-})$. $E^B$ may be at least one kind of element selected from the group consisting of Mg, Al, Zr, Ti, Ni, and Zn. The perovskite type oxide may contain $Bi(Bi^{3+}, \text{ or } Bi^{3+} \text{ and } Bi^{5+})$, $E^A$, $E^B$, $Fe^{2+}$, $Fe^{3+}$, $Ti(Ti^{4+})$, and $O(O^{2-})$. $E^A$ may be at least one kind of element selected from the group consisting of Na, K, and Ag. In a case where the perovskite type oxide is composed of the above-described elements, the tetragonal crystal in the piezoelectric thin film 3 is likely to have the crystal orientation, and c/a is likely to be within the above-described range. The piezoelectric thin film 3 may consist of $Bi(Bi^{3+}, \text{ or } Bi^{3+} \text{ and } Bi^{5+})$, $E^B$, $Fe^{2+}$, $Fe^{3+}$, $Ti(Ti^{4+})$, and $O(O^{2-})$. The piezoelectric thin film 3 may consist of $Bi(Bi^{3+}, \text{ or } Bi^{3+} \text{ and } Bi^{5+})$, $E^A$, $E^B$, $Fe^{2+}$, $Fe^{3+}$, $Ti(Ti^{4+})$, and $O(O^{2-})$. As long as the piezoelectric thin film 3 has the large piezoelectric performance index, the piezoelectric thin film 3 may further contain other elements in addition to $Bi(Bi^{3+}, \text{ or } Bi^{3+} \text{ and } Bi^{5+})$, $E^A$, $E^B$, $Fe^{2+}$, $Fe^{3+}$, $Ti(Ti^{4+})$, and $O(O^{2-})$. The piezoelectric thin film 3 may not contain Pb. The piezoelectric thin film 3 may contain Pb.

The perovskite type oxide contained in the piezoelectric thin film 3 may be expressed by the following Chemical Formula B1. The following Chemical Formula B1 is substantially the same as the following Chemical Formula B1a.

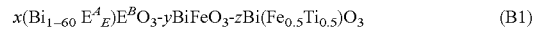

$$x(Bi_{1-\alpha} E^A_\alpha)E^B O_3\text{-}yBiFeO_3\text{-}zBi(Fe_{0.5}Ti_{0.5})O_3 \quad (B1)$$

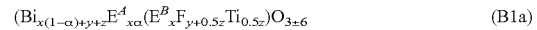

$$(Bi_{x(1-\alpha)+y+z}E^A_{x\alpha}(E^B_x F_{y+0.5z}Ti_{0.5z})O_{3\pm\delta} \quad (B1a)$$

x+y+z in the above-described Chemical Formulae B1 and B1a may be 1.00.

$E^A$ in the above-described Chemical Formulae B1 and B1a may be at least one kind of element selected from the group consisting of Na, K, and Ag. $E^B$ in the above-described Chemical Formulae B1 and B1a may be at least one kind of element selected from the group consisting of Mg, Al, Zr, Ti, Ni, and Zn.

A sum of valences (ionic valences) of $E^A$ constituting $(Bi_{1-\alpha}E^A_\alpha)E^B O_3$ in the above-described Chemical Formula B1 is expressed as $V_A$. A sum of valences (ionic valences) of $E^B$ constituting $(Bi_{1-\alpha}E^A_\alpha)E^B O_3$ is expressed as $V_B$. A sum of the valences of Bi, $E^A$, and $E^B$ which constitute $(Bi_{1-\alpha}E^A_\alpha)E^B O_3$ in Chemical Formula B1 is expressed as $3(1-\alpha)+V_A\alpha+V_B$, or $5(1-\alpha)+V_A\alpha+V_B$. $3(1-\alpha)+V_A\alpha+V_B$, or $5(1-\alpha)+V_A\alpha+V_B$ may be +6 that balances with the sum (−6) of the valence (ionic valence) of O. $3(1-\alpha)+V_A\alpha$, or $5(1-\alpha)+V_A\alpha$ may be +3. $V_B$ may be +3. In a case where the perovskite type oxide contains two kinds of elements ($E^{B1}$ and $E^{B2}$) as $E^B$, the above-described Chemical Formula B1 is substantially the same as the following Chemical Formula B1'. § in the following Chemical Formula B1' may be more than 0.00 and less than 1.00. The valence (ionic valence) of $E^{B1}$ is expressed as $V_{B1}$. The valence (ionic valence) of $E^{B2}$ is expressed as $V_{B2}$. A sum $V_B$ of the valence (ionic valence) of $E^B$ is expressed as $(1-\beta)V_{B1}+\beta V_{B2}$. $(1-\beta)V_{B1}+\beta V_{B2}$ may be +3.

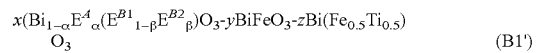

$$x(Bi_{1-\alpha}E^A_\alpha(E^{B1}_{1-\beta}E^{B2}_\beta)O_3\text{-}yBiFeO_3\text{-}zBi(Fe_{0.5}Ti_{0.5})O_3 \quad (B1')$$

$Bi_{x(1-\alpha)+y+z}E^A_{x\alpha}$ in the above-described Chemical Formula B1a are elements located at the A-site of the perovskite structure. $E^{BX}Fe_{y+0.5z}Ti_{0.5}z$ in Chemical Formula B1a are elements located at the B-site of the perovskite structure.

The valence of Fe constituting $yBiFeO_3$ in the above-described Chemical Formulae B1 and B1' is three, but the valence of Fe constituting $zBi(Fe_{0.5}Ti_{0.5})O_3$ in the above-described Chemical Formulae B1 and B1' is two. Accordingly, when a composition of raw materials of the piezoelectric thin film 3 is adjusted so that a molar ratio of each of Bi, $E^A$, $E^B$, Fe, and Ti in the entirety of raw materials of the piezoelectric thin film 3 can match a molar ratio of each of Bi, $E^A$, $E^B$, Fe, and Ti in the above-described Chemical Formulae B1, B1', or B1a, the perovskite type oxide in the piezoelectric thin film 3 can contain $Fe^{2+}$.

x in the above-described Chemical Formulae B1, B1', and B1a may from 0.10 to 0.80. In a case where x is from 0.10 to 0.80, the tetragonal crystal in the piezoelectric thin film 3 is likely to have the above-described crystal orientation, and c/a is likely to be within the above-described range.

y in the above-described Chemical Formulae B1, B1', and B1a may be from 0.10 to 0.85. In a case where y is from 0.10 to 0.85, the tetragonal crystal in the piezoelectric thin film 3 is likely to have the above-described crystal orientation, and c/a is likely to be within the above-described range.

z in the above-described Chemical Formulae B1, B1', and B1a may be from 0.05 to 0.80. In a case where z is from 0.05 to 0.80, the tetragonal crystal in the piezoelectric thin film 3 is likely to have the above-described crystal orientation, and c/a is likely to be within the above-described range.

α in the above-described Chemical Formulae B1, B1', and B1a may be 0.00 or more and less than 1.00. a may be 0.50 from the viewpoint that the tetragonal crystal in the piezoelectric thin film 3 is likely to have the above-described crystal orientation and that c/a is likely to be within the above-described range. As described above, β in the above-described Chemical Formula B1' may be more than 0.00 and less than 1.00. β may be 0.50 from the viewpoint that the tetragonal crystal in the piezoelectric thin film 3 is likely to have the above-described crystal orientation and that c/a is likely to be within the above-described range.

δ in the above-described Chemical Formula B1a may be 0 or more. δ may be a value other than 0 as long as the crystal structure (perovskite structure) of the perovskite type oxide is maintained. For example, δ may be more than 0 and 1.0 or less. For example, δ may be calculated from a valence of each of ions located at the A-site and the B-site in the perovskite structure. The valence of each ion may be measured by X-ray photoelectron spectroscopy (XPS).

A total value of the number of moles of B1 and $E^A$ contained in the perovskite type oxide may be expressed as [A], and a total value of the number of moles of $Fe^{2+}$, $Fe^{3+}$, Ti and $E^B$ contained in the perovskite type oxide may be expressed as [B], and [A]/[B] may be 1.0. As long as the crystal structure (perovskite structure) of the perovskite type oxide is maintained, [A]/[B] may be a value other than 1.0. That is, [A]/[B] may be less than 1.0, and [A]/[B] may be more than 1.0.

For example, an area of the piezoelectric thin film 3 may be from 1 μm² to 500 mm². An area of each of the single crystal substrate 1, the first intermediate layer 5, the first electrode layer 2, the second intermediate layer 6, and the second electrode layer 4 may be the same as the area of the piezoelectric thin film 3.

For example, the composition of the piezoelectric thin film may be analyzed by X-ray fluorescent analysis (XRF method), inductively coupled plasma (ICP) emission spectrometry, and X-ray photoelectron spectroscopy (XPS). The crystal structure and the crystal orientation of the piezoelectric thin film may be specified by X-ray diffraction (XRD) method. The crystal structure and the crystal orientation of the piezoelectric thin film may be a crystal structure and a crystal orientation of the piezoelectric thin film at ordinary temperature.

For example, the piezoelectric thin film 3 may be formed by the following method.

As a raw material of the piezoelectric thin film 3, a target containing all elements common to the piezoelectric thin film 3 may be used. A method of manufacturing the target is as follows.

As raw materials, for example, an oxid of each of Bi, $E^A$, $E^B$, Fe, and Ti may be used. As the raw materials, a substance such as carbonate or oxalate that becomes an oxide through sitnering may be used instead of the oxides. After sufficiently drying the raw materials at 100° C. or higher, the raw materials are weighed so that a molar ratio of each of Bi, $E^A$, $E^B$, Fe, and Ti can match a molar ratio of each element in the above-described Chemical Formula B1, B1', or B1a. In vapor phase growth method to be described later, Bi in the target is more likely to volatilize in compari-son to other elements. Accordingly, the molar ratio of Bi in the target may be adjusted to a value higher than the molar ratio of Bi in the piezoelectric thin film 3. In a case where a raw material containing K is used as $E^A$, K in the target is more likely to volatilize in comparison to other elements. Accordingly, a molar ratio of K in the target may be adjusted to a value higher than a molar ratio of K in the piezoelectric thin film 3.

The weighed raw materials are sufficiently mixed in an organic solvent or water. A mixing time may be from 5 to 20 hours. For example, a mixing mean may be a ball mill. The raw materials after mixing are sufficiently dried, and the raw materials are molded by a pressing equipment. The molded raw materials are calcined to obtain a calcined material. A calcination temperature may be from 750 to 900° C. A calcination time may be from 1 to 3 hours. The calcined material is pulverized in an organic solvent or water. A pulverization time may be from 5 to 30 hours. A pulverization mean may be a ball mill. After drying the pulverized calcined material, the calcined material to which a binder solution is added is granulated to obtain a powder of the calcined material. A block-shaped green compact is obtained by press molding the powder of the calcined material.

The block-shaped green compact is heated to volatilize the binder in the green compact. A heating temperature may be from 400 to 800° C. A heating time may be from 2 to 4 hours.

After volatilization of the binder, the green compact is sintered. A sintering temperature may be from 800 to 1100° C. A sintering time may be from 2 to 4 hours. A temperature raising rate and a temperature lowering rate of the green compact in the sintering process may be, for example, from 50 to 300° C./hour.

Through the above-described process, the target is obtained. For example, an average grain size of crystal grains of the oxide (perovskite type oxide) contained in the target may be from 1 to 20 μm. The target contains $Fe^{3+}$, but the target may not contain $Fe^{2+}$. When reducing a part of $Fe^{3+}$ derived from the target in a process of forming the piezoelectric thin film 3 by the vapor phase growth method to be described later, the piezoelectric thin film 3 containing $Fe^{2+}$ can be obtained.

The piezoelectric thin film 3 may be formed by the vapor phase growth method using the target. In the vapor phase growth method, elements constituting the target are vaporized under a vacuum atmosphere. When the vaporized elements adhere to and are deposited on a surface of any one of the second intermediate layer 6, the first electrode layer 2, and the single crystal substrate 1, thereby growing the piezoelectric thin film 3. For example, the vapor phase growth method may be a sputtering method, an electron beam vapor deposition method, a chemical vapor deposition method, or a pulsed-laser deposition method. Hereinafter, the pulsed-laser deposition method is noted as "PLD method". An excitation source is different depending on the kind of the vapor phase growth method. An excitation source in the sputtering method is Ar plasma. An excitation source in the electron beam vapor deposition method is an electron beam. An excitation source in the PLD method is laser light (for example, an excimer laser). When the target is irradiated with the excitation source, elements constituting the target are vaporized. By using the above-described vapor phase growth methods, the piezoelectric thin film 3 is likely to epitaxially grow. By using the above-described vapor phase growth method, it is possible to form the piezoelectric thin film 3 that is dense in an atomic level, and thus segregation of elements in the piezoelectric thin film 3 is suppressed.

Among the above-described vapor phase growth methods, the PLD method is relatively excellent from the following viewpoints. In the PLD method, elements constituting the target can be instantly and uniformly turned into plasma by using the pulse laser. Accordingly, the piezoelectric thin film 3 in which a molar ratio of each element approximately matches a molar ratio of each element in the target is likely to be formed. In addition, in the PLD method, the thickness of the piezoelectric thin film 3 is easily controlled by changing the number of laser pulses (repetition frequency).

The piezoelectric thin film 3 may be an epitaxial film. That is, the piezoelectric thin film 3 may be formed by epitaxial growth. Due to the epitaxial growth, c/a of the tetragonal crystal is likely to be within the above-described range, and the piezoelectric thin film 3 excellent in anisotropy and crystal orientation is likely to be formed. When the piezoelectric thin film 3 is formed by the PLD method, the piezoelectric thin film 3 is likely to be formed by the epitaxial growth.

In the PLD method, the piezoelectric thin film 3 may be formed while heating the single crystal substrate 1 and the first electrode layer 2 in a vacuum chamber. For example, a temperature (film formation temperature) of the single crystal substrate 1 and the first electrode layer 2 may be from 450 to 600° C. When the film formation temperature is 450° C. or higher, a part of $Fe^{3+}$ derived from the target is likely to be reduced, and the piezoelectric thin film 3 containing $Fe^{2+}$ is likely to be formed. In a case where the film formation temperature is lower than 450° C., $Fe^{3+}$ derived from the target is less likely to be reduced, and the piezoelectric thin film 3 containing $Fe^{2+}$ is less likely to be obtained. As the film formation temperature is high, cleanness of the surface of the single crystal substrate 1 or the first electrode layer 2 is further improved, crystallinity of the piezoelectric thin film 3 becomes higher, and orientation degrees of the crystal planes of the tetragonal crystal are likely to be higher. In a case where the film formation temperature is excessively higher, each element constituting the piezoelectric thin film 3 is excessively reduced, and the piezoelectric thin film 3 having a desired composition is less likely to be obtained. In addition, in a case where the film formation temperature is excessively high, Bi or K is likely to desorb from the piezoelectric thin film 3, and the composition of the piezoelectric thin film 3 is less likely to be controlled.

In the PLD method, for example, an oxygen partial pressure in the vacuum chamber may be from 0.1 to 3.0 Pa, preferably from 0.1 to 1.0 Pa, and more preferably from 0.1 to 0.5 Pa. When the oxygen partial pressure is maintained in the above-described range, a part of $Fe^{3+}$ derived from the target is likely to be reduced, and the piezoelectric thin film 3 containing $Fe^{2+}$ is likely to be formed. In a case where the oxygen partial pressure is excessively low, each element derived from the target is less likely to be sufficiently oxidized, the perovskite type oxide is less likely to be formed, and the orientation degree of the crystal planes of the piezoelectric thin film 3 is likely to decrease. In a case where the oxygen partial pressure is excessively high, $Fe^{3+}$ derived from the target is less likely to be reduced, and the piezoelectric thin film 3 containing $Fe^{2+}$ is less likely to be obtained. In addition, in a case where the oxygen partial pressure is excessively high, a growth rate of the piezoelectric thin film 3 is likely to decrease, and the orientation degree of the crystal planes of the piezoelectric thin film 3 is likely to decrease.

Examples of parameters other than the above-described parameters controlled by the PLD method include a laser oscillation frequency, a distance between the substrate and the target, and the like. The crystal structure, the crystal orientation, and the thickness Tp of the piezoelectric thin film 3 are likely to be controlled through control of the parameters. For example, in a case where a laser oscillation frequency is 10 Hz or less, the orientation degree of the crystal planes of the piezoelectric thin film 3 is likely to be heightened.

After growth of the piezoelectric thin film 3, an annealing treatment (heating treatment) for the piezoelectric thin film 3 may be performed. For example, a temperature (annealing temperature) of the piezoelectric thin film 3 in the annealing treatment may be from 300 to 1000° C., from 600 to 1000° C., or from 850 to 1000° C. The piezoelectric properties of the piezoelectric thin film 3 tend to be further improved through the annealing treatment for the piezoelectric thin film 3. Particularly, the piezoelectric properties of the piezoelectric thin film 3 are likely to be improved through an annealing treatment at from 850 to 1000° C. However, the annealing treatment is not essential. The annealing treatment may be performed in a reductive atmosphere such as a nitrogen gas ($N_2$). Through the annealing treatment in the reductive atmosphere, oxidation of $Fe^{2+}$ in the piezoelectric thin film 3 (generation of $Fe^{3+}$) according to the annealing treatment is suppressed, and $Fe^{2+}$ in the piezoelectric thin film 3 is likely to be maintained.

A growth process of the piezoelectric thin film 3, and in the subsequent temperature lowering process, a compressive stress occurs in the piezoelectric thin film 3. Due to the compressive stress, the piezoelectric thin film 3 is compressed in a direction (the a-axis direction and the b-axis direction) that is approximately parallel to the surface of the piezoelectric thin film 3. As a result, the tetragonal crystal of the perovskite type oxide is formed. For example, the compressive stress is caused by lattice mismatching between the single crystal substrate 1 and the piezoelectric thin film 3, or a difference in a coefficient of expansion between the single crystal substrate 1 and the piezoelectric thin film 3.

For example, the single crystal substrate 1 may be a substrate consisting of a single crystal of Si, or a substrate consisting of a single crystal of a compound semiconductor such as GaAs. The single crystal substrate 1 may be a substrate consisting of a signal crystal of an oxide. For example, the single crystal of the oxide may be MgO or a perovskite type oxide (for example, $SrTiO_3$). For example, the thickness of the single crystal substrate 1 may be from 10 to 1000 μm.

In a case where the single crystal substrate 1 has electrical conductivity, the single crystal substrate 1 functions as an electrode, and thus the first electrode layer 2 may not be provided. For example, the single crystal substrate 1 having the electrical conductivity may be a single crystal of $SrTiO_3$ doped with niobium (Nb).

The crystal orientation of the single crystal substrate 1 may be equal to the normal direction $D_N$ of the surface of the single crystal substrate 1. That is, the surface of the single crystal substrate 1 may be parallel to a crystal plane of the single crystal substrate 1. The single crystal substrate 1 may be a uniaxially oriented substrate. For example, a (100) plane of the single crystal substrate 1 (for example, Si) may be parallel to the surface of the single crystal substrate 1. That is, a [100] direction of the single crystal substrate 1 (for example, Si) may be parallel to the normal direction $D_N$ of the surface of the single crystal substrate 1.

In a case where the (100) plane of the single crystal substrate 1 (for example, Si) is parallel to the surface of the single crystal substrate 1, a (001) plane of a perovskite type oxide (tetragonal crystal) in the piezoelectric thin film 3 is likely to be oriented in the normal direction dn of the surface of the piezoelectric thin film 3.

As described above, the first intermediate layer 5 may be disposed between the single crystal substrate 1 and the first electrode layer 2. For example, the first intermediate layer 5 may contain at least one kind selected from the group consisting of titanium (Ti), chromium (Cr), titanium oxide ($TiO_2$), silicon oxide ($SiO_2$), and zirconium oxide ($ZrO_2$). By interposing the first intermediate layer 5, the first electrode layer 2 is likely to adhere to the single crystal substrate 1. The first intermediate layer 5 may be crystalline. A crystal plane of the first intermediate layer 5 may be oriented in the normal direction $D_N$ of the surface of the single crystal substrate 1. Both the crystal plane of the single crystal substrate 1 and the crystal plane of the first intermediate layer 5 may be oriented in the normal direction $D_N$ of the surface of the single crystal substrate 1. A method of forming the first intermediate layer 5 may be a sputtering method, a vacuum vapor deposition method, a printing method, a spin coating method, or a sol-gel method.

The first intermediate layer 5 may contain $ZrO_2$ and an oxide of a rare-earth element. When the first intermediate layer 5 contains $ZrO_2$ and the oxide of the rare-earth element, the first electrode layer 2 consisting of a platinum crystal is likely to be formed on the surface of the first intermediate layer 5, a (002) plane of the platinum crystal is likely to be oriented in the normal direction of the surface of the first electrode layer 2, and a (200) plane of the platinum crystal is likely to be oriented in an in-plane direction of the surface of the first electrode layer 2. The rare-earth element may be at least one kind selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first intermediate layer 5 may contain $ZrO_2$ and $Y_2O_3$. For example, the first intermediate layer 5 may consist of yttria-stabilized zirconia ($Y_2O_3$ added $ZrO_2$). The first intermediate layer 5 may include a first layer consisting of $ZrO_2$, and a second layer consisting of $Y_2O_3$. The first layer consisting of $ZrO_2$ may be directly stacked on the surface of the single crystal substrate 1. The second layer consisting of $Y_2O_3$ may be directly stacked on a surface of the first layer. The first electrode layer 2 may be directly stacked on a surface of the second layer consisting of $Y_2O_3$. In a case where the first intermediate layer 5 contains $ZrO_2$ and $Y_2O_3$, the piezoelectric thin film 3 is likely to epitaxially grow, and the (001) plane of the tetragonal crystal in the piezoelectric thin film 3 is likely to be preferentially oriented in the normal direction dn of the surface of the piezoelectric thin film 3. In addition, in a case where the first intermediate layer 5 contains $ZrO_2$ and $Y_2O_3$, the first electrode layer 2 consisting of a platinum crystal is likely to be formed on the surface of the first intermediate layer 5, a (002) plane of the platinum crystal is likely to be oriented in a normal direction of the surface of the first electrode layer 2, and a (200) plane of the platinum crystal is likely to be oriented in an in-plane direction of the surface of the first electrode layer 2.

For example, the first electrode layer 2 may consist of at least one kind of metal selected from the group consisting of platinum (Pt), palladium (Pd), rhodium (Rh), gold (Au), ruthenium (Ru), iridium (Ir), molybdenum (Mo), titanium (Ti), tantalum (Ta), and nickel (Ni). For example, the first electrode layer 2 may consist of a conductive metal oxide such as strontium ruthenate ($SrRuO_3$), lanthanum nickelate ($LaNiO_3$), and lanthanum strontium cobaltate ($(La,Sr)CoO_3$). The first electrode layer 2 may be crystalline. A crystal plane of the first electrode layer 2 may be oriented in the normal direction $D_N$ of the single crystal substrate 1. The crystal plane of the first electrode layer 2 may be approximately parallel to the surface of the single crystal substrate 1. Both the crystal plane of the single crystal substrate 1 and the crystal plane of the first electrode layer 2 may be oriented in the normal direction $D_N$ of the single crystal substrate 1. The crystal plane of the first electrode layer 2 which is oriented in the normal direction $D_N$ of the single crystal substrate 1 may be approximately parallel to the (001) plane of the tetragonal crystal in the piezoelectric thin film 3. For example, the thickness of the first electrode layer 2 may be from 1 nm to 1.0 µm. A method of forming the first electrode layer 2 may be a sputtering method, a vacuum vapor deposition method, a printing method, a spin coating method, or a sol-gel method. In the case of the printing method, the spin coating method, or the sol-gel method, a heating treatment (annealing) of the first electrode layer 2 may be performed to raise crystallinity of the first electrode layer 2.

The first electrode layer 2 may contain a platinum crystal. The first electrode layer 2 may consist of the platinum crystal. The platinum crystal is a cubic crystal having a face-centered cubic structure (fcc structure). A (002) plane of the platinum crystal may be oriented in the normal direction of the surface of the first electrode layer 2, and a (200) plane of the platinum crystal may be oriented in an in-plane direction of the surface of the first electrode layer 2. In other words, the (002) plane of the platinum crystal may be approximately parallel to the surface of the first electrode layer 2, and the (200) plane of the platinum crystal may be approximately perpendicular to the surface of the first electrode layer 2. In a case where the (002) plane and the (200) plane of the platinum crystal constituting the first electrode layer 2 have the above-described orientations, the piezoelectric thin film 3 is likely to epitaxially grow on the surface of the first electrode layer 2, and the (001) plane of the tetragonal crystal in the piezoelectric thin film 3 is likely to be preferentially oriented in the normal direction dn of the surface of the piezoelectric thin film 3. The surface of the first electrode layer 2 may be approximately parallel to the surface of the piezoelectric thin film 3. That is, the normal direction of the surface of the first electrode layer 2 may be approximately parallel to the normal direction dn of the surface of the piezoelectric thin film 3.

As described above, the second intermediate layer 6 may be disposed between the first electrode layer 2 and the piezoelectric thin film 3. For example, the second intermediate layer 6 may contain at least one kind selected from the group consisting of $SrRuO_3$, $LaNiO_3$, and $(La,Sr)CoO_3$. For example, $(La,Sr)CoO_3$ may be $La_{0.5}Sr_{0.5}CoO_3$. The second intermediate layer 6 may be crystalline. For example, the second intermediate layer 6 may be a stacked body including at least two kinds of buffer layers selected from the group consisting of a layer containing $SrRuO_3$ crystals, a layer containing $LaNiO_3$ crystals, and a layer containing $(La,Sr)CoO_3$ crystals. Any of $SrRuO_3$, $LaNiO_3$, and $(La,Sr)CoO_3$ has a perovskite structure. Accordingly, in a case where the second intermediate layer 6 contains at least one kind selected from the group consisting of $SrRuO_3$, $LaNiO_3$, and $(La,Sr)CoO_3$, the piezoelectric thin film 3 is likely to epitaxially grow, and the (001) plane of the tetragonal crystal in the piezoelectric thin film 3 is likely to be preferentially oriented in the normal direction dn of the surface of the piezoelectric thin film 3. In addition, by interposing the second intermediate layer 6, the piezoelectric thin film 3 is likely to adhere to the first electrode layer 2. The crystal plane of the second intermediate layer 6 is likely to be oriented in the normal direction $D_N$ of the surface of the single crystal substrate 1. Both the crystal plane of the single crystal substrate 1 and the crystal plane of the second intermediate layer 6 may be oriented in the normal direction $D_N$ of the surface of the single crystal substrate 1. A method of forming the second intermediate layer 6 may be a sputtering method, a vacuum vapor deposition method, a printing method, a spin coating method, or a sol-gel method.

For example, the second electrode layer 4 may consist of at least one kind of metal selected from the group consisting of Pt, Pd, Rh, Au, Ru, Ir, Mo, Ti, Ta, and Ni. For example, the second electrode layer 4 may consist of at least one kind of conductive metal oxide selected from the group consisting of $LaNiO_3$, $SrRuO_3$, $(La,Sr)CoO_3$. The second electrode layer 4 may be crystalline. A crystal plane of the second electrode layer 4 may be oriented in the normal direction $D_N$ of the single crystal substrate 1. The crystal plane of the second electrode layer 4 may be approximately parallel to the surface of the single crystal substrate 1. The crystal plane of the second electrode layer 4 which is oriented in the normal direction $D_N$ of the single crystal substrate 1 may be approximately parallel to the (001) plane of the tetragonal crystal in the piezoelectric thin film 3. For example, the thickness of the second electrode layer 4 may be from 1 nm to 1.0 µm. A method of forming the second electrode layer 4 may be a sputtering method, a vacuum vapor deposition method, a printing method, a spin coating method, or a sol-gel method. In the case of the printing method, the spin coating method, or the sol-gel method, a heating treatment (annealing) of the second electrode layer 4 may be performed to raise crystallinity of the second electrode layer 4.

A third intermediate layer may be disposed between the piezoelectric thin film 3 and the second electrode layer 4. By interposing the third intermediate layer, the second electrode layer 4 is likely to adhere to the piezoelectric thin film 3. A composition, a crystal structure, and a formation method of the third intermediate layer may be the same as in the second intermediate layer.

At least a part or the entirety of the surface of the piezoelectric thin film element 10 may be covered by a protective film. For example, when being covered with the protective film, moisture resistance of the piezoelectric thin film element 10 is improved.

Uses of the piezoelectric thin film element according to the second embodiment are various. For example, the piezoelectric thin film element may be used as a piezoelectric transducer. That is, the piezoelectric transducer according to the second embodiment may include the piezoelectric thin film or the piezoelectric thin film element. For example, the piezoelectric transducer may be an ultrasonic transducer such as an ultrasonic sensor. For example, the piezoelectric thin film element may be a harvester (vibration power generation element). Since the piezoelectric thin film element according to the second embodiment includes the piezoelectric thin film having large $(-e_{31,f})^2/\varepsilon_0\varepsilon_r$, the piezoelectric thin film element is suitable for the ultrasonic transducer or the harvester. The piezoelectric thin film element may be a piezoelectric actuator. The piezoelectric actuator may be used in a head assembly, a head stack assembly, or a hard disk drive. The piezoelectric actuator may be used in a printer head, or an inkjet printer device. The piezoelectric actuator may be a piezoelectric switch. The piezoelectric actuator may be used in haptics. That is, the piezoelectric actuator may be used in various devices for which feedback by skin sensation (tactile sense) is required. For example, the devices for which feedback by skin sensation is required may be a wearable device, a touch pad, a display, or a game controller. The piezoelectric thin film element may be a piezoelectric sensor. For example, the piezoelectric sensor may be a piezoelectric microphone, a gyro sensor, a pressure sensor, a pulse wave sensor, or a shock sensor. The piezoelectric thin film element may be an oscillator or an acoustic multilayer film. The piezoelectric thin film element may be a part or the entirety of micro electro mechanical systems (MEMS), and may be, for example, piezoelectric micromachined ultrasonic transducers (PMUT). Specific examples of products to which the piezoelectric micromachined ultrasonic transducers are applied include a biometric sensor or medical/health care sensor (fingerprint sensor, an ultrasonic type blood vessel authentication sensor, or the like), and a time of flight (ToF) sensor.

FIG. 4 illustrates a schematic cross-section of an ultrasonic transducer 10a including the above-described piezoelectric thin film 3. The cross-section of the ultrasonic transducer 10a is perpendicular to the surface of the piezoelectric thin film 3. The ultrasonic transducer 10a may include substrates 1a and 1b, the first electrode layer 2 provided on the substrates 1a and 1b, the piezoelectric thin film 3 stacked on the first electrode layer 2, and the second electrode layer 4 stacked on the piezoelectric thin film 3. An acoustic cavity 1c may be provided on a downward side of the piezoelectric thin film 3. An ultrasonic wave signal is transmitted or received by bending or vibration of the piezoelectric thin film 3. The first intermediate layer may be interposed between the substrates 1a and 1b and the first electrode layer 2. The second intermediate layer may be interposed between the first electrode layer 2 and the piezoelectric thin film 3.

Examples of Second Invention

The second invention will be described in detail with reference to the following examples and comparative examples. The second invention is not limited to the following examples.

Example B1

When manufacturing a piezoelectric thin film element of Example B1, a single crystal substrate consisting of Si was used. A (100) plane of Si was parallel to a surface of the single crystal substrate. The single crystal substrate had a square shape of 20 mm×20 mm. The thickness of the single crystal substrate was 500 µM.

The crystalline first intermediate layer consisting of $ZrO_2$ and $Y_2O_3$ was formed on the entirety of the surface of the single crystal substrate in a vacuum chamber. The first intermediate layer was formed by a sputtering method. The thickness of the first intermediate layer was 30 nm.

The first electrode layer consisting of a Pt crystal was formed on the entirety of the surface of the first intermediate layer in the vacuum chamber. The first electrode layer was formed by the sputtering method. The thickness of the first electrode layer was 200 nm. A temperature of the single crystal substrate in a process of forming the first electrode layer was maintained at 500° C.

An XRD pattern of the first electrode layer was measured through out-of-plane measurement on the surface of the first electrode layer. An XRD pattern of the first electrode layer was measured by in-plane measurement on the surface of the first electrode layer. In the measurement of the XRD patterns, an X-ray diffraction apparatus (SmartLab) manufactured by Rigaku Corporation was used. Measurement conditions were set so that each peak intensity in the XRD patterns can become higher than the background intensity by at least three digits. A peak of diffracted X-rays of a (002) plane of the Pt crystal was detected through the out-of-plane measurement. That is, the (002) plane of the Pt crystal was oriented in a normal direction of the surface of the first electrode layer. A peak of diffracted X-rays of a (200) plane of the Pt crystal was detected through the in-plane measurement. That is, the (200) plane of the Pt crystal was oriented in an in-plane direction of the surface of the first electrode layer.

A piezoelectric thin film was formed on the entirety of the surface of the first electrode layer in a vacuum chamber. The piezoelectric thin film was formed by a PLD method. The thickness Tp of the piezoelectric thin film was 3000 nm. A temperature (film formation temperature) of the single crystal substrate in a process of forming the piezoelectric thin film was maintained at 500° C. An oxygen partial pressure inside the vacuum chamber in the process of forming the piezoelectric thin film was maintained at 1 Pa. As a raw material of the piezoelectric thin film, a target (a sintered body of a raw material powder) was used. As raw material powders of the target, bismuth oxide, potassium carbonate, titanium oxide, and iron oxide were used. Respective raw materials were weighed and mixed so that a molar ratio of each of Bi, $E^A$, $E^B$, Fe, and Ti in the entirety of the raw material powder can match a molar ratio of each of Bi, $E^A$, $E^B$, Fe, and Ti in the target piezoelectric thin film. The composition of the target piezoelectric thin film was expressed by the following Chemical Formula B1A. That is, in the case of Example Bi, $E^A$ in the following Chemical Formula B1 was K, $E^B$ in the following Chemical Formula B1 was Ti, and α in the following Chemical Formula B1 was 0.5. In the case of Example B1, values of x, y, and z in the following Chemical Formulae B1 and B1 Å were values shown in the following Table 1B.

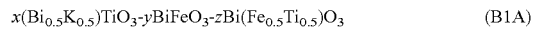

$$x(Bi_{0.5}K_{0.5})TiO_3\text{-}yBiFeO_3\text{-}zBi(Fe_{0.5}Ti_{0.5})O_3 \quad (B1A)$$

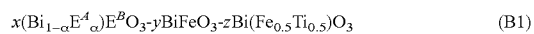

$$x(Bi_{1-\alpha}E^A_\alpha)E^BO_3\text{-}yBiFeO_3\text{-}zBi(Fe_{0.5}Ti_{0.5})O_3 \quad (B1)$$

The composition of the piezoelectric thin film was analyzed by an XRF method. In the analysis, a device PW2404 manufactured by Koninklijke Philips N.V. was used. From results of the analysis, the composition of the piezoelectric thin film in Example B1 approximately matched the composition of the target expressed by the above-described Chemical Formula B1A.

An XRD pattern of the piezoelectric thin film was measured through out-of-plane measurement on a surface of the piezoelectric thin film by using the X-ray diffraction apparatus. In addition, an XRD pattern of the piezoelectric thin film was measured by in-plane measurement on the surface of the piezoelectric thin film.

Measurement conditions were set so that each peak intensity in the XRD patterns can become higher than the background intensity by at least three digits. The measurement apparatus and the measurement conditions of the XRD patterns were the same as described above.

Results of the analysis of the piezoelectric thin film based on the above XRD method showed that the piezoelectric thin film had following characteristics.

The piezoelectric thin film consisted of a tetragonal crystal of a perovskite type oxide.

A (001) plane of the tetragonal crystal was preferentially oriented in the normal direction of the surface of the piezoelectric thin film. That is, an orientation degree of the (001) plane of the tetragonal crystal in the normal direction of the surface of the piezoelectric thin film was 90% or more. As described above, the orientation degree of the (001) plane of the tetragonal crystal is expressed as $100 \times I_{(001)}/(I_{(001)}+I_{(110)}+I_{(111)})$. c/a of the tetragonal crystal was a value shown in the following Table 1B.

A stacked body including the single crystal substrate, the first intermediate layer stacked on the single crystal substrate, the first electrode layer stacked on the first intermediate layer, and the piezoelectric thin film stacked on the first electrode layer was manufactured by the above-described method. The following process was further performed by using the stacked body.

A second electrode layer consisting of Pt was formed on the entirety of the surface of the piezoelectric thin film in a vacuum chamber. The second electrode layer was formed by the sputtering method. A temperature of the single crystal substrate in a process of forming the second electrode layer was maintained at 500° C. The thickness of the second electrode layer was 200 nm.

Through the above-described processes, a stacked body including the single crystal substrate, the first intermediate layer stacked on the single crystal substrate, the first electrode layer stacked on the first intermediate layer, the piezoelectric thin film stacked on the first electrode layer, and the second electrode layer stacked on the piezoelectric thin film was manufactured. Patterning of a stacked structure on the single crystal substrate was performed by the subsequent photolithography. After the patterning, the stacked body was cut through dicing.

A piezoelectric thin film element having a rectangular shape in Example B1 was obtained by the above-described processes. The piezoelectric thin film element included the single crystal substrate, the first intermediate layer stacked on the single crystal substrate, the first electrode layer stacked on the first intermediate layer, the piezoelectric thin film stacked on the first electrode layer, and the second electrode layer stacked on the piezoelectric thin film. An area of a movable part of the piezoelectric thin film was 20 mm×1.0 mm.

<Evaluation of Piezoelectric Properties>

Piezoelectric properties of the piezoelectric thin film were evaluated by the following method.

[Measurement of Residual Polarization]

A polarization hysteresis of the piezoelectric thin film was measured. In the measurement, a device in which an atomic force microscope (AFM) and a ferroelectric evaluation system are combined was used. The atomic force microscope was SPA-400 manufactured by Seiko Instruments Inc. The ferroelectric evaluation system was FCE manufactured by TOYO Corporation. A frequency of an AC voltage in the hysteresis measurement was 5 Hz. In the measurement, a maximum value of a voltage applied to the piezoelectric thin film was 20 V. Residual polarization Pr of the piezoelectric thin film is shown in the following Table 1B. A unit of the residual polarization Pr is µC/cm².

[Calculation of Relative Permittivity]

Electrostatic capacitance C of the piezoelectric thin film element was measured. Details of measurement of the electrostatic capacitance C were as follows.

Measurement apparatus: Impedance Gain-Phase Analyzer 4194 Å manufactured by Hewlett Packard Enterprise Development LP.
  Frequency: 10 kHz
  Electric field: 0.1 V/µm Relative permittivity $\varepsilon_r$ was calculated from a measurement value of the electrostatic capacitance C on the basis of the following Mathematical Formula A. $\varepsilon_r$ of Example B1 is shown in the following Table 1B.

$$C = \varepsilon_0 \times \varepsilon_r \times (S/d) \quad (A)$$

$\varepsilon_0$ in Mathematical Formula A is a permittivity (8.854× $10^{-12}$ Fm$^{-1}$) of vacuum. S in Mathematical Formula A is an area of the surface of the piezoelectric thin film. S can be referred to as an area of the first electrode layer stacked on the piezoelectric thin film. d in Mathematical Formula A is the thickness of the piezoelectric thin film.

[Measurement of Piezoelectric Constant $-e_{31,f}$]

In order to measure the piezoelectric constant $-e_{31,f}$ of the piezoelectric thin film, as the piezoelectric thin film element, a sample (cantilever) having a rectangular shape was manufactured. Dimensions of the sample were 3 mm (width)×15 mm (length). The sample was the same as the piezoelectric thin film element of the above-described Example B1 except for the dimensions. In measurement, a self-made evaluation system was used. One end of the sample was fixed, and the other end of the sample was a free end. A displacement amount of the free end of the sample was measured with a laser while applying a voltage to the piezoelectric thin film in the sample. In addition, the piezoelectric constant $-e_{31,f}$ was calculated from the following Mathematical Formula B. Note that, $E_s$ in Mathematical Formula B is a Young's modulus of the single crystal substrate. $h_s$ is the thickness of the single crystal substrate. L is a length of the sample (cantilever). $v_s$ is a Poisson's ratio of the single crystal substrate. $\delta_{out}$ is an output displacement based on the measured displacement amount. $V_{in}$ is a voltage applied to the piezoelectric thin film. A frequency of an AC electric field (AC voltage) in measurement of the piezoelectric constant $-e_{31,f}$ was 100 Hz. A maximum value of the voltage applied to the piezoelectric thin film was 50 V. A unit of $-e_{31,f}$ is C/m$^2$. $-e_{31,f}$ in Example B1 is shown in the following Table 1B. $(-e_{31,f})^2/\varepsilon_r$ (piezoelectric performance index) in Example B1 is shown in the following Table 1B.

$$-e_{31,f} = \frac{E_s h_s^2}{3L^2(1-v_s)} \cdot \frac{\delta_{out}}{V_{in}} \quad (B)$$

Examples B2 to B8, and Comparative Examples B1, B2, and B7

A composition of a target used in formation of a piezoelectric thin film of each of Examples B2 to B8, and Comparative Examples B1, B2, and B7 was different from the composition of the target in Example B1.

In the case of Example B2, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1B. In the case of Example B2, $E^A$ in the following Chemical Formula B1 was K, $E^B$ in the following Chemical Formula B1 was Zn and Ti, and $\alpha$ in the following Chemical Formula B1 was 0.5. In the case of Example B2, x, y, and z in the following Chemical Formulae B1 and B1B were values shown in the following Table 1B.

$$x(Bi_{0.5}K_{0.5})(Zn_{0.5}Ti_{0.5})O_3\text{-}yBiFeO_3\text{-}zBi(Fe_{0.5}Ti_{0.5})O_3 \quad (B1B)$$

$$x(Bi_{1-\alpha}E^A{}_\alpha)E^BO_3\text{-}yBiFeO_3\text{-}zBi(Fe_{0.5}Ti_{0.5})O_3 \quad (B1)$$

In the case of Example B3, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1C. In the case of Example B3, the target did not contain $E^A$, and $\alpha$ in the following Chemical Formula B1 was 0.0. In the case of Example B3, $E^B$ in the following Chemical Formula B1 was Mg and Ti, and x, y, and z in the following Chemical Formulae B1 and B1C were values shown in the following Table 1B.

$$x Bi(Mg_{0.5}Ti_{0.5})O_3\text{-}yBiFeO_3\text{-}zBi(Fe_{0.5}Ti_{0.5})O_3 \quad (B1C)$$

$$x(Bi_{1-\alpha}E^A{}_\alpha)E^BO_3\text{-}yBiFeO_3\text{-}zBi(Fe_{0.5}Ti_{0.5})O_3 \quad (B1)$$

In the case of Example B4, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1D. In the case of Example B4, the target did not contain $E^A$, and $\alpha$ in the following Chemical Formula B1 was 0.0. In the case of Example B4, $E^B$ in the following Chemical Formula B1 was Zn and Zr, and x, y, and z in the following Chemical Formulae B1 and B1D were values shown in the following Table 1B.

$$x Bi(Zn_{0.5}Zr_{0.5})O_3\text{-}yBiFeO_3\text{-}zBi(Fe_{0.5}Ti_{0.5})O_3 \quad (B1D)$$

$$x(Bi_{1-\alpha}E^A{}_\alpha)E^BO_3\text{-}yBiFeO_3\text{-}zBi(Fe_{0.5}Ti_{0.5})O_3 \quad (B1)$$

In the case of Example B5, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1E. In the case of Example B5, the target did not contain $E^A$, and $\alpha$ in the following Chemical Formula B1 was 0.0. In the case of Example B5, $E^B$ in the following Chemical Formula B1 was Al, and x, y, and z in the following Chemical Formulae B1 and B1E were values shown in the following Table 1B.

$$x BiAlO_3\text{-}yBiFeO_3\text{-}zBi(Fe_{0.5}Ti_{0.5})O_3 \quad (B1E)$$

$$x(Bi_{1-\alpha}E^A{}_\alpha)E^BO_3\text{-}yBiFeO_3\text{-}zBi(Fe_{0.5}Ti_{0.5})O_3 \quad (B1)$$

In the case of Example B6, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1F. In the case of Example B6, $E^A$ in the following Chemical Formula B1 was Ag, $E^B$ in the following Chemical Formula B1 was Ti, $\alpha$ in the following Chemical Formula B1 was 0.5, and x, y, and z in the following Chemical Formulae B1 and B1F were values shown in the following Table 1B.

$$x Bi_{0.5}Ag_{0.5}TiO_3\text{-}yBiFeO_3\text{-}zBi(Fe_{0.5}Ti_{0.5})O_3 \quad (B1F)$$

$$x(Bi_{1-\alpha}E^A{}_\alpha)E^BO_3\text{-}yBiFeO_3\text{-}zBi(Fe_{0.5}Ti_{0.5})O_3 \quad (B1)$$

In the case of Example B7, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1G. In the case of Example B7, $E^A$ in the following Chemical Formula B1 was Ag, $E^B$ in the following Chemical Formula B1 was Ni and Ti, $\alpha$ in the following Chemical Formula B1 was 0.5, and x, y, and z in the following Chemical Formulae B1 and B1G were values shown in the following Table 1B.

$x\text{Bi}_{0.5}\text{Ag}_{0.5}\text{Ni}_{0.5}\text{Ti}_{0.5}\text{O}_3\text{-}y\text{BiFeO}_3\text{-}z\text{Bi}(\text{Fe}_{0.5}\text{Ti}_{0.5})\text{O}_3$ (B1G)

$x(\text{Bi}_{1-\alpha}\text{E}^A{}_\alpha)\text{E}^B\text{O}_3\text{-}y\text{BiFeO}_3\text{-}z\text{Bi}(\text{Fe}_{0.5}\text{Ti}_{0.5})\text{O}_3$ (B1)

In the case of Example B8, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1H. In the case of Example B8, $E^A$ in the following Chemical Formula B1 was Na, $E^B$ in the following Chemical Formula B1 was Zr, $\alpha$ in the following Chemical Formula B1 was 0.5, and x, y, and z in the following Chemical Formulae B1 and B1H were values shown in the following Table 1B.

$x\text{Bi}_{0.5}\text{Na}_{0.5}\text{ZrO}_3\text{-}y\text{BiFeO}_3\text{-}z\text{Bi}(\text{Fe}_{0.5}\text{Ti}_{0.5})\text{O}_3$ (B1H)

$x(\text{Bi}_{1-\alpha}\text{E}^A{}_\alpha)\text{E}^B\text{O}_3\text{-}y\text{BiFeO}_3\text{-}z\text{Bi}(\text{Fe}_{0.5}\text{Ti}_{0.5})\text{O}_3$ (B1)

In the case of Comparative Example B1, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1I. In the case of Comparative Example Bi, $E^A$ in the following Chemical Formula B1 was K, $E^B$ in the following Chemical Formula B1 was Zn and Ti, $\alpha$ in the following Chemical Formula B1 was 0.5, and x, y, and z in the following Chemical Formulae B1 and B1I were values shown in the following Table 1B.

$x(\text{Bi}_{0.5}\text{K}_{0.5})(\text{Zn}_{0.5}\text{Ti}_{0.5})\text{O}_3\text{-}y\text{BiFeO}_3\text{-}z\text{Bi}(\text{Fe}_{0.5}\text{Ti}_{0.5})\text{O}_3$ (B1I)

$x(\text{Bi}_{1-\alpha}\text{E}^A{}_\alpha)\text{E}^B\text{O}_3\text{-}y\text{BiFeO}_3\text{-}z\text{Bi}(\text{Fe}_{0.5}\text{Ti}_{0.5})\text{O}_3$ (B1)

In the case of Comparative Example B2, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1J. In the case of Comparative Example B2, $E^A$ in the following Chemical Formula B1 was Na, $E^B$ in the following Chemical Formula B1 was Ti, $\alpha$ in the following Chemical Formula B1 was 0.5, and x, y, and z in the following Chemical Formulae B1 and B1J were values shown in the following Table 1B.

$x(\text{Bi}_{0.5}\text{Na}_{0.5})\text{TiO}_3\text{-}y\text{BiFeO}_3\text{-}z\text{Bi}(\text{Fe}_{0.5}\text{Ti}_{0.5})\text{O}_3$ (B1J)

$x(\text{Bi}_{1-\alpha}\text{E}^A{}_\alpha)\text{E}^B\text{O}_3\text{-}y\text{BiFeO}_3\text{-}z\text{Bi}(\text{Fe}_{0.5}\text{Ti}_{0.5})\text{O}_3$ (B1)

A composition of a target of Comparative Example B7 was $\text{BiFeO}_3$. That is, in the case of Comparative Example B7, a, x, and z in the following Chemical Formula B1 was 0.0.

$x(\text{Bi}_{1-\alpha}\text{E}^A{}_\alpha)\text{E}^B\text{O}_3\text{-}y\text{BiFeO}_3\text{-}z\text{Bi}(\text{Fe}_{0.5}\text{Ti}_{0.5})\text{O}_3$ (B1)

A piezoelectric thin film element of each of Examples B2 to B8, and Comparative Examples B1, B2, and B7 was manufactured by the same method as in Example B1 except that a composition of a target used in formation of the piezoelectric thin film is different.

An XRD pattern of the first electrode layer of each of Examples B2 to B8 and Comparative Examples B1, B2, and B7 was measured by the same method as in Example B1. Even in any case of Examples B2 to B8 and Comparative Examples B1, B2, and B7, a (002) plane of the Pt crystal constituting the first electrode layer was oriented in the normal direction of the surface of the first electrode layer, and a (200) plane of the Pt crystal was oriented in the in-plane direction of the surface of the first electrode layer.

The composition of the piezoelectric thin film of each of Examples B2 to B8, and Comparative Examples B1, B2, and B7 was analyzed by the same method as in Example B1. Even in any case of Examples B2 to B8, and Comparative Examples B1, B2, and B7, the composition of the piezoelectric thin film approximately matched the composition of the target.

Analysis of the piezoelectric thin film of each of Examples B2 to B8, and Comparative Examples B1, B2, and B7 was performed on the basis of the XRD method by the same method as in Example B1.

Even in any case of Examples B2 to B8 and Comparative Examples B1 and B2, the piezoelectric thin film had the following characteristics.

The piezoelectric thin film consisted of a tetragonal crystal of a perovskite type oxide.

A (001) plane of the tetragonal crystal was preferentially oriented in the normal direction of the surface of the piezoelectric thin film. That is, an orientation degree of the (001) plane of the tetragonal crystal in the normal direction of the surface of the piezoelectric thin film was 90% or more.

The piezoelectric thin film of Comparative Example B7 contained a cubic crystal of the perovskite type oxide, but did not contain a tetragonal crystal of the perovskite type oxide.

c/a of each of Examples B2 to B8, and Comparative Examples B1, B2, and B7 is shown in the following Table 1B.

Piezoelectric properties of the piezoelectric thin film of each of Examples B2 to B8, and Comparative Examples B1, B2, and B7 were evaluated by the same method as in Example B1.

Pr of each of Examples B2 to B8, and Comparative Examples B1, B2, and B7 is shown in the following Table 1B.

$\varepsilon_r$ of each of Examples B2 to B8, and Comparative Examples B1, B2, and B7 is shown in the following Table 1B.

$-e_{31,f}$ of each of Examples B2 to B8, and Comparative Examples B1, B2, and B7 is shown in the following Table 1B.

$(-e_{31,f})/\varepsilon_0\varepsilon_r$ of each of Examples B2 to B8, and Comparative Examples B1, B2, and B7 is shown in the following Table 1B.

TABLE 1B

Table 1B

| | $E^A$ | $E^B$ | α | x | y | z | Oriented plane | Pr | $\varepsilon_r$ | $-e_{31,f}$ | $(-e_{31,f})^2/\varepsilon_0\varepsilon_r$ | c/a |
|---|---|---|---|---|---|---|---|---|---|---|---|---|
| Unit | — | — | — | — | — | — | — | μC/cm² | — | C/m² | GPa | — |
| Example B1 | K | Ti | 0.5 | 0.20 | 0.60 | 0.20 | (001) | 88 | 115 | 7.3 | 52.3 | 1.170 |
| Example B2 | K | Zn, Ti | 0.5 | 0.35 | 0.50 | 0.15 | (001) | 102 | 93 | 7.5 | 68.3 | 1.248 |

TABLE 1B-continued

Table 1B

| Unit | $E^A$ | $E^B$ | α | x | y | z | Oriented plane | Pr μC/cm² | $\varepsilon_r$ | $-e_{31,f}$ C/m² | $(-e_{31,f})^2/\varepsilon_0\varepsilon_r$ GPa | c/a |
|---|---|---|---|---|---|---|---|---|---|---|---|---|
| Example B3 | — | Mg, Ti | 0.0 | 0.10 | 0.10 | 0.80 | (001) | 96 | 98 | 6.9 | 54.9 | 1.163 |
| Example B4 | — | Zn, Zr | 0.0 | 0.10 | 0.30 | 0.60 | (001) | 84 | 110 | 6.7 | 46.1 | 1.194 |
| Example B5 | — | Al | 0.5 | 0.40 | 0.30 | 0.30 | (001) | 91 | 101 | 7.3 | 59.6 | 1.050 |
| Example B6 | Ag | Ti | 0.5 | 0.10 | 0.85 | 0.05 | (001) | 93 | 102 | 7.5 | 62.3 | 1.066 |
| Example B7 | Ag | Ni, Ti | 0.5 | 0.20 | 0.70 | 0.10 | (001) | 95 | 94 | 6.9 | 57.2 | 1.111 |
| Example B8 | Na | Zr | 0.5 | 0.80 | 0.10 | 0.10 | (001) | 80 | 105 | 6.5 | 45.4 | 1.082 |
| Comparative Example B1 | K | Zn, Ti | 0.5 | 0.05 | 0.05 | 0.90 | (001) | 20 | 300 | 1.8 | 1.2 | 1.013 |
| Comparative Example B2 | Na | Ti | 0.5 | 0.90 | 0.05 | 0.05 | (001) | 40 | 150 | 2.2 | 3.6 | 1.037 |
| Comparative Example B7 | — | — | 0.0 | 0.00 | 1.00 | 0.00 | (001) | 60 | 125 | 3.5 | 11.1 | 1.000 |

Comparative Example B3

An oxygen partial pressure in the vacuum chamber in a process of forming a piezoelectric thin film of Comparative Example B3 was maintained at 0.01 Pa.

A piezoelectric thin film element of Comparative Example B3 was manufactured by the same method as in Example B2 except for the oxygen partial pressure in the process of forming the piezoelectric thin film.

An XRD pattern of the first electrode layer of Comparative Example B3 was measured by the same method as in Example B1. In the case of Comparative Example B3, a (002) plane of the Pt crystal constituting the first electrode layer was oriented in the normal direction of the surface of the first electrode layer, and a (200) plane of the Pt crystal was oriented in the in-plane direction of the surface of the first electrode layer.

A composition of the piezoelectric thin film of Comparative Example B3 was analyzed by the same method as in Example B1. In the case of Comparative Example B3, the composition of the piezoelectric thin film did not match the composition of the target in a content of oxygen.

Analysis of the piezoelectric thin film of Comparative Example B3 was performed on the basis of the XRD method by the same method as in Example B1. Since the piezoelectric thin film of Comparative Example B3 did not have crystallinity and a crystal orientation, c/a of Comparative Example B3 could not be specified.

Piezoelectric properties of the piezoelectric thin film of Comparative Example B3 were evaluated by the same method as in Example B1.

Pr of Comparative Example B3 is shown in the following Table 2B.

$\varepsilon_r$ of Comparative Example B3 is shown in the following Table 2B.

$-e_{31,f}$ of Comparative Example B3 is shown in the following Table 2B.

$(-e_{31,f})/\varepsilon_0\varepsilon_r$ of Comparative Example B3 is shown in the following Table 2B.

TABLE 2B

Table 2B

| Unit | $E^A$ | $E^B$ | α | x | y | z | Oriented plane | Pr μC/cm² | $\varepsilon_r$ | $-e_{31,f}$ C/m2 | $(-e_{31,f})^2/\varepsilon_0\varepsilon_r$ GPa | c/a |
|---|---|---|---|---|---|---|---|---|---|---|---|---|
| Example B2 | K | Zn, Ti | 0.5 | 0.35 | 0.50 | 0.15 | (001) | 102 | 93 | 7.5 | 68.3 | 1.248 |
| Comparative Example B3 | K | Zn, Ti | 0.5 | 0.35 | 0.50 | 0.15 | None | 36 | 358 | 1.0 | 0.3 | — |

Examples B9 and B10, and Comparative Examples B4 and B5

In the case of Examples B9 and B10, the thickness Tp of the piezoelectric thin film 3 was controlled to a value shown in the following Table 3B by changing the number of laser pulses (repetition frequency) in the PLD method. A piezoelectric thin film element of each of Examples B9 and B10 was manufactured by the same method as in Example B2 except for the thickness Tp of the piezoelectric thin film 3.

In the case of Comparative Examples B4 and B5, respective raw materials were weighed and mixed so that a molar ratio of each of Bi, $E^A$, $E^B$, Fe, and Ti in the entirety of the raw material powder of the target can match a molar ratio of each of Bi, $E^A$, $E^B$, Fe, and Ti in the following Chemical Formula B1K. In the case of Comparative Examples B4 and B5, $E^A$ in the following Chemical Formula B1 was K, $E^B$ in the following Chemical Formula B1 was Zn and Ti, α in the following Chemical Formula B1 was 0.5, x and y in the following Chemical Formulae B1 and B1K were values shown in the following Table 3B, and z in the following Chemical Formula B1 was zero.

$x(Bi_{0.5}K_{0.5})(Zn_{0.5}Ti_{0.5})O_3\text{-}yBiFeO_3$ (B1K)

$x(Bi_{1-\alpha}E^A_{\alpha})E^BO_3\text{-}yBiFeO_3\text{-}zBi(Fe_{0.5}Ti_{0.5})O_3$ (B1)

In the case of Comparative Examples B4 and B5, the thickness Tp of the piezoelectric thin film 3 was controlled to a value shown in the following Table 3B by changing the number of laser pulses (repetition frequency) in the PLD method.

A piezoelectric thin film element of each of Comparative Examples B4 and B5 was manufactured by the same method as in Example B2 except for the composition of the target and the thickness Tp of the piezoelectric thin film.

An XRD pattern of the first electrode layer of each of Examples B9 and B10 and Comparative Examples B4 and B5 was measured by the same method as in Example B1. Even in any case of Examples B9 and B10 and Comparative Examples B4 and B5, a (002) plane of the Pt crystal constituting the first electrode layer was oriented in the normal direction of the surface of the first electrode layer, and a (200) plane of the Pt crystal was oriented in the in-plane direction of the surface of the first electrode layer.

The composition of the piezoelectric thin film of each of Examples B9 and B10 and Comparative Examples B4 and B5 was analyzed by the same method as in Example B1. Even in any case of Examples B9 and B10 and Comparative Examples B4 and B5, the composition of the piezoelectric thin film approximately matched the composition of the target.

Analysis of the piezoelectric thin film of each of Examples B9 and B10 and Comparative Examples B4 and B5 was performed on the basis of the XRD method by the same method as in Example B1.

Even in any case of Examples B9 and B10 and Comparative Example B5, the piezoelectric thin film had following characteristics.

The piezoelectric thin film consisted of a tetragonal crystal of a perovskite type oxide.

A (001) plane of the tetragonal crystal was preferentially oriented in the normal direction of the surface of the piezoelectric thin film. That is, an orientation degree of the (001) plane of the tetragonal crystal in the normal direction of the surface of the piezoelectric thin film was 90% or more.

The piezoelectric thin film of Comparative Example B4 contained a cubic crystal of the perovskite type oxide, but did not contain a tetragonal crystal of the perovskite type oxide.

c/a of each of Examples B9 and B10 and Comparative Examples B4 and B5 is shown in the following Table 3B.

A photoelectron spectrum of the piezoelectric thin film of Example B2 was measured by the XPS method. A horizontal axis of the photoelectron spectrum represents binding energy (unit: eV) of a photoelectron, and a vertical axis of the photoelectron spectrum represents an intensity (unit: arbitrary unit) of the photoelectron. The photoelectron spectrum of the piezoelectric thin film of Example B2 included a peak of a photoelectron derived from Fe.

Binding energy of a photoelectron derived from $Fe^{2+}$ is close to binding energy of a photoelectron derived from $Fe^{3+}$. Accordingly, in a case where the piezoelectric thin film contains both $Fe^{2+}$ and $Fe^{3+}$, a peak of photoelectrons of iron in the photoelectron spectrum is a superimposition of the peak of photoelectrons of $Fe^{2+}$ ($Fe^{2+}$ peak) and the peak of photoelectrons of $Fe^{3+}$ ($Fe^{3+}$ peak), and thus it is difficult to individually measure the $Fe^{2+}$ peak and the $Fe^{3+}$ peak. Here, the $Fe^{2+}$ peak was approximated by a Gaussian function g1. The $Fe^{3+}$ peak was approximated by another Gaussian function g2. The measured peak of photoelectrons of iron was approximated by g1+g2. Curve fitting of the measured peak of photoelectrons of iron and g1+g2 was performed.

An area S1 of the $Fe^{2+}$ peak was calculated by integration of g1 after the curve fitting. An area S2 of the $Fe^{3+}$ peak was calculated by integration of g2 after the curve fitting. $<Fe^{2+}>$ was calculated from Si and S2 on the basis of the following Mathematical Formula C. S1 is approximately proportional to a content (unit: atomic %) of $Fe^{2+}$ in the piezoelectric thin film. S2 is approximately proportional to a content (unit: atomic %) of $Fe^{3+}$ in the piezoelectric thin film. Accordingly, $<Fe^{2+}>$ may be regarded as a ratio (unit: atomic %) of the content of $Fe^{2+}$ to the sum of the contents of $Fe^{2+}$ and $Fe^{3+}$ in the piezoelectric thin film.

$$<Fe^{2+}>=100\times S1/(S1+S2) \quad (C)$$

$<Fe^{2+}>$ of each of Examples B9 and B10 and Comparative Examples B4 and B5 was calculated by the same method as in Example B2. $<Fe^{2+}>$ of each of Examples B2, B9 and B10 and Comparative Examples B4 and B5 is shown in the following Table 3B.

Piezoelectric properties of the piezoelectric thin film of each of Examples B9 and B10 and Comparative Examples B4 and B5 were evaluated by the same method as in Example B1.

Pr of each of Examples B9 and B10 and Comparative Examples B4 and B5 is shown in the following Table 3B.

$\varepsilon_r$ of each of Examples B9 and B10 and Comparative Examples B4 and B5 is shown in the following Table 3B.

$-e_{31,f}$ of each of Examples B9 and B10 and Comparative Examples B4 and B5 is shown in the following Table 3B.

$(-e_{31,f})^2/\varepsilon_0\varepsilon_r$ of each of Examples B9 and B10 and Comparative Examples B4 and B5 is shown in the following Table 3B.

TABLE 3B

| Unit | $E^A$ | $E^B$ | α | x | y | z | Oriented plane | Tp nm | $<Fe^{2+}>$ Atomic % | Pr μC/cm² | $\varepsilon_r$ | $-e_{31,f}$ C/m² | $(-e_{31,f})^2/\varepsilon_0\varepsilon_r$ GPa | c/a |
|---|---|---|---|---|---|---|---|---|---|---|---|---|---|---|
| Example B2 | K | Zn, Ti | 0.5 | 0.35 | 0.50 | 0.15 | (001) | 3000 | 7.5 | 102 | 93 | 7.5 | 68.3 | 1.248 |
| Example B9 | K | Zn, Ti | 0.5 | 0.35 | 0.50 | 0.15 | (001) | 1500 | 7.5 | 102 | 93 | 7.5 | 68.3 | 1.248 |
| Example B10 | K | Zn, Ti | 0.5 | 0.35 | 0.50 | 0.15 | (001) | 500 | 7.5 | 102 | 93 | 7.5 | 68.3 | 1.248 |
| Comparative Example B4 | K | Zn, Ti | 0.5 | 0.50 | 0.50 | 0.00 | (001) | 1000 | 0.0 | 46 | 302 | 2.1 | 1.6 | 1.000 |
| Comparative Example B5 | K | Zn, Ti | 0.5 | 0.50 | 0.50 | 0.00 | (001) | 300 | 0.0 | 46 | 302 | 2.1 | 1.6 | 1.230 |

Examples B11 and B12, and Comparative Example B6

In the case of Examples B11 and B12, and Comparative Example B6, the second intermediate layer was formed on the entirety of the surface of the first electrode layer, and the piezoelectric thin film was formed on the entirety of the surface of the second intermediate layer.

The second intermediate layer of Example B11 consisted of crystalline $SrRuO_3$. The thickness of the second intermediate layer of Example B11 was 50 nm. "SRO" in the following Table 4B represents $SrRuO_3$.

The second intermediate layer of Example B12 consisted of crystalline $LaNiO_3$. The thickness of the second intermediate layer of Example B12 was 50 nm. "LNO" in the following Table 4B represents $LaNiO_3$.

The second intermediate layer of Comparative Example B6 consisted of crystalline $Fe_3O_4$. The thickness of the second intermediate layer of Comparative Example B6 was 50 nm. "FO" in the following Table 4B represents $Fe_3O_4$.

A piezoelectric thin film element of each of Examples B11 and B12, and Comparative Example B6 was manufactured by the same method as in Example B2 except that the second intermediate layer was formed.

An XRD pattern of the first electrode layer of each of Examples B11 and B12, and Comparative Example B6 was measured by the same method as in Example B1. Even in any case of Examples B11 and B12, and Comparative Example B6, a (002) plane of the Pt crystal constituting the first electrode layer was oriented in the normal direction of the surface of the first electrode layer, and a (200) plane of the Pt crystal was oriented in the in-plane direction of the surface of the first electrode layer.

The composition of the piezoelectric thin film of each of Examples B11 and B12, and Comparative Example B6 was analyzed by the same method as in Example B1. Even in any case of Examples B11 and B12, and Comparative Example B6, the composition of the piezoelectric thin film approximately matched the composition of the target.

Analysis of the piezoelectric thin film of each of Examples B11 and B12, and Comparative Example B6 was performed on the basis of the XRD method by the same method as in Example B1. Even in any case of Examples B11 and B12, and Comparative Example B6, the piezoelectric thin film had following characteristics.

The piezoelectric thin film consisted of a tetragonal crystal of a perovskite type oxide.

A (001) plane of the tetragonal crystal was preferentially oriented in the normal direction of the surface of the piezoelectric thin film. That is, an orientation degree of the (001) plane of the tetragonal crystal in the normal direction of the surface of the piezoelectric thin film was 90% or more.

c/a of each of Examples B11 and B12, and Comparative Example B6 is shown in the following Table 4B.

Piezoelectric properties of the piezoelectric thin film of each of Examples B11 and B12, and Comparative Example B6 were evaluated by the same method as in Example B1.

Pr of each of Examples B11 and B12, and Comparative Example B6 is shown in the following Table 4B.

$\varepsilon_r$ of each of Examples B11 and B12, and Comparative Example B6 is shown in the following Table 4B.

$-e_{31,f}$ of each of Examples B11 and B12, and Comparative Example B6 is shown in the following Table 4B.

$(-e_{31,f})/\varepsilon_0\varepsilon_r$ of each of Examples B11 and B12, and Comparative Example B6 is shown in the following Table 4B.

TABLE 4B

| Unit | $E^A$ — | $E^B$ — | α — | x — | y — | z — | Oriented plane — | Second intermediate layer — | Pr μC/cm² | $\varepsilon_r$ — | $-e_{31,f}$ C/m² | $(-e_{31,f})^2/\varepsilon_0\varepsilon_r$ GPa | c/a — |
|---|---|---|---|---|---|---|---|---|---|---|---|---|---|
| Example B2 | K | Zn, Ti | 0.5 | 0.35 | 0.50 | 0.15 | (001) | None | 102 | 93 | 7.5 | 68.3 | 1.248 |
| Example B11 | K | Zn, Ti | 0.5 | 0.35 | 0.50 | 0.15 | (001) | SRO | 95 | 102 | 7.1 | 55.8 | 1.210 |
| Example B12 | K | Zn, Ti | 0.5 | 0.35 | 0.50 | 0.15 | (001) | LNO | 110 | 90 | 7.9 | 78.3 | 1.107 |
| Comparative Example B6 | K | Zn, Ti | 0.5 | 0.35 | 0.50 | 0.15 | (001) | FO | 36 | 130 | 3.1 | 8.3 | 1.025 |

Example B13

The first intermediate layer was not formed in a process of manufacturing a piezoelectric thin film element of Example B13. In the process of manufacturing the piezoelectric thin film element of Example B13, the first electrode layer consisting of crystalline $SrRuO_3$ was directly formed on the entirety of the surface of the single crystal substrate. The thickness of the first electrode layer of Example B13 was 200 nm. The piezoelectric thin film element of Example B13 was manufactured by the same method as in Example B2 except for the above-described configurations.

An XRD pattern of the first electrode layer of Example B13 was measured by the same method as in Example B1. The in-plane orientation of the crystal of the first electrode layer of Example B13 was evaluated by the same in-plane measurement as in Example B1. In the case of Example B13, crystal planes of the first electrode layer were not oriented in the in-plane direction of the surface of the first electrode layer. That is, in the case of Example B13, the in-plane orientation of the crystal of the first electrode layer did not exist.

The composition of the piezoelectric thin film of Examples B13 was analyzed by the same method as in Example B1. In the case of Example B13, the composition of the piezoelectric thin film approximately matched the composition of the target.

Analysis of the piezoelectric thin film of Example B13 was performed on the basis of the XRD method by the same method as in Example B1. The piezoelectric thin film of Example 13 had following characteristics.

The piezoelectric thin film consisted of a tetragonal crystal of a perovskite type oxide.

A (001) plane of the tetragonal crystal was preferentially oriented in the normal direction of the surface of the piezoelectric thin film. That is, an orientation degree of the (001) plane of the tetragonal crystal in the normal direction of the surface of the piezoelectric thin film was 90% or more.

c/a of Example B13 is shown in the following Table 5B.

Piezoelectric properties of the piezoelectric thin film of Example B13 were evaluated by the same method as in Example B1.

Pr of Example B13 is shown in the following Table 5B.

$\varepsilon_r$ of Example B13 is shown in the following Table 5B.

$-e_{31,f}$ of Example B13 is shown in the following Table 5B.

$(-e_{31,f})/\varepsilon_0\varepsilon_r$ of each of Example B13 is shown in the following Table 5B.

y in the following Chemical Formula B1 is from 0.10 to 0.85, z in the following Chemical Formula B1 is from 0.05 to 0.80, x+y+z is 1.00, and α in the following Chemical Formula B1 is 0.00 or more and less than 1.00, $$x(Bi_{1-\alpha}E^A_\alpha)E^BO_3\text{-}yBiFeO_3\text{-}zBi(Fe_{0.5}Ti_{0.5})O_3 \quad (B1)$$

TABLE 5B

| Unit | $E^A$ | $E^B$ | α | x | y | z | Oriented plane | In-plane orientation | Pr μC/cm² | $\varepsilon_r$ | $-e_{31,f}$ C/m² | $(-e_{31,f})^2/\varepsilon_0\varepsilon_r$ GPa | c/a |
|---|---|---|---|---|---|---|---|---|---|---|---|---|---|
| Example B2 | K | Zn, Ti | 0.5 | 0.35 | 0.50 | 0.15 | (001) | Present | 102 | 93 | 7.5 | 68.3 | 1.248 |
| Example B13 | K | Zn, Ti | 0.5 | 0.35 | 0.50 | 0.15 | (001) | Absent | 85 | 112 | 6.9 | 48.0 | 1.085 |

Industrial Applicability of Second Invention

The piezoelectric thin film according to the second invention is applied to, for example, a piezoelectric transducer, a piezoelectric actuator, and a piezoelectric sensor.

REFERENCE SIGNS LIST IN FIG. 1A, FIG. 1B, FIG. 4, FIG. 5, AND FIG. 6

10: piezoelectric thin film element, 10a: ultrasonic transducer, 1: single crystal substrate, 2: first electrode layer, 3: piezoelectric thin film, 4: second electrode layer, 5: first intermediate layer, 6: second intermediate layer, $D_N$: normal direction of surface of single crystal substrate, dn: normal direction of surface of piezoelectric thin film, uc: unit cell of oxide (tetragonal crystal) having perovskite structure.

What is claimed is:

1. A piezoelectric thin film containing:
   an oxide having a perovskite structure,
   wherein the piezoelectric thin film contains a tetragonal crystal of the oxide,
   a (001) plane of the tetragonal crystal is oriented in a normal direction of a surface of the piezoelectric thin film,
   an interval of the (001) plane of the tetragonal crystal is c,
   an interval of a (100) plane of the tetragonal crystal is a,
   c/a is from 1.050 to 1.250, and
   the oxide contains $Fe^{2+}$.

2. The piezoelectric thin film according to claim 1, wherein the oxide further contains $Bi^{3+}$ and $Fe^{3+}$.

3. The piezoelectric thin film according to claim 1, wherein the oxide is expressed by the following Chemical Formula B1,
   $E^A$ in the following Chemical Formula B1 is at least one kind of element selected from the group consisting of Na, K, and Ag,
   $E^B$ in the following Chemical Formula B1 is at least one kind of element selected from the group consisting of Mg, Al, Zr, Ti, Ni, and Zn,
   x in the following Chemical Formula B1 is from 0.10 to 0.80, 4. The piezoelectric thin film according to claim 1, wherein the thickness of the piezoelectric thin film is from 500 to 5000 nm.

5. The piezoelectric thin film according to claim 1, wherein the piezoelectric thin film is an epitaxial film.

6. A piezoelectric thin film element comprising:
   the piezoelectric thin film according to claim 1.

7. The piezoelectric thin film element according to claim 6, comprising:
   a single crystal substrate, and
   the piezoelectric thin film stacked on the single crystal substrate.

8. The piezoelectric thin film element according to claim 6, comprising:
   a single crystal substrate,
   an electrode layer stacked on the single crystal substrate, and
   the piezoelectric thin film stacked on the electrode layer.

9. The piezoelectric thin film element according to claim 6, comprising:
   an electrode layer; and
   the piezoelectric thin film stacked on the electrode layer.

10. The piezoelectric thin film element according to claim 8, further comprising:
    a first intermediate layer,
    wherein the first intermediate layer is disposed between the single crystal substrate and the electrode layer.

11. The piezoelectric thin film element according to claim 10, wherein the first intermediate layer contains $ZrO_2$ and $Y_2O_3$.

12. The piezoelectric thin film element according to claim 8, further comprising:
    a second intermediate layer,
    wherein the second intermediate layer is disposed between the electrode layer and the piezoelectric thin film.

13. The piezoelectric thin film element according to claim 12,
    wherein the second intermediate layer contains at least any one between $SrRuO_3$ and $LaNiO_3$.

14. The piezoelectric thin film element according to claim 8,
   wherein the electrode layer contains a platinum crystal,
   a (002) plane of the platinum crystal is oriented in a normal direction of a surface of the electrode layer, and
   a (200) plane of the platinum crystal is oriented in an in-plane direction of the surface of the electrode layer.

15. A piezoelectric transducer comprising:
   the piezoelectric thin film element according to claim 6.

* * * * *